(12) United States Patent  (10) Patent No.: US 8,354,688 B2
Lin et al.  (45) Date of Patent: Jan. 15, 2013

(54) SEMICONDUCTOR CHIP ASSEMBLY WITH BUMP/BASE/LEDGE HEAT SPREADER, DUAL ADHESIVES AND CAVITY IN BUMP

(75) Inventors: Charles W. C. Lin, Singapore (SG); Chia-Chung Wang, Hsinchu (TW)

(73) Assignee: Bridge Semiconductor Corporation, Taipei (TW)

( * ) Notice: Subject to any disclaimer, the term of this patent is extended or adjusted under 35 U.S.C. 154(b) by 0 days.

(21) Appl. No.: 13/337,054

(22) Filed: Dec. 24, 2011

(65) Prior Publication Data

US 2012/0091493 A1 Apr. 19, 2012

Related U.S. Application Data

(63) Continuation-in-part of application No. 12/911,729, filed on Oct. 26, 2010, now Pat. No. 8,314,438, which is a continuation-in-part of application No. 12/616,773, filed on Nov. 11, 2009, now Pat. No. 8,067,784, and a continuation-in-part of application No. 12/616,775, filed on Nov. 11, 2009, now abandoned, said application No. 12/616,773 is a continuation-in-part of application No. 12/557,540, filed on Sep. 11, 2009, and a continuation-in-part of application No. 12/557,541, filed on Sep. 11, 2009, said application No. 12/616,775 is a continuation-in-part of application No. 12/557,540, and a continuation-in-part of application No. 12/557,541, said application No. 12/557,540 is a continuation-in-part of application No. 12/406,510, filed on Mar. 18, 2009, said application No. 12/557,541 is a continuation of application No. 12/406,510.

(60) Provisional application No. 61/531,013, filed on Sep. 5, 2011, provisional application No. 61/350,036, filed on Jun. 1, 2010, provisional application No. 61/330,318, filed on May 1, 2010, provisional application No. 61/071,589, filed on May 7, 2008, provisional application No. 61/071,588, filed on May 7, 2008, provisional application No. 61/071,072, filed on Apr. 11, 2008, provisional application No. 61/064,748, filed on Mar. 25, 2008, provisional application No. 61/150,980, filed on Feb. 9, 2009.

(51) Int. Cl.
*H01L 33/00* (2010.01)

(52) U.S. Cl. .......... 257/99; 257/707; 257/E33.058; 438/25; 438/118

(58) Field of Classification Search .......... 257/99, 257/707, E33.058; 438/25, 118
See application file for complete search history.

(56) References Cited

U.S. PATENT DOCUMENTS 3,689,993 A 9/1972 Tolar .......... 438/380
(Continued)

FOREIGN PATENT DOCUMENTS
JP 2005-166775 6/2005

*Primary Examiner* — Phat X Cao
(74) *Attorney, Agent, or Firm* — Jackson IPG PLLC

(57) ABSTRACT

A semiconductor chip assembly includes a semiconductor device, a heat spreader, a conductive trace and dual adhesives. The heat spreader includes a bump, a base and a ledge. The conductive trace includes a pad and a terminal. The semiconductor device is mounted on the bump in a cavity in the bump, is electrically connected to the conductive trace and is thermally connected to the heat spreader. The bump extends into an opening in the first adhesive and is aligned with and spaced from an opening in the second adhesive. The base and the ledge extend laterally from the bump. The first adhesive is sandwiched between the base and the ledge, the second adhesive is sandwiched between the conductive trace and the ledge and the ledge is sandwiched between the adhesives. The conductive trace is located outside the cavity and provides signal routing between the pad and the terminal.

50 Claims, 38 Drawing Sheets

U.S. PATENT DOCUMENTS

| | | | |
|---|---|---|---|
| 3,969,199 A | 7/1976 | Berdan et al. | 205/177 |
| 4,420,767 A | 12/1983 | Hodge et al. | 257/713 |
| 4,509,096 A | 4/1985 | Baldwin et al. | 257/706 |
| 5,012,386 A | 4/1991 | McShane et al. | 361/386 |
| 5,102,829 A | 4/1992 | Cohn | 437/217 |
| 5,379,187 A | 1/1995 | Lee et al. | 361/707 |
| 5,457,605 A | 10/1995 | Wagner et al. | 361/720 |
| 5,543,586 A | 8/1996 | Crane, Jr. et al. | 174/262 |
| 5,644,163 A | 7/1997 | Tsuji | 257/706 |
| 5,991,156 A | 11/1999 | Bond et al. | 361/707 |
| 6,057,601 A | 5/2000 | Lau et al. | 257/738 |
| 6,107,683 A | 8/2000 | Castro et al. | 257/700 |
| 6,160,705 A | 12/2000 | Stearns et al. | 361/704 |
| 6,162,664 A | 12/2000 | Kim | 438/126 |
| 6,281,568 B1 | 8/2001 | Glenn et al. | 257/684 |
| 6,313,525 B1 | 11/2001 | Sasano | 257/704 |
| 6,453,549 B1 | 9/2002 | Bhatt et al. | 29/837 |
| 6,495,914 B1 | 12/2002 | Sekine et al. | 257/723 |
| 6,498,355 B1 | 12/2002 | Harrah et al. | 257/99 |
| 6,507,102 B2 | 1/2003 | Juskey et al. | 257/406 |
| 6,528,882 B2 | 3/2003 | Ding et al. | 257/738 |
| 6,541,832 B2 | 4/2003 | Coyle | 257/415 |
| 6,583,444 B2 | 6/2003 | Fjelstad | 257/82 |
| 6,603,209 B1 | 8/2003 | DiStefano et al. | 257/781 |
| 6,608,376 B1 | 8/2003 | Liew et al. | 257/698 |
| 6,625,028 B1 | 9/2003 | Dove et al. | 361/707 |
| 6,670,219 B2 | 12/2003 | Lee et al. | 438/107 |
| 6,683,795 B1 | 1/2004 | Yoo | 361/816 |
| 6,720,651 B2 | 4/2004 | Gaku et al. | 257/707 |
| 6,744,135 B2 | 6/2004 | Hasebe et al. | 257/712 |
| 6,861,750 B2 | 3/2005 | Zhao et al. | 257/739 |
| 6,885,033 B2 | 4/2005 | Andrews | 257/79 |
| 6,900,535 B2 | 5/2005 | Zhou | 257/707 |
| 6,906,414 B2 | 6/2005 | Zhao et al. | 257/707 |
| 6,930,332 B2 * | 8/2005 | Hashimoto et al. | 257/98 |
| 6,936,855 B1 | 8/2005 | Harrah | 257/88 |
| 6,964,877 B2 | 11/2005 | Chen et al. | 438/20 |
| 7,009,286 B1 | 3/2006 | Kirloskar et al. | 257/684 |
| 7,030,423 B2 * | 4/2006 | Chang et al. | 257/98 |
| 7,038,311 B2 | 5/2006 | Woodall et al. | 257/706 |
| 7,196,403 B2 | 3/2007 | Karim | 257/675 |
| 7,202,559 B2 | 4/2007 | Zhao et al. | 257/707 |
| 7,335,522 B2 | 2/2008 | Wang et al. | 438/26 |
| 7,470,935 B2 | 12/2008 | Lee et al. | 257/98 |
| 7,495,322 B2 | 2/2009 | Hashimoto et al. | 257/676 |
| 7,582,951 B2 | 9/2009 | Zhao et al. | 257/660 |
| 7,642,137 B2 | 1/2010 | Lin et al. | 438/127 |
| 7,679,172 B2 | 3/2010 | Huang et al. | 257/678 |
| 7,690,817 B2 | 4/2010 | Sanpei et al. | 362/294 |
| 7,741,158 B2 | 6/2010 | Leung et al. | 438/122 |
| 7,781,266 B2 | 8/2010 | Zhao et al. | 438/123 |
| 7,808,087 B2 | 10/2010 | Zhao et al. | 257/670 |
| 7,812,360 B2 | 10/2010 | Yano | 257/98 |
| 7,956,372 B2 | 6/2011 | Kamada et al. | 257/98 |
| 8,030,676 B2 | 10/2011 | Lin | 257/99 |
| 8,071,998 B2 | 12/2011 | Chen | 257/99 |
| 2003/0189830 A1 | 10/2003 | Sugimoto et al. | 362/294 |
| 2004/0061433 A1 | 4/2004 | Izuno et al. | 313/498 |
| 2004/0065894 A1 | 4/2004 | Hashimoto et al. | 257/100 |
| 2005/0024834 A1 | 2/2005 | Newby | 361/719 |
| 2005/0135105 A1 | 6/2005 | Teixeira et al. | 362/294 |
| 2005/0185880 A1 | 8/2005 | Asai | 385/14 |
| 2005/0274959 A1 | 12/2005 | Kim et al. | 257/79 |
| 2005/0280016 A1 * | 12/2005 | Mok et al. | 257/99 |
| 2006/0012967 A1 | 1/2006 | Asai et al. | 361/764 |
| 2006/0054915 A1 | 3/2006 | Chang | 257/100 |
| 2006/0109632 A1 | 5/2006 | Berlin et al. | 361/719 |
| 2006/0131735 A1 | 6/2006 | Ong et al. | 257/706 |
| 2007/0063213 A1 | 3/2007 | Hsieh et al. | 257/99 |
| 2007/0077416 A1 | 4/2007 | Ito et al. | 428/339 |
| 2007/0090522 A1 | 4/2007 | Alhayek et al. | 257/723 |
| 2007/0252166 A1 | 11/2007 | Chang et al. | 257/98 |
| 2007/0267642 A1 | 11/2007 | Erchak et al. | 257/98 |
| 2007/0290322 A1 | 12/2007 | Zhao et al. | 257/690 |
| 2008/0019133 A1 | 1/2008 | Kim et al. | 362/294 |
| 2008/0099770 A1 | 5/2008 | Mendendorp et al. | 257/79 |
| 2008/0102631 A1 | 5/2008 | Andryushchenko et al. | 438/686 |
| 2008/0173884 A1 | 7/2008 | Chitnis et al. | 257/98 |
| 2008/0180824 A1 | 7/2008 | Endoh et al. | 359/894 |
| 2009/0309213 A1 | 12/2009 | Takahashi et al. | 257/707 |
| 2010/0149756 A1 | 6/2010 | Rowcliffe et al. | 361/714 |
| 2010/0291737 A1 | 11/2010 | Ikeguchi et al. | 438/108 |
| 2011/0133204 A1 | 6/2011 | Lai | 257/76 |

* cited by examiner

SEMICONDUCTOR CHIP ASSEMBLY WITH BUMP/BASE/LEDGE HEAT SPREADER, DUAL ADHESIVES AND CAVITY IN BUMP

CROSS-REFERENCE TO RELATED APPLICATIONS

This application is a continuation-in-part of U.S. application Ser. No. 12/911,729 filed Oct. 26, 2010, now U.S. Pat. No. 8,314,438 which is incorporated by reference. This application also claims the benefit of U.S. Provisional Application Ser. No. 61/531,013 filed Sep. 5, 2011, which is incorporated by reference.

U.S. application Ser. No. 12/911,729 filed Oct. 26, 2010 is a continuation-in-part of U.S. application Ser. No. 12/616,773 filed Nov. 11, 2009 now U.S. Pat. No. 8,067,784 and a continuation-in-part of U.S. application Ser. No. 12/616,775 filed Nov. 11, 2009, now abandoned each of which is incorporated by reference. U.S. application Ser. No. 12/911,729 filed Oct. 26, 2010 also claims the benefit of U.S. Provisional Application Ser. No. 61/350,036 filed Jun. 1, 2010 and U.S. Provisional Application Ser. No. 61/330,318 filed May 1, 2010, each of which is incorporated by reference.

U.S. application Ser. No. 12/616,773 filed Nov. 11, 2009 and U.S. application Ser. No. 12/616,775 filed Nov. 11, 2009 are each a continuation-in-part of U.S. application Ser. No. 12/557,540 filed Sep. 11, 2009 and a continuation-in-part of U.S. application Ser. No. 12/557,541 filed Sep. 11, 2009.

U.S. application Ser. No. 12/557,540 filed Sep. 11, 2009 and U.S. application Ser. No. 12/557,541 filed Sep. 11, 2009 are each a continuation-in-part of U.S. application Ser. No. 12/406,510 filed Mar. 18, 2009, which claims the benefit of U.S. Provisional Application Ser. No. 61/071,589 filed May 7, 2008, U.S. Provisional Application Ser. No. 61/071,588 filed May 7, 2008, U.S. Provisional Application Ser. No. 61/071,072 filed Apr. 11, 2008, and U.S. Provisional Application Ser. No. 61/064,748 filed Mar. 25, 2008, each of which is incorporated by reference. U.S. application Ser. No. 12/557,540 filed Sep. 11, 2009 and U.S. application Ser. No. 12/557,541 filed Sep. 11, 2009 also claim the benefit of U.S. Provisional Application Ser. No. 61/150,980 filed Feb. 9, 2009, which is incorporated by reference.

BACKGROUND OF THE INVENTION

1. Field of the Invention

The present invention relates to semiconductor chip assembly, and more particularly to a semiconductor chip assembly with a semiconductor device, a heat spreader, a conductive trace and dual adhesives and its method of manufacture.

2. Description of the Related Art

Semiconductor devices such as packaged and unpackaged semiconductor chips have high voltage, high frequency and high performance applications that require substantial power to perform the specified functions. As the power increases, the semiconductor device generates more heat. Furthermore, the heat build-up is aggravated by higher packing density and smaller profile sizes which reduce the surface area to dissipate the heat.

Semiconductor devices are susceptible to performance degradation as well as short life span and immediate failure at high operating temperatures. The heat not only degrades the chip, but also imposes thermal stress on the chip and surrounding elements due to thermal expansion mismatch. As a result, the heat must be dissipated rapidly and efficiently from the chip to ensure effective and reliable operation. A high thermal conductivity path typically requires heat conduction and heat spreading to a much larger surface area than the chip or a die pad it is mounted on.

Light emitting diodes (LEDs) have recently become popular alternatives to incandescent, fluorescent and halogen light sources. LEDs provide energy efficient, cost effective, long term lighting for medical, military, signage, signal, aircraft, maritime, automotive, portable, commercial and residential applications. For instance, LEDs provide light sources for lamps, flashlights, headlights, flood lights, traffic lights and displays.

LEDs include high power chips that generate high light output and considerable heat. Unfortunately, LEDs exhibit color shifts and low light output as well as short lifetimes and immediate failure at high operating temperatures. Furthermore, LED light output and reliability are constrained by heat dissipation limits. LEDs underscore the critical need for providing high power chips with adequate heat dissipation.

LED packages usually include an LED chip, a submount, electrical contacts and a thermal contact. The submount is thermally connected to and mechanically supports the LED chip. The electrical contacts are electrically connected to the anode and cathode of the LED chip. The thermal contact is thermally connected to the LED chip by the submount but requires adequate heat dissipation by the underlying carrier to prevent the LED chip from overheating.

Packages and thermal boards for high power chips have been developed extensively in the industry with a wide variety of designs and manufacturing techniques in attempts to meet performance demands in an extremely cost-competitive environment.

Plastic ball grid array (PBGA) packages have a chip and a laminated substrate enclosed in a plastic housing and are attached to a printed circuit board (PCB) by solder balls. The laminated substrate includes a dielectric layer that often includes fiberglass. The heat from the chip flows through the plastic and the dielectric layer to the solder balls and then the PCB. However, since the plastic and the dielectric layer typically have low thermal conductivity, the PBGA provides poor heat dissipation.

Quad-Flat-No Lead (QFN) packages have the chip mounted on a copper die pad which is soldered to the PCB. The heat from the chip flows through the die pad to the PCB. However, since the lead frame type interposer has limited routing capability, the QFN package cannot accommodate high input/output (I/O) chips or passive elements.

Thermal boards provide electrical routing, thermal management and mechanical support for semiconductor devices. Thermal boards usually include a substrate for signal routing, a heat spreader or heat sink for heat removal, pads for electrical connection to the semiconductor device and terminals for electrical connection to the next level assembly. The substrate can be a laminated structure with single layer or multi-layer routing circuitry and one or more dielectric layers. The heat spreader can be a metal base, a metal slug or an embedded metal layer.

Thermal boards interface with the next level assembly. For instance, the next level assembly can be a light fixture with a printed circuit board and a heat sink. In this instance, an LED package is mounted on the thermal board, the thermal board is mounted on the heat sink, the thermal board/heat sink subassembly and the printed circuit board are mounted in the light fixture and the thermal board is electrically connected to the printed circuit board by wires. The substrate routes electrical signals to the LED package from the printed circuit board and the heat spreader spreads and transfers heat from the LED package to the heat sink. The thermal board thus provides a critical thermal path for the LED chip.

U.S. Pat. No. 6,507,102 to Juskey et al. discloses an assembly in which a composite substrate with fiberglass and cured thermosetting resin includes a central opening, a heat slug with a square or rectangular shape resembling the central opening is attached to the substrate at sidewalls of the central opening, top and bottom conductive layers are attached to the top and bottom of the substrate and electrically connected to one another by plated through-holes through the substrate, a chip is mounted on the heat slug and wire bonded to the top conductive layer, an encapsulant is molded on the chip and solder balls are placed on the bottom conductive layer.

During manufacture, the substrate is initially a prepreg with B-stage resin placed on the bottom conductive layer, the heat slug is inserted into the central opening and on the bottom conductive layer and spaced from the substrate by a gap, the top conductive layer is mounted on the substrate, the conductive layers are heated and pressed towards one another so that the resin melts, flows into the gap and solidifies, the conductive layers are patterned to form circuit traces on the substrate and expose the excess resin flash on the heat slug, and the excess resin flash is removed to expose the heat slug. The chip is then mounted on the heat slug, wire bonded and encapsulated.

The heat flows from the chip through the heat slug to the PCB. However, manually dropping the heat slug into the central opening is prohibitively cumbersome and expensive for high volume manufacture. Furthermore, since the heat slug is difficult to accurately position in the central opening due to tight lateral placement tolerance, voids and inconsistent bond lines arise between the substrate and the heat slug. The substrate is therefore partially attached to the heat slug, fragile due to inadequate support by the heat slug and prone to delamination. In addition, the wet chemical etch that removes portions of the conductive layers to expose the excess resin flash also removes portions of the heat slug exposed by the excess resin flash. The heat slug is therefore non-planar and difficult to bond to. As a result, the assembly suffers from high yield loss, poor reliability and excessive cost.

U.S. Pat. No. 6,528,882 to Ding et al. discloses a thermal enhanced ball grid array package in which the substrate includes a metal core layer. The chip is mounted on a die pad region at the top surface of the metal core layer, an insulating layer is formed on the bottom surface of the metal core layer, blind vias extend through the insulating layer to the metal core layer, thermal balls fill the blind vias and solder balls are placed on the substrate and aligned with the thermal balls. The heat from the chip flows through the metal core layer to the thermal balls to the PCB. However, the insulating layer sandwiched between the metal core layer and the PCB limits the heat flow to the PCB.

U.S. Pat. No. 6,670,219 to Lee et al. discloses a cavity down ball grid array (CDBGA) package in which a ground plate with a central opening is mounted on a heat spreader to form a thermal dissipating substrate. A substrate with a central opening is mounted on the ground plate using an adhesive with a central opening. A chip is mounted on the heat spreader in a cavity defined by the central opening in the ground plate and solder balls are placed on the substrate. However, since the solder balls extend above the substrate, the heat spreader does not contact the PCB. As a result, the heat spreader releases the heat by thermal convection rather than thermal conduction which severely limits the heat dissipation.

U.S. Pat. No. 7,038,311 to Woodall et al. discloses a thermal enhanced BGA package in which a heat sink with an inverted T-like shape includes a pedestal and an expanded base, a substrate with a window opening is mounted on the expanded base, an adhesive attaches the pedestal and the expanded base to the substrate, a chip is mounted on the pedestal and wire bonded to the substrate, an encapsulant is molded on the chip and solder balls are placed on the substrate. The pedestal extends through the window opening, the substrate is supported by the expanded base and the solder balls are located between the expanded base and the perimeter of the substrate. The heat from the chip flows through the pedestal to the expanded base to the PCB. However, since the expanded base must leave room for the solder balls, the expanded base protrudes below the substrate only between the central window and the innermost solder ball. Consequently, the substrate is unbalanced and wobbles and warps during manufacture. This creates enormous difficulties with chip mounting, wire bonding and encapsulant molding. Furthermore, the expanded base may be bent by the encapsulant molding and may impede soldering the package to the next level assembly as the solder balls collapse. As a result, the package suffers from high yield loss, poor reliability and excessive cost.

U.S. Patent Application Publication No. 2007/0267642 to Erchak et al. discloses a light emitting device assembly in which a base with an inverted T-like shape includes a substrate, a protrusion and an insulative layer with an aperture, electrical contacts are mounted on the insulative layer, a package with an aperture and a transparent lid is mounted on the electrical contacts and an LED chip is mounted on the protrusion and wire bonded to the substrate. The protrusion is adjacent to the substrate and extends through the apertures in the insulative layer and the package into the package, the insulative layer is mounted on the substrate, the electrical contacts are mounted on the insulative layer and the package is mounted on the electrical contacts and spaced from the insulative layer. The heat from the chip flows through the protrusion to the substrate to a heat sink. However, the electrical contacts are difficult to mount on the insulating layer, difficult to electrically connect to the next level assembly and fail to provide multi-layer routing.

Conventional packages and thermal boards thus have major deficiencies. For instance, dielectrics with low thermal conductivity such as epoxy limit heat dissipation, whereas dielectrics with higher thermal conductivity such as epoxy filled with ceramic or silicon carbide have low adhesion and are prohibitively expensive for high volume manufacture. The dielectric may delaminate during manufacture or prematurely during operation due to the heat. The substrate may have single layer circuitry with limited routing capability or multi-layer circuitry with thick dielectric layers which reduce heat dissipation. The heat spreader may be inefficient, cumbersome or difficult to thermally connect to the next level assembly. The manufacturing process may be unsuitable for low cost, high volume manufacture.

In view of the various development stages and limitations in currently available packages and thermal boards for high power semiconductor devices, there is a need for a semiconductor chip assembly that is cost effective, reliable, manufacturable, versatile, provides flexible signal routing and has excellent heat spreading and dissipation.

SUMMARY OF THE INVENTION

The present invention provides a semiconductor chip assembly that includes a semiconductor device, a heat spreader, a conductive trace and dual adhesives. The heat spreader includes a bump, a base and a ledge. The conductive trace includes a pad and a terminal. The semiconductor device is mounted on the bump in a cavity in the bump, is electrically connected to the conductive trace and is thermally connected to the heat spreader. The bump extends into an opening in the first adhesive and is aligned with and spaced from an opening in the second adhesive. The base and the ledge extend laterally from the bump. The first adhesive is sandwiched between the base and the ledge, the second adhesive is sandwiched between the conductive trace and the ledge and the ledge is sandwiched between the adhesives. The conductive trace is located outside the cavity and provides signal routing between the pad and the terminal.

In accordance with an aspect of the present invention, a semiconductor chip assembly includes a semiconductor device, a heat spreader, a conductive trace and first and second adhesives. The first adhesive includes a first opening. The second adhesive includes a second opening. The heat spreader includes a bump, a base and a ledge, wherein (i) the bump is adjacent to the base and the ledge, is integral with the ledge, extends from the base in a first vertical direction and extends from the ledge in a second vertical direction opposite the first vertical direction, (ii) the base covers the bump in the second vertical direction and extends laterally from the bump in lateral directions orthogonal to the vertical directions, (iii) the ledge extends laterally from the bump and is spaced from the base, and (iv) a cavity in the bump faces in the first vertical direction, is covered by the bump in the second vertical direction and is spaced from the base by the bump. The conductive trace includes a pad and a terminal.

The semiconductor device is mounted on the bump, extends into the cavity, is electrically connected to the pad and thereby electrically connected to the terminal, and is thermally connected to the bump and thereby thermally connected to the base. The first adhesive contacts the bump, the base and the ledge, is sandwiched between the base and the ledge and extends laterally from the bump to or beyond the terminal. The second adhesive is spaced from the bump, is sandwiched between the conductive trace and the ledge, extends beyond the ledge and the first adhesive in the first vertical direction and extends beyond the conductive trace in the second vertical direction. The conductive trace is located outside the cavity and beyond the ledge in the first vertical direction. The bump extends into the first opening, is aligned with and spaced from the second opening and covers the semiconductor device in the second vertical direction. The ledge is sandwiched between the adhesives and covers the conductive trace in the second vertical direction. The cavity extends into the first opening and is aligned with and spaced from the second opening.

In accordance with another aspect of the present invention, a semiconductor chip assembly includes a semiconductor device, a heat spreader, a conductive trace, first and second adhesives and first and second substrates. The first adhesive includes a first opening. The second adhesive includes a second opening. The first substrate includes a first dielectric layer and a first aperture extends through the first substrate. The second substrate includes a second dielectric layer and a second aperture extends through the second substrate. The heat spreader includes a bump, a base and a ledge, wherein (i) the bump is adjacent to the base and the ledge, is integral with the ledge, extends from the base in a first vertical direction and extends from the ledge in a second vertical direction opposite the first vertical direction, (ii) the base covers the bump in the second vertical direction and extends laterally from the bump in lateral directions orthogonal to the vertical directions, (iii) the ledge extends laterally from the bump and is spaced from the base, and (iv) a cavity in the bump faces in the first vertical direction, is covered by the bump in the second vertical direction and is spaced from the base by the bump. The conductive trace includes a pad and a terminal.

The semiconductor device is mounted on the bump, extends into the cavity, is electrically connected to the pad and thereby electrically connected to the terminal, and is thermally connected to the bump and thereby thermally connected to the base. The first adhesive contacts the bump, the base, the ledge and the first dielectric layer, is spaced from the second adhesive and the second dielectric layer, is sandwiched between the bump and the first dielectric layer, between the ledge and the first dielectric layer and between the base and the ledge, extends through the first aperture and extends laterally from the bump to or beyond the terminal. The second adhesive is spaced from the bump and the conductive trace, is sandwiched between the ledge and the second dielectric layer, extends beyond the ledge, the first adhesive and the first dielectric layer in the first vertical direction and extends beyond the conductive trace and the second dielectric layer in the second vertical direction. The first dielectric layer contacts and is sandwiched between the base and the first adhesive and is spaced from the bump, the ledge and the second dielectric layer. The second dielectric layer contacts and is sandwiched between the conductive trace and the second adhesive and is spaced from the bump, the base and the ledge. The conductive trace is located outside the cavity and beyond the ledge and the adhesives in the first vertical direction. The bump extends into the first opening, extends through the first aperture, is aligned with and spaced from the second opening and the second aperture and covers the semiconductor device in the second vertical direction. The base extends beyond the adhesives and the dielectric layers in the second vertical direction. The ledge is sandwiched between the adhesives and covers the conductive trace, the second adhesive and the second dielectric layer in the second vertical direction. The cavity extends into the first opening and is aligned with and spaced from the second opening and the second aperture. Furthermore, the base, the ledge, the adhesives and the dielectric layers extend to peripheral edges of the assembly In accordance with another aspect of the present invention, a semiconductor chip assembly includes a semiconductor device, a heat spreader, a conductive trace, first and second adhesives and first and second substrates. The first adhesive includes a first opening. The second adhesive includes a second opening. The first substrate includes a first dielectric layer and a first aperture extends through the first substrate. The second substrate includes a second dielectric layer and a second aperture extends through the second substrate. The heat spreader includes a bump, a base and a ledge, wherein (i) the bump is adjacent to the base at a first bent corner, is adjacent to the ledge at a second bent corner, is integral with the ledge, extends from the base in a first vertical direction and extends from the ledge in a second vertical direction opposite the first vertical direction, (ii) the base covers the bump in the second vertical direction and extends laterally from the bump in lateral directions orthogonal to the vertical directions, (iii) the ledge extends laterally from the bump opposite the base and is spaced from the base by the bump, and (iv) a cavity in the bump faces in the first vertical direction, is covered by the bump in the second vertical direction, is spaced from the base by the bump and has an entrance at the ledge. The conductive trace includes a pad and a terminal.

The semiconductor device is mounted on the bump, extends into the cavity, is electrically connected to the pad and thereby electrically connected to the terminal, and is thermally connected to the bump and thereby thermally connected to the base. The first adhesive contacts the bump, the base, the ledge and the first dielectric layer, is spaced from the second adhesive and the second dielectric layer, is sandwiched between the bump and the first dielectric layer, between the ledge and the first dielectric layer and between the base and the ledge, extends through the first aperture and extends laterally from the bump to or beyond the terminal. The second adhesive is spaced from the bump and the conductive trace, is sandwiched between the ledge and the second dielectric layer, extends beyond the ledge, the first adhesive and the first dielectric layer in the first vertical direction and extends beyond the conductive trace and the second dielectric layer in the second vertical direction. The first dielectric layer contacts and is sandwiched between the base and the first adhesive and is spaced from the bump, the ledge and the second dielectric layer. The second dielectric layer contacts and is sandwiched between the conductive trace and the second adhesive and is spaced from the bump, the base and the ledge. The conductive trace is located outside the cavity and beyond the bump, the ledge, the adhesives and the dielectric layers in the first vertical direction. The bump extends into the first opening, extends through the first aperture, is aligned with and spaced from the second opening and the second aperture, covers the semiconductor device in the second vertical direction and provides a recessed die paddle and a reflector for the semiconductor device. The base covers the bump, the ledge, the conductive trace, the adhesives and the dielectric layers in the second vertical direction. The ledge is sandwiched between the adhesives and covers the conductive trace, the second adhesive and the second dielectric layer in the second vertical direction. The cavity extends into the first opening and the first aperture and is aligned with and spaced from the second opening and the second aperture. Furthermore, the bump and the ledge in combination cover the base, the first adhesive and the first dielectric layer in the first vertical direction and the base, the ledge, the adhesives and the dielectric layers extend to peripheral edges of the assembly.

The semiconductor device can be mounted on and spaced from the bump, electrically connected to the pad using a wire bond that extends outside the cavity and thermally connected to the bump using a die attach that is located within the cavity. For instance, the semiconductor device can extend within and outside the cavity and the wire bond can be located outside the cavity and extend through the second opening and the second aperture to the pad. Alternatively, the semiconductor device can be located within the cavity and the wire bond can extend from the cavity through the second opening and the second aperture to the pad. In any case, the semiconductor device extends into and is located within a periphery of the cavity and the wire bond extends within and outside the periphery of the cavity.

The semiconductor device can be a packaged or unpackaged semiconductor chip. For instance, the semiconductor device can be an LED package that includes an LED chip. Alternatively, the semiconductor device can be a semiconductor chip such as an LED chip.

The heat spreader can consist of the bump, the base and the ledge. The heat spreader can also have an I-like shape that includes a bowl-shaped pedestal (bump), lower wings (base) and upper wings (ledge).

The first adhesive can contact the bump and the first dielectric layer in a gap in the first aperture between the bump and the first substrate and contact the base, the ledge and the first dielectric layer outside the gap. The first adhesive can also contact and be sandwiched between the bump and the first dielectric layer, between the ledge and the first dielectric layer and between the base and the ledge. The first adhesive can also be spaced from the second adhesive and the second dielectric layer. The first adhesive can also cover the base outside the bump in the first vertical direction, cover the first substrate in the first vertical direction and cover and surround a sidewall of the bump in the lateral directions. The first adhesive can also conformally coat the sidewall of the bump, a surface of the first dielectric layer that faces in the first vertical direction and a surface of the ledge that faces in the second vertical direction. The first adhesive can also fill the space between the bump and the first substrate and between the ledge and the first substrate. The first adhesive can also extend through the first aperture, extend across the first dielectric layer in the gap and fill the gap. The first adhesive can also be a solidified prepreg with cured epoxy.

The first adhesive can extend laterally from the bump to or beyond the terminal. For instance, the first adhesive and the terminal can extend to peripheral edges of the assembly. In this instance, the first adhesive extends laterally from the bump to the terminal. Alternatively, the first adhesive can extend to peripheral edges of the assembly and the terminal can be spaced from the peripheral edges of the assembly. In this instance, the first adhesive extends laterally from the bump beyond the terminal.

The first adhesive alone can intersect an imaginary horizontal line between the bump and the base, an imaginary horizontal line between the bump and the first dielectric layer, an imaginary horizontal line between the bump and a peripheral edge of the assembly, an imaginary vertical line between the base and the ledge and an imaginary vertical line between the first dielectric layer and the ledge.

The second adhesive can contact the second dielectric layer, be spaced from the bump, the base, the conductive trace and the first dielectric layer, be sandwiched between the ledge and the second dielectric layer, extend beyond the ledge, the first adhesive and the first dielectric layer in the first vertical direction and extend beyond the conductive trace and the second dielectric layer in the second vertical direction. The second adhesive can also contact or be spaced from the ledge. For instance, the second adhesive can contact the ledge or contact a solder mask that contacts the ledge and is sandwiched between the second adhesive and the ledge. The second adhesive can also cover the conductive trace and the second substrate in the second vertical direction and extend to peripheral edges of the assembly. The second adhesive can also be a pressure-sensitive adhesive tape.

The bump can be integral with the ledge. For instance, the bump and the ledge can be a single-piece metal or include a single-piece metal at their interface, and the single-piece metal can be copper. Likewise, the bump and the ledge can share a buried copper core and a reflective surface finish at their interface. The bump and the ledge can also be thicker than the base. The bump can also be coplanar with the first adhesive at the base and at the ledge. The bump can also contact the first adhesive, be spaced from the first dielectric layer, extend into the first opening, extend through the first aperture and be aligned with and spaced from the second opening and the second aperture. The bump can also extend beyond the first aperture in the vertical directions, be located beyond the second opening and the second aperture in the second vertical direction and be located within the peripheries of the openings and the apertures.

The bump can include a first bent corner as it extends to the base and a second bent corner as it extends to the ledge. The bump can also be bent laterally inward adjacent to the base and bent laterally outward adjacent to the ledge. The bump can also have an irregular thickness characteristic of stamping. The bump can also have a larger diameter at the ledge than at the base. For instance, the bump can have a cut-off conical or pyramidal shape in which its diameter increases as it extends in the first vertical direction from the base to the ledge. In this instance, the bump can be bent laterally inward about 120 to 150 degrees adjacent to the base and bent laterally outward about 120 to 150 degrees adjacent to the ledge. As another instance, the bump can have a cylindrical or rectangular prism shape with a constant diameter as it extends in the first vertical direction from the base to the ledge. In this instance, the bump can be bent laterally inward about 90 degrees adjacent to the base and bent laterally outward about 90 degrees adjacent to the ledge. As another instance, the bump can include a third bent corner in which its diameter increases as it extends in the first vertical direction from the base to the third bent corner and is constant as it extends in the first vertical direction from the third bent corner to the ledge. In this instance, the bump can taper outward about 120 to 150 degrees relative to the base as it extends from the first bent corner to the third bent corner and be perpendicular to the base as it extends from the third bent corner to the second bent corner. In addition, the third bent corner can be vertically positioned between opposing major surfaces of the semiconductor device. The bump can also provide a recessed die paddle and a reflector for the semiconductor device. In any case, the bump is adjacent to the base at the first bent corner and is adjacent to the ledge at the second bent corner.

The cavity can have a larger diameter at its entrance than at its floor. For instance, the cavity can have a cut-off conical or pyramidal shape in which its diameter increases as it extends in the first vertical direction from the floor to the entrance. In this instance, the angle between the floor and the entrance relative to the floor can be about 120 to 150 degrees. Alternatively, the cavity can have a cylindrical or rectangular prism shape with a constant diameter as it extends in the first vertical direction towards the ledge. In this instance, the angle between the floor and the entrance relative to the floor can be about 90 degrees. Alternatively, the cavity can have a diameter that increases as it extends in the first vertical direction from the floor to the third bent corner and is constant as it extends in the first vertical direction from the third bent corner to the entrance. In this instance, the angle between the floor and the third bent corner relative to the floor can be about 120 to 150 degrees and the angle between the entrance and the third bent corner relative to the floor can be about 90 degrees. The cavity can also have a circular, square or rectangular entrance and floor. The cavity can also conform to the shape of the bump, extend into the first opening, extend through the first aperture and be aligned with and spaced from the second opening and the second aperture. The cavity can also extend across most of the bump in the vertical and lateral directions.

The base can support the bump, the adhesives and the substrates. The base can also contact the first adhesive and the first dielectric layer and extend beyond the first adhesive and the first dielectric layer in the second vertical direction. The base can also cover the bump, the ledge, the conductive trace, the adhesives and the dielectric layers in the second vertical direction and extend to peripheral edges of the assembly.

The base can have a first thickness where it is adjacent to the bump, a second thickness where it is adjacent to the first dielectric layer that is larger than the first thickness and a flat surface that faces in the second vertical direction. In this instance, the base can contact the first adhesive and the first dielectric layer, have the first thickness where it is adjacent to the bump and where it is adjacent to the first adhesive and spaced from the first dielectric layer and the second thickness where it contacts the first dielectric layer.

The ledge can have a uniform thickness, cover the first dielectric layer in the first vertical direction, cover the conductive trace, the second adhesive and the second dielectric layer in the second vertical direction and extend to peripheral edges of the assembly.

The bump and the ledge in combination can cover the base, the first adhesive and the first dielectric layer in the first vertical direction.

The first substrate can contact the first adhesive and be spaced from the bump and the ledge. The first substrate can also be a laminated structure. For instance, the first substrate can be a single-sided copper clad laminate that includes the first dielectric layer and the base where it is adjacent to the first dielectric layer and does not extend beyond the bump in the second vertical direction. Furthermore, the first dielectric layer can contact and be sandwiched between the base and the first adhesive, be spaced from the bump, the ledge, the conductive trace, the second adhesive and the second dielectric layer and extend to peripheral edges of the assembly.

The second substrate can contact the second adhesive and be spaced from the bump, the base and the ledge. The second can also be a laminated structure. For instance, the second substrate can be a single-sided copper clad laminate that includes the conductive trace and the second dielectric layer. Furthermore, the second dielectric layer can contact and be sandwiched between the conductive trace and the second adhesive, be spaced from the bump, the base, the ledge, the first adhesive and the first dielectric layer and extend to peripheral edges of the assembly. Moreover, the second substrate can include single-level conductive traces and multi-level conductive traces.

The conductive trace can provide horizontal signal routing between the pad and the terminal. For instance, the pad and the terminal can contact the second dielectric layer and be located beyond the ledge, the adhesives and the dielectric layers in the first vertical direction. In this instance, the pad and the terminal can have the same thickness and be coplanar with one another at a surface that faces in the first vertical direction. Furthermore, the conductive trace can provide single-level or multi-level signal routing between the pad and the terminal. For instance, the conductive trace can include a routing line mounted on the second dielectric layer in an electrically conductive path between the pad and the terminal to provide single-level signal routing. Alternatively, the conductive trace can include a first routing line mounted on the second dielectric layer, a second routing line embedded in the second dielectric layer and first and second vias that extend into the second dielectric layer to the second routing line layer in an electrically conductive path between the pad and the terminal to provide multi-level signal routing.

The conductive trace can provide vertical signal routing between the pad and the terminal. For instance, the pad can contact the second dielectric layer and be located beyond the ledge, the adhesives and the dielectric layers in the first vertical direction and the terminal can contact the first dielectric layer and be located beyond the ledge, the adhesives and the dielectric layers in the second vertical direction. In this instance, the base and the terminal can have the same thickness where closest to one another, have different thickness where the base is adjacent to the bump and be coplanar with one another at a surface that faces in the second vertical direction. In addition, the conductive trace can include a plated through-hole that extends through the ledge, the adhesives and the dielectric layers in an electrically conductive path between the pad and the terminal.

The pad can be an electrical contact for the semiconductor device, the terminal can be an electrical contact for the next level assembly, and the pad and the terminal can provide signal routing between the semiconductor device and the next level assembly.

The heat spreader can include a copper, aluminum or copper/nickel/aluminum core shared by the bump, the base and the ledge. The heat spreader can also consist essentially of a copper core and be primarily copper. For instance, the heat spreader can consist of a copper core and a reflective surface finish such as gold, silver and/or nickel that extends into the cavity. In this instance, the bump can include the reflective surface finish and a buried copper core and the base can consist of a copper core. In another instance, the heat spreader can consist of a buried copper core and plated contacts such as gold, silver and/or nickel for the bump in the cavity and the base opposite the cavity. In this instance, the bump can include a plated contact as its surface layer that faces in the first vertical direction and the base can include a plated contact as its surface layer that faces in the second vertical direction. In any case, the heat spreader provides heat dissipation and spreading from the semiconductor device to the next level assembly.

The conductive trace can include a copper core shared by the terminal and the pad. The conductive trace can also consist essentially of a copper core and be primarily copper. For instance, the conductive trace can consist of a buried copper core and plated contacts such as gold, silver and/or nickel at the pad and the terminal. In this instance, the pad can include a plated contact as its surface layer and the terminal can include a plated contact as its surface layer. In any case, the conductive trace provides signal routing between the pad and the terminal.

The assembly can include a solder mask that contacts and is sandwiched between the ledge and the second adhesive and is spaced from the bump, the base, the conductive trace, the first adhesive and the dielectric layers. The solder mask can include a window that selectively exposes the bump in the first vertical direction such that the bump is aligned with the window. Furthermore, the window can define a reflective surface finish for the bump. For instance, the window can expose the bump and a small portion of the ledge that is adjacent to and surrounds the bump and faces in the first vertical direction and the reflective surface finish can extend from the bump within the cavity to the small ledge portion outside the cavity. Moreover, the conductive trace can have a different surface finish than the reflective surface finish. The solder mask can also cover the conductive trace, the second adhesive and the second substrate in the second vertical direction and extend to peripheral edges of the assembly.

The assembly can include an encapsulant that covers the semiconductor device in the first vertical direction. For instance, the encapsulant can be a color-shifting encapsulant that contacts the bump, an LED chip, a wire bond and a die attach in the cavity, fills the remaining space in the cavity and converts blue light emitted by the LED chip into white light. In this instance, the assembly can also include a transparent encapsulant that contacts the color-shifting encapsulant and covers the pad, the wire bond and the color-shifting encapsulant in the first vertical direction. Furthermore, the color-shifting encapsulant can include silicone and phosphor and the transparent encapsulant can include silicone and exclude phosphor.

The assembly can be a first-level or second-level single-chip or multi-chip device. For instance, the assembly can be a first-level package that contains a single chip or multiple chips. Alternatively, the assembly can be a second-level module that contains a single LED package or multiple LED packages, and each LED package can contain a single LED chip or multiple LED chips.

The present invention provides a method of making a semiconductor chip assembly that includes providing a bump and a ledge, mounting a first adhesive on the ledge including inserting the bump into an opening in the first adhesive, mounting a conductive layer on the first adhesive including aligning the bump with an aperture in the conductive layer, then flowing the first adhesive between the bump and the conductive layer, solidifying the first adhesive, then providing a heat spreader that includes the bump, a base and the ledge, then mounting a second adhesive on the ledge, mounting a conductive trace that includes a pad and a terminal on the second adhesive, then mounting a semiconductor device on the bump in a cavity in the bump, electrically connecting the semiconductor device to the conductive trace and thermally connecting the semiconductor device to the heat spreader.

In accordance with an aspect of the present invention, a method of making a semiconductor chip assembly includes (1) providing a bump, a ledge, a first adhesive and a first conductive layer, wherein (a) the bump defines a cavity that faces in a first vertical direction, covers the cavity in a second vertical direction opposite the first vertical direction, is adjacent to and integral with the ledge, extends vertically from the ledge in the second vertical direction, extends into a first opening in the first adhesive and is aligned with a first aperture in the first conductive layer, (b) the ledge extends laterally from the bump in lateral directions orthogonal to the vertical directions, (c) the first adhesive is mounted on the ledge, is sandwiched between the ledge and the first conductive layer and is non-solidified and (d) the first conductive layer is mounted on the first adhesive, then (2) flowing the first adhesive in the second vertical direction into a gap located in the first aperture between the bump and the first conductive layer, (3) solidifying the first adhesive, then (4) providing a heat spreader that includes the bump, a base and the ledge, wherein the bump is adjacent to the base and extends vertically from the base in the first vertical direction and the base covers the bump in the second vertical direction, extends laterally from the bump and includes a portion of the first conductive layer that is adjacent to the first aperture and spaced from the bump, then (5) mounting a conductive trace and a second adhesive on the ledge, wherein the conductive trace includes a pad and a terminal and is located outside the cavity and beyond the ledge in the first vertical direction, the second adhesive is sandwiched between the conductive trace and the ledge and includes a second opening, the bump is aligned with and spaced from the second opening and the ledge is sandwiched between the adhesives and covers the conductive trace in the second vertical direction, then (6) mounting a semiconductor device on the bump, wherein the semiconductor device extends into the cavity, (7) electrically connecting the semiconductor device to the pad, thereby electrically connecting the semiconductor device to the terminal and (8) thermally connecting the semiconductor device to the bump, thereby thermally connecting the semiconductor device to the base.

In accordance with another aspect of the present invention, a method of making a semiconductor chip assembly includes (1) providing a bump and a ledge, wherein the bump defines a cavity that faces in a first vertical direction, is adjacent to and integral with the ledge and extends vertically from the ledge in a second vertical direction opposite the first vertical direction, the ledge extends laterally from the bump in lateral directions orthogonal to the vertical directions and the cavity is covered by the bump in the second vertical direction, (2) providing a first adhesive, wherein a first opening extends through the first adhesive, (3) providing a first conductive layer, wherein a first aperture extends through the first conductive layer, (4) mounting the first adhesive on the ledge, including inserting the bump into the first opening, (5) mounting the first conductive layer on the first adhesive, including aligning the bump with the first aperture, wherein the first adhesive is sandwiched between the ledge and the first conductive layer and is non-solidified, then (6) applying heat to melt the first adhesive, (7) moving the ledge and the first conductive layer towards one another, thereby moving the bump in the second vertical direction in the first aperture and applying pressure to the molten adhesive between the ledge and the first conductive layer, wherein the pressure forces the molten adhesive to flow in the second vertical direction into a gap located in the first aperture between the bump and the first conductive layer, (8) applying heat to solidify the molten adhesive, thereby mechanically attaching the bump and the ledge to the first conductive layer, then (9) depositing a plated layer on the bump, the first adhesive and the first conductive layer, wherein the plated layer covers the bump in the second vertical direction and extends laterally from the bump to the first conductive layer, (10) providing a base that includes a portion of the first conductive layer that is adjacent to the first aperture and spaced from the bump and a portion of the plated layer that is adjacent to the bump, the first conductive layer and the first adhesive, (11) providing a heat spreader that includes the bump, the base and the ledge, wherein the bump is adjacent to the base and extends vertically from the base in the first vertical direction and the base covers the bump in the second vertical direction and extends laterally from the bump, then (12) mounting a conductive trace and a second adhesive on the ledge, wherein the conductive trace includes a pad and a terminal and is located outside the cavity and beyond the ledge in the first vertical direction, the second adhesive is sandwiched between the conductive trace and the ledge, a second opening extends through the second adhesive, the bump is aligned with and spaced from the second opening and the ledge is sandwiched between the adhesives and covers the conductive trace in the second vertical direction, (13) mechanically attaching the conductive trace to the ledge using the second adhesive, then (14) mounting a semiconductor device on the bump, wherein the semiconductor device extends into the cavity, (15) electrically connecting the semiconductor device to the pad, thereby electrically connecting the semiconductor device to the terminal and (16) thermally connecting the semiconductor device to the bump, thereby thermally connecting the semiconductor device to the base.

In accordance with another aspect of the present invention, a method of making a semiconductor chip assembly includes (1) providing a bump and a ledge, wherein the bump defines a cavity that faces in a first vertical direction, is adjacent to and integral with the ledge and extends vertically from the ledge in a second vertical direction opposite the first vertical direction, the ledge extends laterally from the bump in lateral directions orthogonal to the vertical directions and the cavity is covered by the bump in the second vertical direction, (2) providing a first adhesive, wherein a first opening extends through the first adhesive, (3) providing a first substrate that includes a first conductive layer and a first dielectric layer, wherein a first aperture extends through the first substrate, (4) mounting the first adhesive on the ledge, including inserting the bump through the first opening, (5) mounting the first substrate on the first adhesive, including inserting the bump into the first aperture, wherein the first adhesive is sandwiched between the ledge and the first dielectric layer and is non-solidified, the first dielectric layer is sandwiched between the first conductive layer and the first adhesive and is solidified and the first conductive layer is spaced from the first adhesive, the (6) applying heat to melt the first adhesive, (7) moving the ledge and the first conductive layer towards one another, thereby moving the bump in the second vertical direction in the first aperture and applying pressure to the molten adhesive between the ledge and the first substrate, wherein the pressure forces the molten adhesive to flow in the second vertical direction into a gap located in the first aperture between the bump and the first substrate, (8) applying heat to solidify the molten adhesive, thereby mechanically attaching the bump and the ledge to the first substrate, then (9) depositing a plated layer on the bump, the first adhesive and the first conductive layer, wherein the plated layer covers the bump in the second vertical direction and extends laterally from the bump to the first conductive layer, (10) providing a base that includes a portion of the first conductive layer that is adjacent to the first dielectric layer and the first aperture and spaced from the bump and a portion of the plated layer that is adjacent to the bump, the first conductive layer and the first adhesive, (11) providing a heat spreader that includes the bump, the base and the ledge, wherein the bump is adjacent to the base and extends vertically from the base in the first vertical direction and the base covers the bump in the second vertical direction and extends laterally from the bump, then (12) mounting a second substrate and a second adhesive on the ledge, wherein the second substrate includes a conductive trace and a second dielectric layer, the conductive trace includes a pad and a terminal and is located outside the cavity and beyond the ledge in the first vertical direction, the second dielectric layer is sandwiched between the conductive trace and the second adhesive and is solidified, the second adhesive is sandwiched between the second dielectric layer and the ledge, a second aperture extends through the second substrate, a second opening extends through the second adhesive, the bump is aligned with and spaced from the second opening and the second aperture and the ledge is sandwiched between the adhesives and covers the conductive trace in the second vertical direction, (13) mechanically attaching the second substrate to the ledge using the second adhesive, then (14) mounting a semiconductor device on the bump, wherein the semiconductor device extends into the cavity and the bump provides a recessed die paddle and a reflector for the semiconductor device, (15) electrically connecting the semiconductor device to the pad, thereby electrically connecting the semiconductor device to the terminal and (16) thermally connecting the semiconductor device to the bump, thereby thermally connecting the semiconductor device to the base.

In accordance with another aspect of the present invention, a method of making a semiconductor chip assembly includes (1) providing a bump and a ledge, wherein the bump defines a cavity that faces in a first vertical direction, is adjacent to and integral with the ledge and extends vertically from the ledge in a second vertical direction opposite the first vertical direction, the ledge extends laterally from the bump in lateral directions orthogonal to the vertical directions and the cavity is covered by the bump in the second vertical direction, (2) providing a first adhesive, wherein a first opening extends through the first adhesive, (3) providing a first substrate that includes a first conductive layer and a first dielectric layer, wherein a first aperture extends through the first substrate, (4) mounting the first adhesive on the ledge, including inserting the bump through the first opening, (5) mounting the first substrate on the first adhesive, including inserting the bump into the first aperture, wherein the first adhesive is sandwiched between the ledge and the first dielectric layer and is non-solidified, the first dielectric layer is sandwiched between the first conductive layer and the first adhesive and is solidified and the first conductive layer is spaced from the first adhesive, then (6) applying heat to melt the first adhesive, (7) moving the ledge and the first conductive layer towards one another, thereby moving the bump in the second vertical direction in the first aperture and applying pressure to the molten adhesive between the ledge and the first substrate, wherein the pressure forces the molten adhesive to flow in the second vertical direction into a gap located in the first aperture between the bump and the first substrate, (8) applying heat to solidify the molten adhesive, thereby mechanically attaching the bump and the ledge to the first substrate, then (9) depositing a plated layer on the bump, the first adhesive and the first conductive layer, wherein the plated layer covers the bump in the second vertical direction and extends laterally from the bump to the first conductive layer, (10) providing a base that includes a portion of the first conductive layer that is adjacent to the first dielectric layer and the first aperture and spaced from the bump and a portion of the plated layer that is adjacent to the bump, the first conductive layer and the first adhesive, (11) providing a heat spreader that includes the bump, the base and the ledge, wherein the bump is adjacent to the base and extends vertically from the base in the first vertical direction and the base covers the bump in the second vertical direction and extends laterally from the bump, then (12) providing a solder mask on the ledge, wherein a window extends through the solder mask and the bump is aligned with and spaced from the window, (13) depositing a reflective coating on the bump using the solder mask as a plating mask, thereby providing the bump with a reflective surface finish at the cavity, then (14), mounting a second substrate and a second adhesive on the solder mask, thereby mounting the second substrate and the second adhesive on the ledge, wherein the second substrate includes a conductive trace and a second dielectric layer, the conductive trace includes a pad and a terminal and is located outside the cavity and beyond the ledge in the first vertical direction, the second dielectric layer is sandwiched between the conductive trace and the second adhesive and is solidified, the second adhesive is sandwiched between the second dielectric layer and the solder mask, the solder mask is sandwiched between the second adhesive and the ledge, a second aperture extends through the second substrate, a second opening extends through the second adhesive, the bump is aligned with and spaced from the second opening and the second aperture and the ledge is sandwiched between the first adhesive and the solder mask and covers the conductive trace in the second vertical direction, (15) mechanically attaching the second substrate to the solder mask using the second adhesive, thereby mechanically attaching the conductive trace to the ledge, then (16) mounting a semiconductor device on the bump, wherein the semiconductor device extends into the cavity and the bump provides a recessed die paddle and a reflector for the semiconductor device, (17) electrically connecting the semiconductor device to the pad, thereby electrically connecting the semiconductor device to the terminal and (18) thermally connecting the semiconductor device to the bump, thereby thermally connecting the semiconductor device to the base.

Providing the bump can include mechanically stamping a metal plate, thereby forming the bump in the metal plate and the cavity in the bump. In this instance, the bump is a stamped portion of the metal plate and the ledge is an unstamped portion of the metal plate.

Providing the first adhesive can include providing a prepreg with uncured epoxy, flowing the first adhesive can include melting the uncured epoxy and compressing the uncured epoxy between the ledge and the first conductive layer, and solidifying the first adhesive can include curing the molten uncured epoxy.

Mounting the first conductive layer can include mounting the first conductive layer alone on the first adhesive such that the first conductive layer contacts the first adhesive and the first aperture extends through the first conductive layer alone. In this manner, the first adhesive can laminate the first conductive layer alone to the bump and the ledge.

Mounting the first conductive layer can include mounting a first substrate such as a single-sided copper clad laminate that includes the first conductive layer and a first dielectric layer on the first adhesive such that the first dielectric layer contacts and is sandwiched between the first conductive layer and the first adhesive, the first conductive layer is spaced from the first adhesive and the first aperture extends through the first conductive layer and the first dielectric layer.

Flowing the first adhesive can include filling the gap with the first adhesive and squeezing the first adhesive through the gap, beyond the bump and the first conductive layer in the second vertical direction onto surface portions of the bump and the first conductive layer that are adjacent to the gap and face in the second vertical direction.

Solidifying the first adhesive can include mechanically bonding the bump and the ledge to the first conductive layer and the first dielectric layer. In this manner, the first adhesive can laminate the first conductive layer and the first dielectric layer to the bump and the ledge.

Providing the base can include grinding the bump, the first adhesive and the first conductive layer after solidifying the first adhesive such that the bump, the first adhesive and the first conductive layer are laterally aligned with one another at a lateral surface that faces in the second vertical direction, and then depositing a plated layer on the bump, the first adhesive and the first conductive layer. Depositing the plated layer can include electrolessly plating a thin plated layer on the bump, the first adhesive and the first conductive layer and then electroplating a thick plated layer on the thin plated layer. Furthermore, the plated layer can be adjacent to the bump, the first adhesive and the first conductive layer and cover them in the second vertical direction.

Providing the solder mask can include depositing the solder mask in liquid form on the ledge, then hardening the solder mask and then forming the window using photolithography and dry etching such that the bump is aligned with and spaced from the window. Thereafter, providing the reflective surface layer for the bump can include electrolessly plating a thin plated layer on the bump and then electroplating a thick plated layer on the thin plated layer using the solder mask as a plating mask.

Mounting the second adhesive can include mounting a pressure-sensitive adhesive tape on the ledge. For instance, the adhesive tape can contact the ledge. Alternatively, the adhesive tape can be mounted on the solder mask which is mounted on the ledge, contacts and is sandwiched between and spaces and separates the adhesive tape and the ledge and has the window selectively expose the bump in the first vertical direction. In any case, the second adhesive is mounted on the ledge.

Providing the conductive trace can include providing a second substrate such as a single-sided copper clad laminate that includes a second conductive layer and a second dielectric layer and then removing selected portions of the second conductive layer before mounting the conductive trace. The removing can include applying a wet chemical etch to the second conductive layer using an etch mask that defines the conductive trace.

Mounting the conductive trace can include mounting the second substrate on the second adhesive such that the second dielectric layer contacts and is sandwiched between the conductive trace and the second adhesive and is solidified, the conductive trace is spaced from the second adhesive, a second aperture extends through the second substrate and the bump is aligned with and spaced from the second aperture.

Mechanically attaching the second substrate (and thus the conductive trace) can include mechanically attaching the second substrate to the solder mask (and thus the ledge). Furthermore, mechanically attaching the second substrate can include compressing the adhesive tape between the solder mask (and thus the ledge) and the second substrate. In any case, the second substrate is mechanically attached to the ledge using the second adhesive.

Providing the conductive trace can include providing the pad, the terminal and a routing line that extends laterally on the second dielectric layer in an electrically conductive path between the pad and the terminal. This can include removing selected portions of the second conductive layer using an etch mask that defines the pad, the terminal and the routing line. In this manner, the conductive trace can provide horizontal signal routing between the pad and the terminal.

Providing the conductive trace can include providing the pad, the terminal and a plated through-hole that extends through the ledge, the adhesives, the dielectric layers and the conductive layers in an electrically conductive path between the conductive layers. This can include drilling a hole through the ledge, the adhesives, the dielectric layers and the conductive layers, then depositing the plated layer on the conductive layers and in the hole to form a first plated layer on the first conductive layer, a second plated layer on the second conductive layer and the plated through-hole in the hole, then removing selected portions of the first conductive layer and the first plated layer using a first etch mask that defines the pad and removing selected portions of the second conductive layer and the second plated layer using a second etch mask that defines the terminal. In this manner, the conductive trace can provide vertical signal routing between the pad and the terminal.

Mounting the semiconductor device can include providing a die attach between a semiconductor chip such as an LED chip and the bump, electrically connecting the semiconductor device can include providing a wire bond between the LED chip and the pad, and thermally connecting the semiconductor device can include providing the die attach between the LED chip and the bump.

Encapsulating the semiconductor device such as an LED chip can include depositing an encapsulant in liquid form into the cavity that fills the remaining space in the cavity and covers the LED chip in the first vertical direction and then hardening the encapsulant. Furthermore, the bump can provide a dam that laterally confines the encapsulant as it extends outside the cavity in the first vertical direction, and the encapsulant can be a color-shifting encapsulant that converts blue light emitted by the LED chip into white light.

The first adhesive can contact the bump, the base, the ledge and the first dielectric layer, be spaced from the solder mask, the second adhesive and the second dielectric layer, be sandwiched between the bump and the first dielectric layer, between the ledge and the first dielectric layer and between the base and the ledge, laterally cover and surround and conformally coat a sidewall of the bump, extend through the first aperture and extend to peripheral edges of the assembly after the assembly is manufactured and detached from other assemblies in a batch.

The base can support the bump, the ledge, the conductive trace, the solder mask, the adhesives and the dielectric layers, cover them in the second vertical direction and extend to peripheral edges of the assembly after the assembly is manufactured and detached from other assemblies in a batch.

The present invention has numerous advantages. The heat spreader can provide excellent heat spreading and heat dissipation without heat flow through the adhesives or the dielectric layers. As a result, the adhesives and the dielectric layers can be a low cost dielectric with low thermal conductivity and not prone to delamination. The first adhesive can be sandwiched between the bump and the first substrate and between the ledge and the first substrate, thereby providing a robust mechanical bond between the heat spreader and the first substrate. The second adhesive can be sandwiched between the ledge and the second substrate, thereby providing a robust mechanical bond between the heat spreader and the second substrate. The heat spreader can have a large surface area with relatively thin metal, thereby reducing weight and cost. The bump and the cavity can be defined by mechanical stamping, thereby enhancing precision. The bump and the ledge can be integral with one another, thereby enhancing reliability. The bump can be customized for the semiconductor device, thereby enhancing the thermal connection. The bump can also have a tapered sidewall and a highly reflective surface layer. As a result, the bump can reflect the light generated by an LED chip mounted on the bump within the cavity, thereby focusing the light in the first vertical direction and enhancing the light output. Furthermore, the cavity can provide a well-defined space for a color-shifting encapsulant deposited on the LED chip. As a result, the color-shifting encapsulant can be dispensed into the cavity in a small consistent amount, thereby enhancing optical performance and reducing cost. The ledge can provide mechanical support for the substrates, thereby preventing warping. The pad and the terminal can include a selected portion of the second conductive layer laminated to the second dielectric layer, thereby enhancing reliability. The conductive trace can provide signal routing with simple circuitry patterns or flexible multi-layer signal routing with complex circuitry patterns. The conductive trace can also provide vertical signal routing between the pad and the terminal using a plated through-hole that extends through the ledge, the adhesives and the dielectric layers to the terminal. The assembly can be manufactured using low temperature processes which reduces stress and improves reliability. The assembly can also be manufactured using well-controlled processes which can be easily implemented by circuit board, lead frame and tape manufacturers.

These and other features and advantages of the present invention will be further described and more readily apparent from a review of the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE INVENTION

Figure 1A:
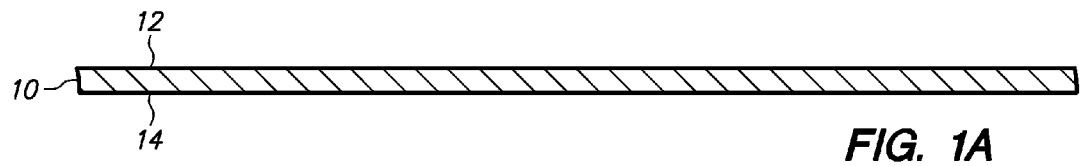
FIGS. 1A and 1B are cross-sectional views showing a method of making a bump and a ledge in accordance with an embodiment of the present invention.
Figure 1B:
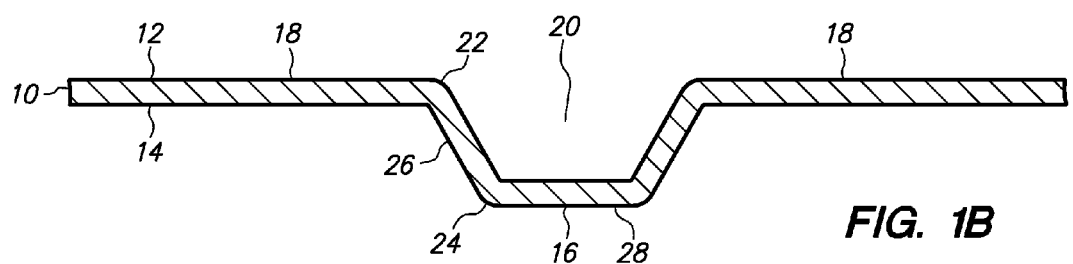
Figure 1C:
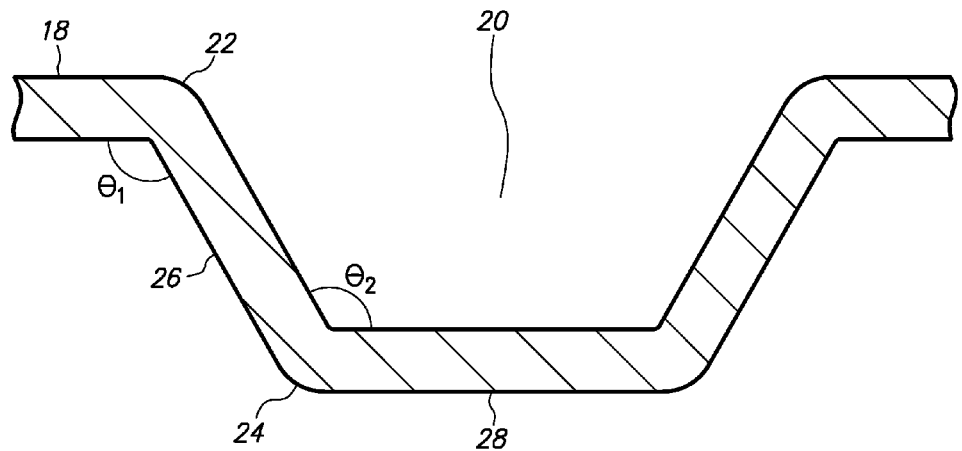
FIGS. 1C, 1D and 1E are enlarged cross-sectional, top and bottom views, respectively, corresponding to FIG. 1B, FIGS. 2A and 2B are cross-sectional views showing a method of making a first adhesive in accordance with an embodiment of the present invention.
Figure 1D:
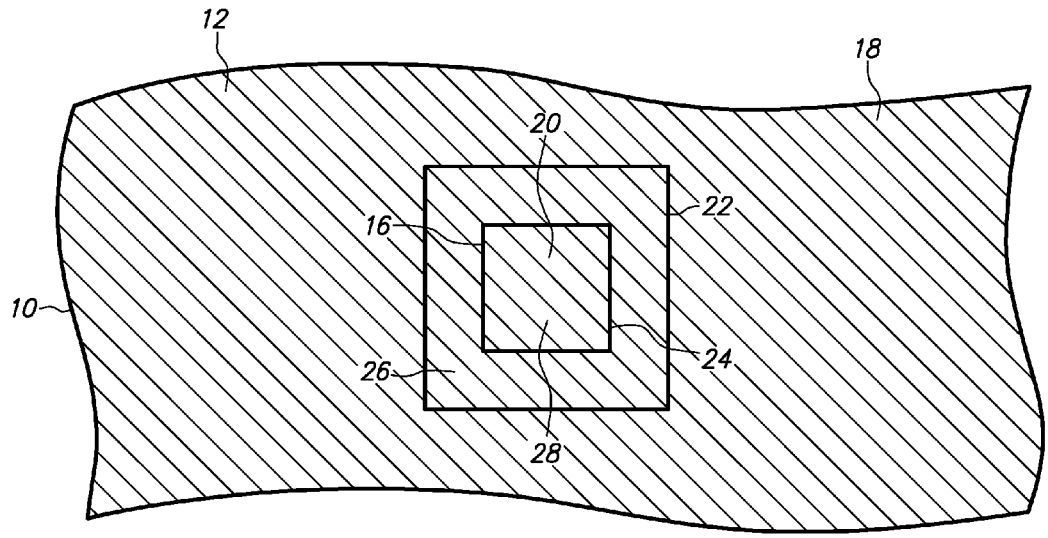
Figure 1E:
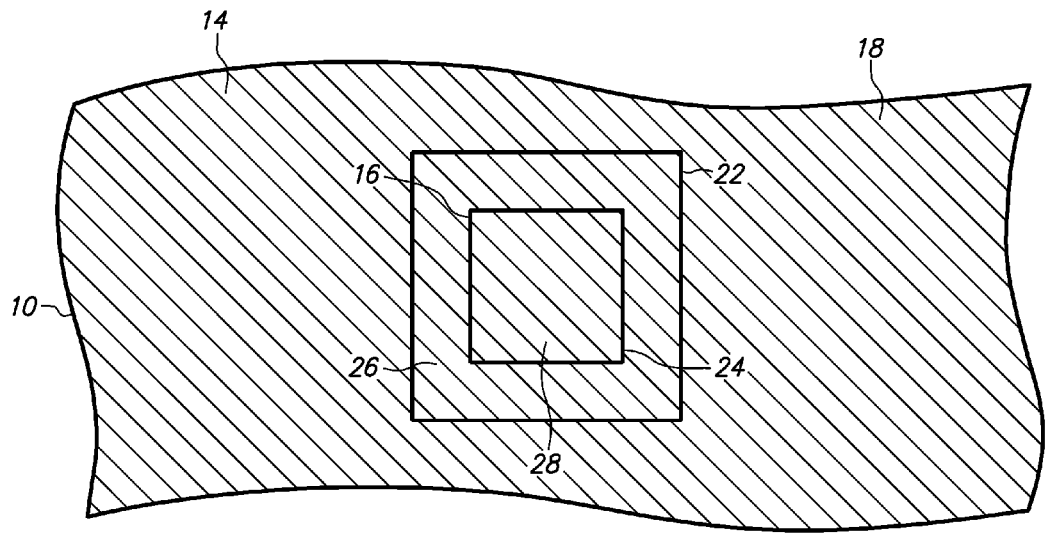

FIGS. 1A and 1B are cross-sectional views showing a method of making a bump and a ledge in accordance with an embodiment of the present invention, FIG. 1C is an enlarged cross-sectional view corresponding to FIG. 1B and FIGS. 1D and 1E are top and bottom views, respectively, corresponding to FIG. 1B.

FIG. 1A. is a cross-sectional view of metal plate 10 which includes opposing major surfaces 12 and 14. Metal plate 10 is illustrated as a copper plate with a thickness of 150 microns. Copper has high thermal conductivity, good bondability and low cost. Metal plate 10 can be various metals such as copper, aluminum, alloy 42, iron, nickel, silver, gold, combinations thereof, and alloys thereof.

FIGS. 1B, 1C, 1D and 1E are cross-sectional, enlarged cross-sectional, top and bottom views, respectively, of metal plate 10 with bump 16, ledge 18 and cavity 20. Bump 16 and cavity 20 are formed by mechanically stamping metal plate 10. Thus, bump 16 is a stamped portion of metal plate 10 and ledge 18 is an unstamped portion of metal plate 10.

Bump 16 is adjacent to and integral with ledge 18 and extends from ledge 18 in the downward direction and ledge 18 extends laterally from bump 16 in the lateral directions (such as left and right) orthogonal to the upward and downward directions.

Bump 16 includes bent corners 22 and 24, sidewall 26 and ceiling 28. Bent corners 22 and 24 are bent by the stamping operation and thus sidewall 26 is shaped and sloped by the stamping operation. Bent corner 22 is adjacent to ledge 18 and sidewall 26 and extends laterally outward. Bent corner 24 is adjacent to sidewall 26 and floor 28 and extends laterally inward. Sidewall 26 extends laterally outward as it extends in the upward direction. Floor 28 extends laterally inward from bent corner 24 and is flat. Furthermore, bent corner 22 has an angle $\theta_1$ of 120 degrees relative to ledge 18 and bent corner 24 has an angle $\theta_2$ of 120 degrees relative to floor 28 (as shown in FIG. 1C). Thus, sidewall 26 tapers at 120 degrees relative to floor 28 and floor 28 is parallel to ledge 18.

Bump 16 has a height of 300 microns relative to ledge 18, a length and width of 1400 microns at ledge 18 and a length and width of 1000 microns at floor 28. Thus, bump 16 has a cut-off pyramidal shape with a tapered sidewall in which its diameter increases as it extends upwardly from floor 28 to ledge 18. Furthermore, bump 16 has an irregular thickness due to the stamping operation. For instance, sidewall 26 is thinner than floor 28 since it is elongated by the stamping operation. Bump 16 is shown with a uniform thickness for convenience of illustration.

Cavity 20 faces in the upward direction, exposes bump 16 in the upward direction, extends into bump 16 in the downward direction, is covered by bump 16 in the downward direction and has an entrance at ledge 18. Cavity 20 also conforms to the shape of bump 16. Thus, cavity 20 has a cut-off pyramidal shape in which its diameter increases as it extends upwardly from floor 28 towards ledge 18. Furthermore, cavity 20 extends across most of bump 16 in the vertical and lateral directions and has a depth of 300 microns.

Figure 2A:
FIGS. 2C and 2D are top and bottom views, respectively, corresponding to FIG. 2B, FIGS. 3A and 3B are cross-sectional views showing a method of making a second adhesive in accordance with an embodiment of the present invention.
Figure 2B:
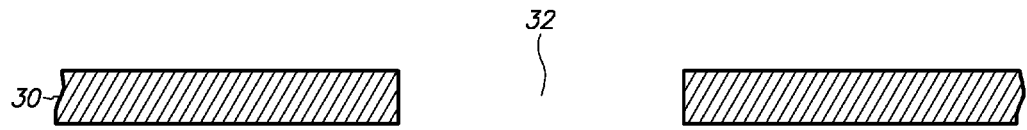
Figure 2C:
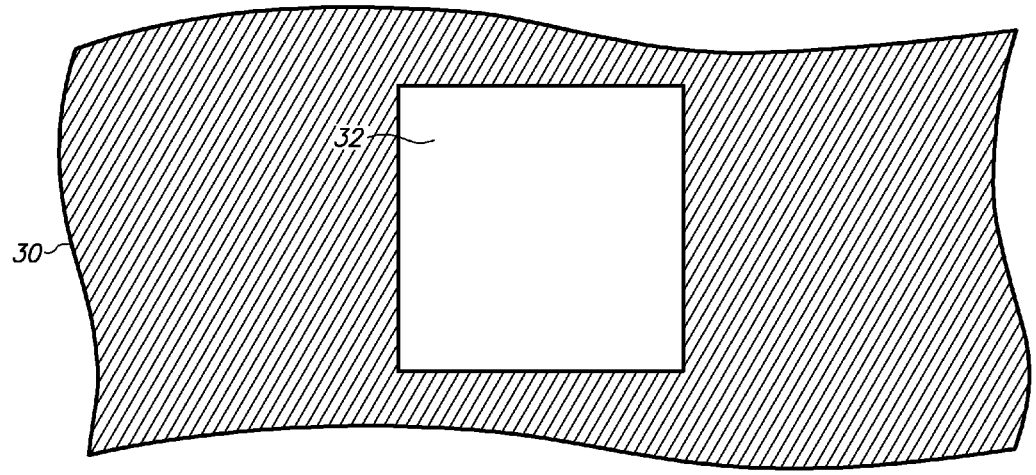
Figure 2D:
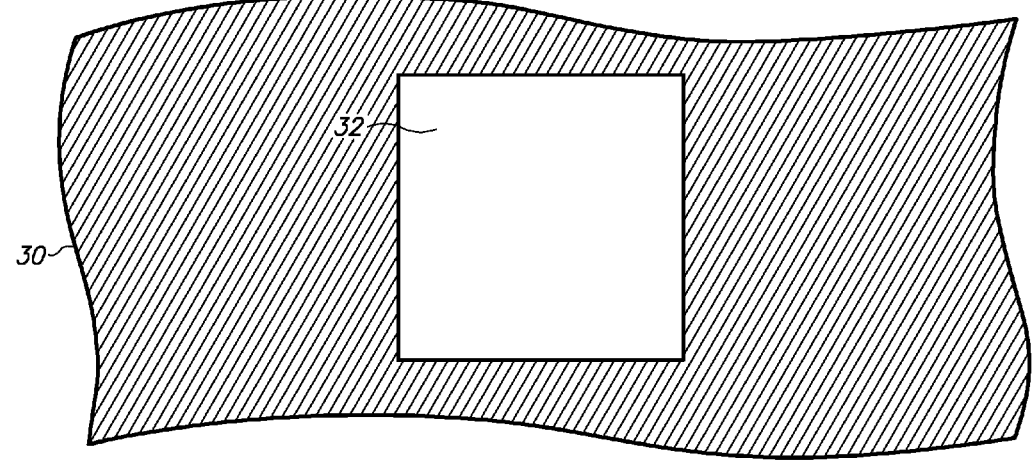

FIGS. 2A and 2B are cross-sectional views showing a method of making a first adhesive in accordance with an embodiment of the present invention, and FIGS. 2C and 2D are top and bottom views, respectively, corresponding to FIG. 2B.

FIG. 2A is a cross-sectional view of adhesive 30. Adhesive 30 is illustrated as a prepreg with B-stage uncured epoxy provided as a non-solidified unpatterned sheet with a thickness of 150 microns.

Adhesive 30 can be various dielectric films or prepregs formed from numerous organic or inorganic electrical insulators. For instance, adhesive 30 can initially be a prepreg in which thermosetting epoxy in resin form impregnates a reinforcement and is partially cured to an intermediate stage. The epoxy can be FR-4 although other epoxies such as polyfunctional and bismaleimide triazine (BT) are suitable. For specific applications, cyanate esters, polyimide and PTFE are also suitable. The reinforcement can be E-glass although other reinforcements such as S-glass, D-glass, quartz, kevlar aramid and paper are suitable. The reinforcement can also be woven, non-woven or random microfiber. A filler such as silica (powdered fused quartz) can be added to the prepreg to improve thermal conductivity, thermal shock resistance and thermal expansion matching. Commercially available prepregs such as SPEEDBOARD C prepreg by W.L. Gore & Associates of Eau Claire, Wis. are suitable.

FIGS. 2B, 2C and 2D are cross-sectional, top and bottom views, respectively, of adhesive 30 with opening 32. Opening 32 is a window that extends through adhesive 30 and has a length and width of 1500 microns. Opening 32 is formed by punching or stamping through the prepreg although other techniques such as plasma etching can be used. Likewise, opening 32 can be formed by mechanical drilling if a circular shape is suitable.

Figure 3A:
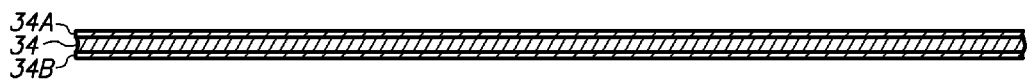
FIGS. 3C and 3D are top and bottom views, respectively, corresponding to FIG. 3B, FIGS. 4A and 4B are cross-sectional views showing a method of making a first substrate in accordance with an embodiment of the present invention.
Figure 3B:
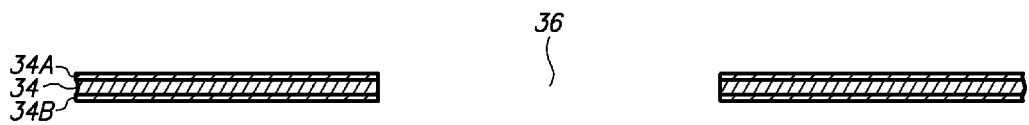
Figure 3C:
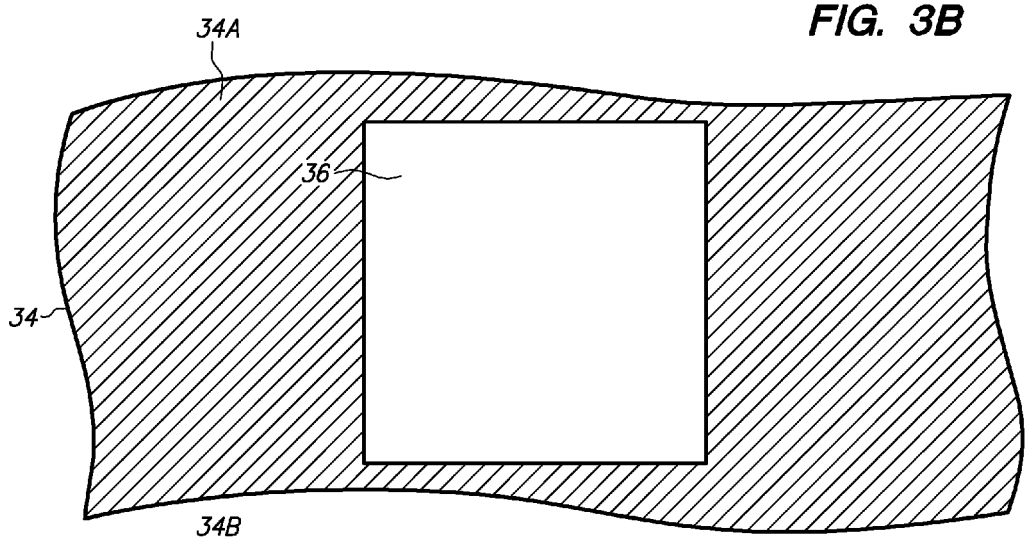
Figure 3D:
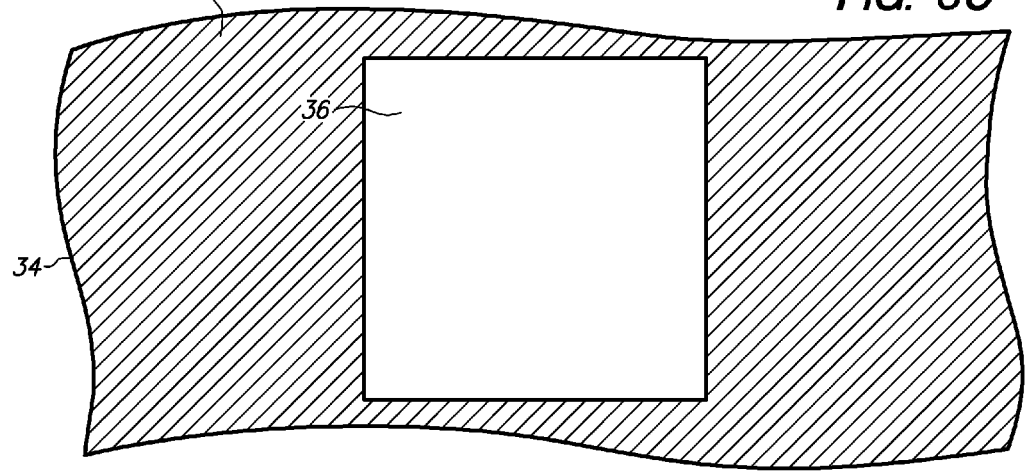

FIGS. 3A and 3B are cross-sectional views showing a method of making a second adhesive in accordance with an embodiment of the present invention, and FIGS. 3C and 3D are top and bottom views, respectively, corresponding to FIG. 3B.

FIG. 3A is a cross-sectional view of adhesive 34. Adhesive 34 is illustrated as an electrically insulative, pressure-sensitive adhesive tape provided as a solidified unpatterned sheet with a thickness of 25 microns.

Release liners 34A and 34B are protective paper liners that cover the top and bottom surfaces of adhesive 34. Release liners 34A and 34B protect adhesive 34 from debris and prevent premature adhesive contact. Commercially available adhesive tapes with release liners such as Bond-Ply® 450 by The Bergquist Company of Chanhassen, Minn. are suitable.

FIGS. 3B, 3C and 3D are cross-sectional, top and bottom views, respectively, of adhesive 34 with opening 36. Opening 36 is a window that extends through adhesive 34 and has a length and width of 1650 microns. Opening 36 is formed by punching or stamping through adhesive 34 and release liners 34A and 34B although other techniques such as plasma etching can be used. Likewise, opening 36 can be formed by mechanical drilling if a circular shape is suitable.

Figure 4A:
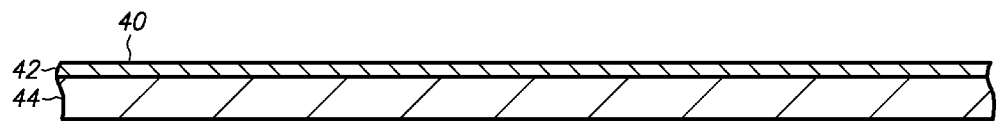
FIGS. 4C and 4D are top and bottom views, respectively, corresponding to FIG. 4B, FIGS. 5A-5E are cross-sectional views showing a method of making a second substrate in accordance with an embodiment of the present invention.
Figure 4B:
Figure 4C:
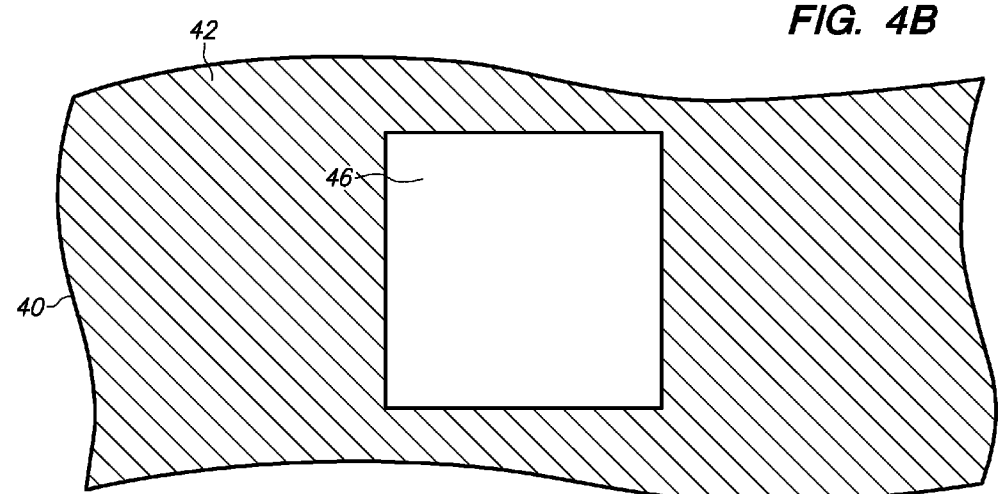
Figure 4D:
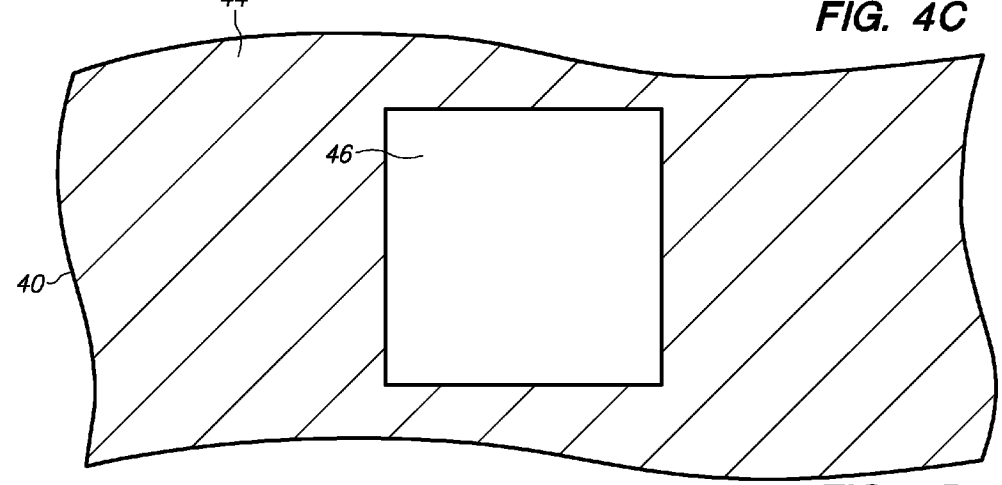

FIGS. 4A and 4B are cross-sectional views showing a method of making a first substrate in accordance with an embodiment of the present invention, and FIGS. 4C and 4D are top and bottom views, respectively, corresponding to FIG. 4B.

FIG. 4A is a cross-sectional view of substrate 40 that includes conductive layer 42 and dielectric layer 44. Conductive layer 42 is an electrical conductor that contacts and extends above dielectric layer 44, and dielectric layer 44 is an electrical insulator. For instance, conductive layer 42 is an unpatterned copper sheet with a thickness of 30 microns and dielectric layer 44 is an unpatterned epoxy sheet with a thickness of 150 microns. Thus, substrate 40 is a single-sided copper clad laminate with conductive layer 42 attached to dielectric layer 44.

FIGS. 4B, 4C and 4D are cross-sectional, top and bottom views, respectively, of substrate 40 with aperture 46. Aperture 46 is a window that extends through substrate 40 and has a length and width of 1500 microns. Aperture 46 is formed by punching or stamping through conductive layer 42 and dielectric layer 44 although other techniques such as plasma etching with or without wet chemical etching can be used. Likewise, aperture 46 can be formed by mechanical drilling if a circular shape is suitable. Thus, opening 32 and aperture 46 have the same size. Furthermore, opening 32 and aperture 46 can be formed in the same manner with the same punch at the same punching station.

Substrate 40 is illustrated as a laminated structure without circuitry. Substrate 40 can also be an electrical interconnect such as a ceramic board or a printed circuit board. Likewise, substrate 40 can include additional layers of embedded circuitry.

Figure 5A:
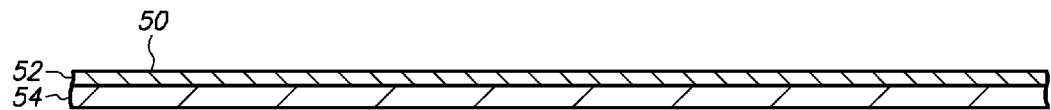
FIGS. 5F and 5G are top and bottom views, respectively, corresponding to FIG. 5E, FIGS. 6A-6N are cross-sectional views showing a method of making a thermal board with the bump, the ledge, the adhesives and the substrates in accordance with an embodiment of the present invention.
Figure 5B:
Figure 5C:
Figure 5D:
Figure 5E:
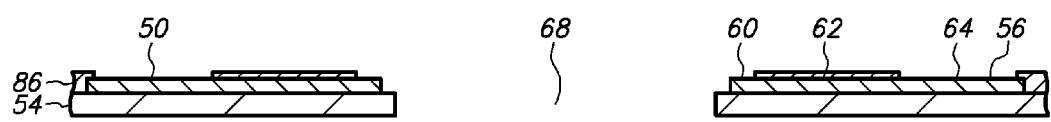
Figure 5F:
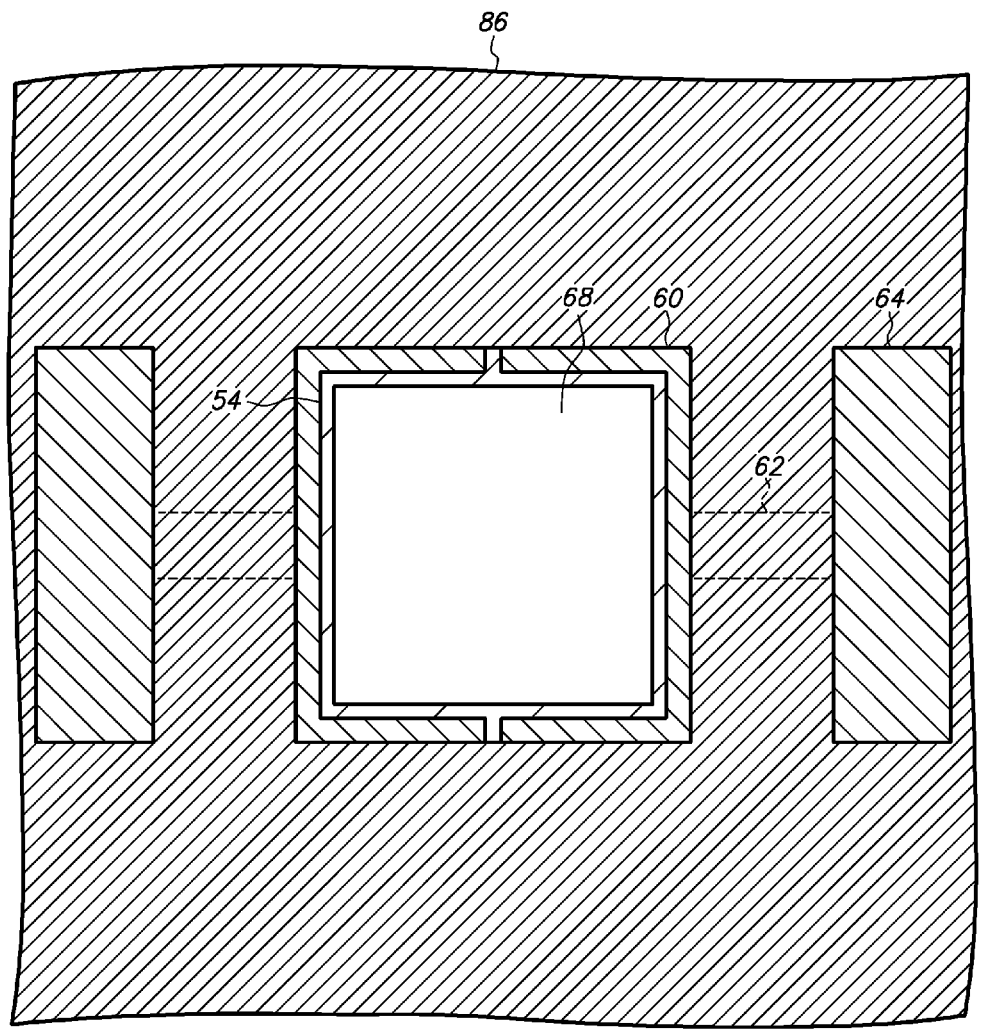
Figure 5G:
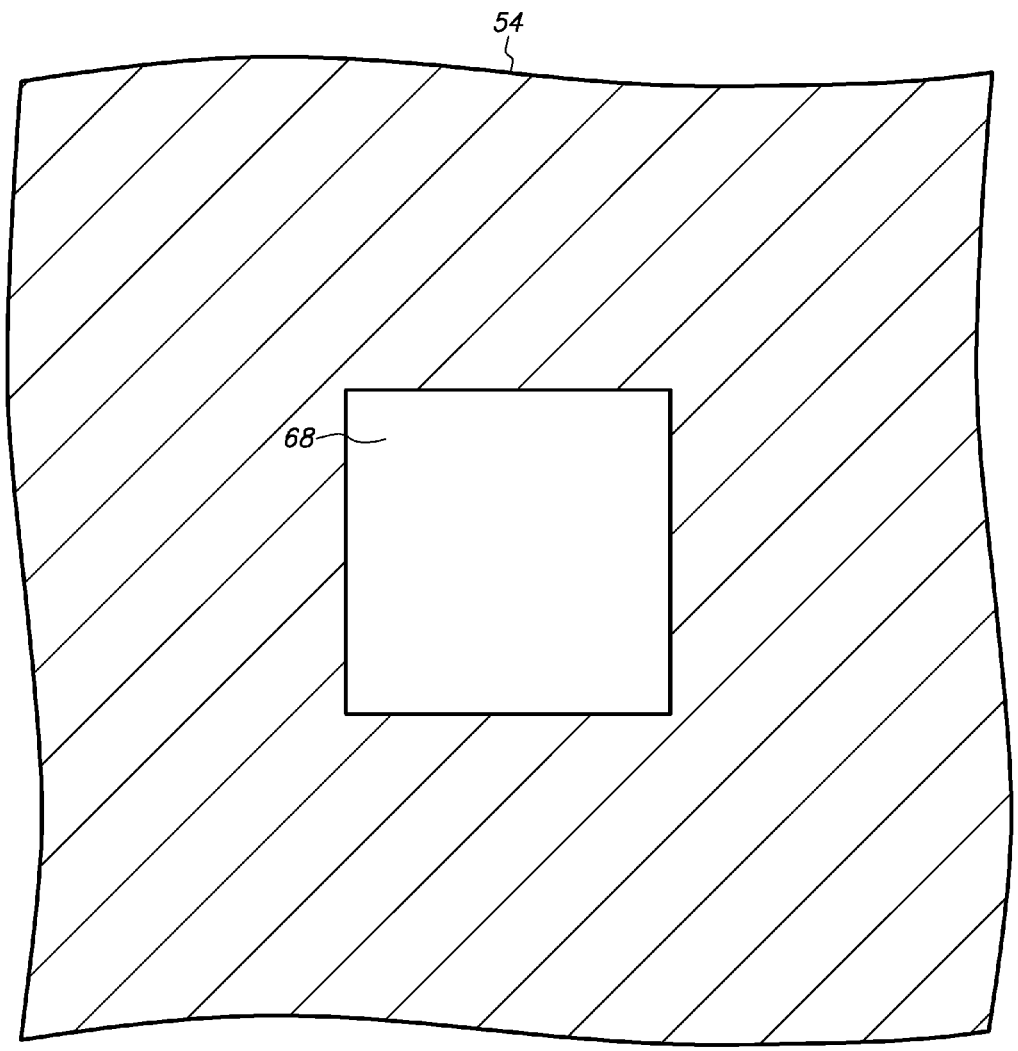

FIGS. 5A-5E are cross-sectional views showing a method of making a second substrate in accordance with an embodiment of the present invention, and FIGS. 5F and 5G are top and bottom views, respectively, corresponding to FIG. 5E.

FIG. 5A is a cross-sectional view of substrate 50 that includes conductive layer 52 and dielectric layer 54. Conductive layer 52 is an electrical conductor that contacts and extends above dielectric layer 54, and dielectric layer 54 is an electrical insulator. For instance, conductive layer 52 is an unpatterned copper sheet with a thickness of 30 microns and dielectric layer 54 is an unpatterned epoxy sheet with a thickness of 50 microns. Thus, substrate 50 is a single-sided copper clad laminate with conductive layer 52 attached to dielectric layer 54.

FIG. 5B is a cross-sectional view of substrate 50 with selected portions of conductive layer 52 removed by photolithography and etching. This includes providing an etch mask (not shown) on conductive layer 52, then applying a wet chemical etch that etches through conductive layer 52 in the pattern defined by the etch mask and then removing the etch mask, as is conventional.

Conductive layer 52 as etched includes conductive trace 56. Thus, conductive trace 56 is a selected portion of conductive layer 52 defined by the etch mask. Conductive trace 56 includes pad 60, routing line 62 and terminal 64. Routing line 62 provides an electrically conductive path between pad 60 and terminal 64. Furthermore, pad 60 and terminal 64 have the same thickness and are coplanar with one another.

FIG. 5C is a cross-sectional view of substrate 50 with solder mask 86 formed on dielectric layer 54 and conductive trace 56.

Solder mask 86 is an electrically insulative layer that is selectively patterned to expose pad 60, terminal 64 and a central portion of dielectric layer 54 in the upward direction, cover routing line 62 in the upward direction and cover dielectric layer 54 where it is otherwise exposed in the upward direction. Solder mask 86 has a thickness of 25 microns above pad 60, routing line 62 and terminal 64 and extends 55 microns (30+25) above dielectric layer 54.

Solder mask 86 is initially a photoimageable liquid resin that is dispensed on the structure. Thereafter, solder mask 86 is patterned by selectively applying light through a reticle (not shown) so that the solder mask portions exposed to the light are rendered insoluble, applying a developer solution to remove the solder mask portions that are unexposed to the light and remain soluble and then hard baking, as is conventional.

FIG. 5D is a cross-sectional view of substrate 50 with plated contacts 66 formed on pad 60 and terminal 64 using solder mask 86 as a plating mask.

Plated contacts 66 are thin spot plated metal coatings that contact the exposed copper surfaces. Thus, plated contacts 66 contact pad 60 and terminal 64 and cover their exposed portions in the upward direction. For instance, a nickel layer is electrolessly plated on the exposed copper surfaces, and then a gold layer is electrolessly plated on the nickel layer. The buried nickel layer has a thickness of 3 microns, the gold surface layer has a thickness of 0.5 microns, and plated contacts 66 have a thickness of 3.5 microns.

Pad 60 and terminal 64 treated with plated contacts 66 as a surface finish have several advantages. The buried nickel layer provides the primary mechanical and electrical connection, and the gold surface layer provides a wettable surface to facilitate solder reflow and accommodates a solder joint and a wire bond. Plated contacts 66 also protect pad 60 and terminal 64 from corrosion. Plated contacts 66 can include a wide variety of metals to accommodate the external connection media. For instance, a gold or silver surface layer can be plated on a buried nickel layer or a nickel surface layer alone can be employed.

Pad 60 and terminal 64 treated with plated contacts 66 are shown as single layers for convenience of illustration. The boundary (not shown) in pad 60 and terminal 64 with plated contacts 66 occurs at the copper/nickel interface.

FIGS. 5E, 5F and 5G are cross-sectional, top and bottom views, respectively, of substrate 50 with aperture 68. Aperture 68 is a window that extends through substrate 50, is adjacent to dielectric layer 54, is spaced from conductive trace 56 and has a length and width of 1600 microns. Aperture 68 is formed by punching or stamping through dielectric layer 54 although other techniques such as plasma etching can be used. Likewise, aperture 68 can be formed by mechanical drilling if a circular shape is suitable.

Substrate 50 is illustrated as a laminated structure. Substrate 50 can be other electrical interconnects such as a ceramic board or a printed circuit board. Likewise, substrate 50 can include additional layers of embedded circuitry.

Routing line 62 covered by solder mask 86 in the upward direction is shown in phantom in FIG. 5F for convenience of illustration. Likewise, pad 60 and terminal 64 include edges covered by solder mask 86 in the upward direction that are not shown in FIG. 5F for convenience of illustration.

Figure 6A:
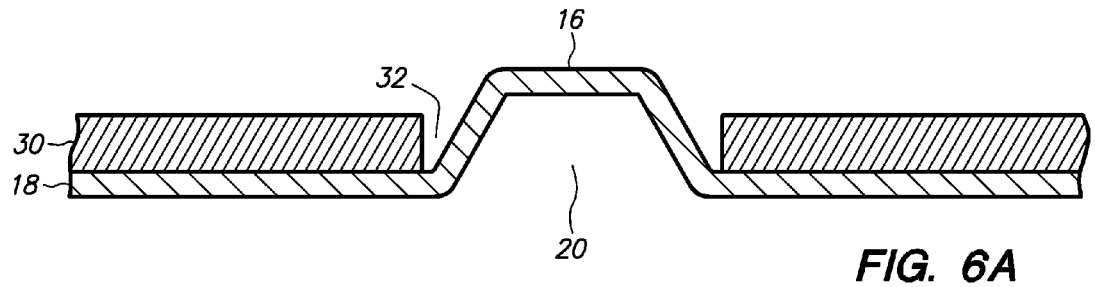
FIGS. 6O and 6P are top and bottom views, respectively, corresponding to FIG. 6N, FIGS. 7A, 7B and 7C are cross-sectional, top and bottom views, respectively, of a thermal board with a thick base in accordance with an embodiment of the present invention.
Figure 6B:
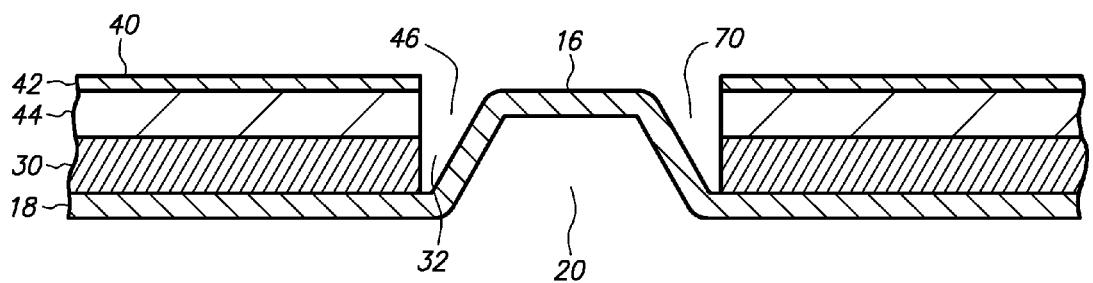
Figure 6C:
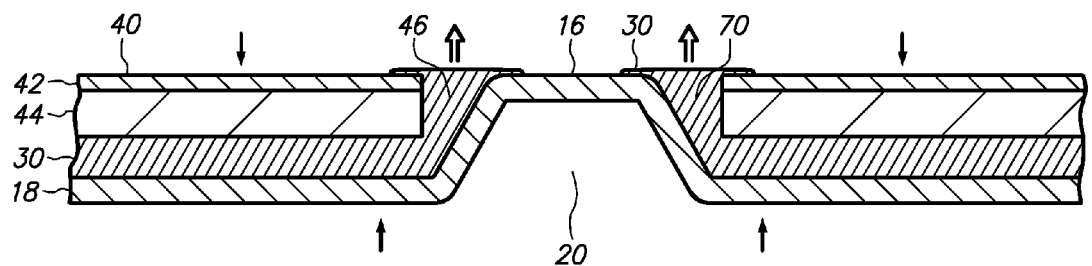
Figure 6D:
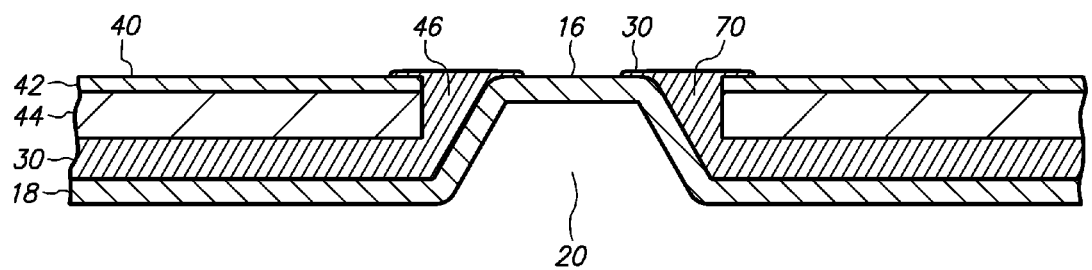
Figure 6E:
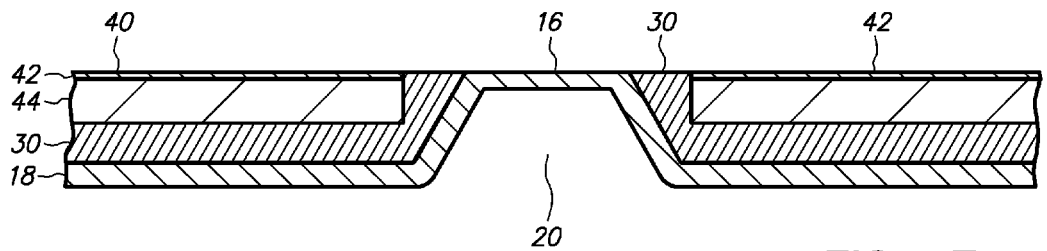
Figure 6F:
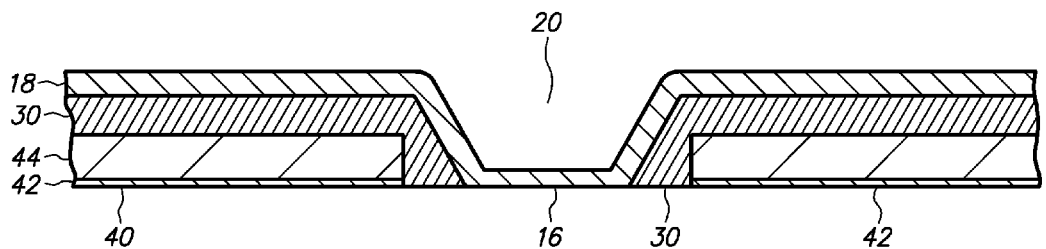
Figure 6G:
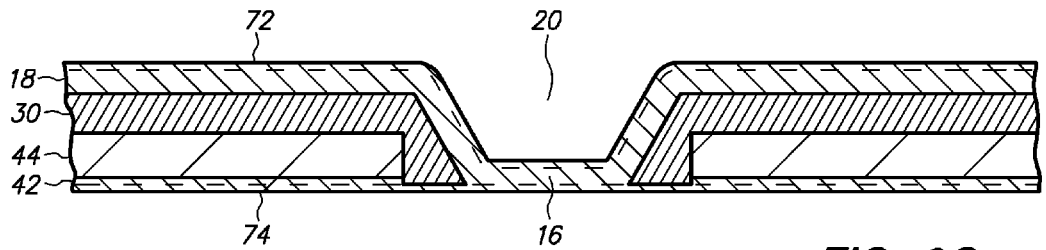
Figure 6H:
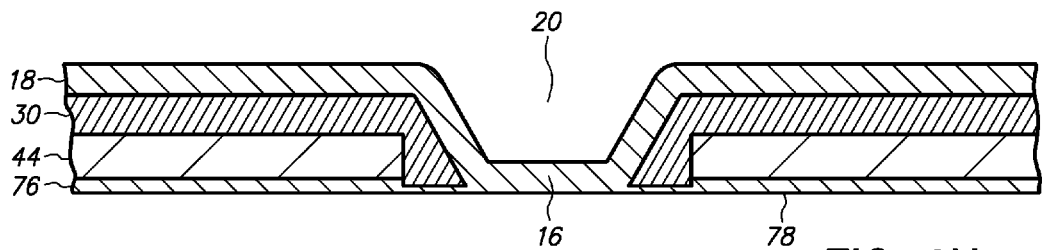
Figure 6I:
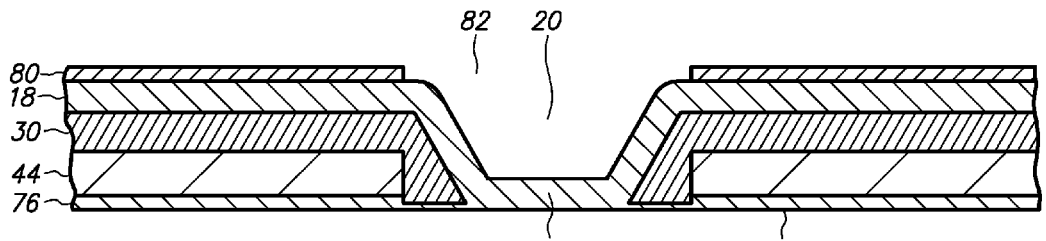
Figure 6J:
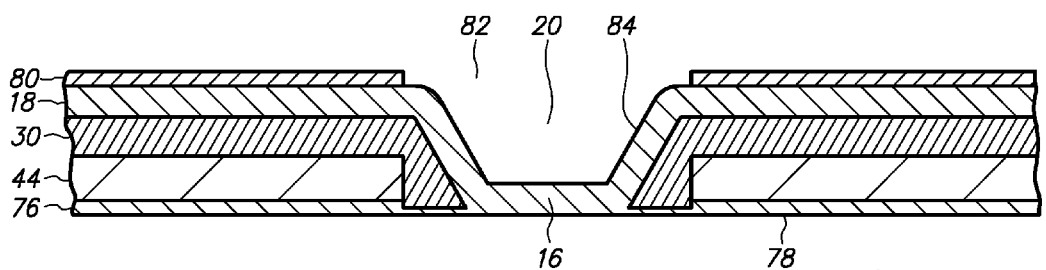
Figure 6K:
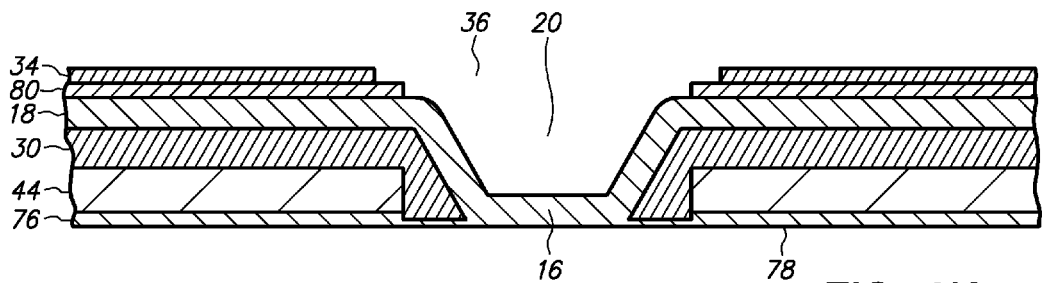
Figure 6L:
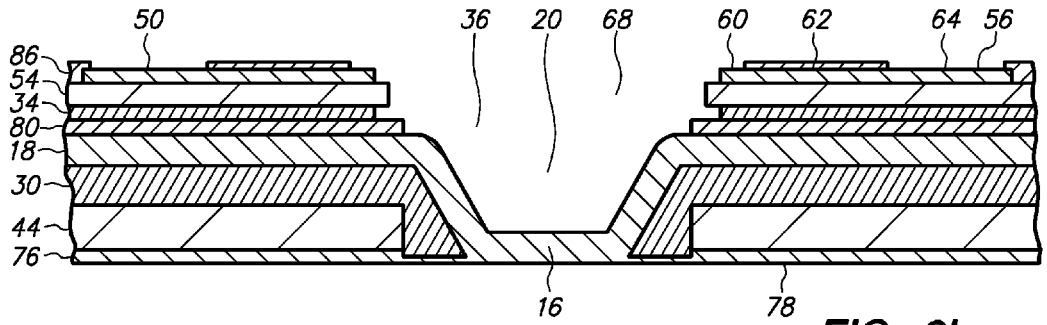
Figure 6M:
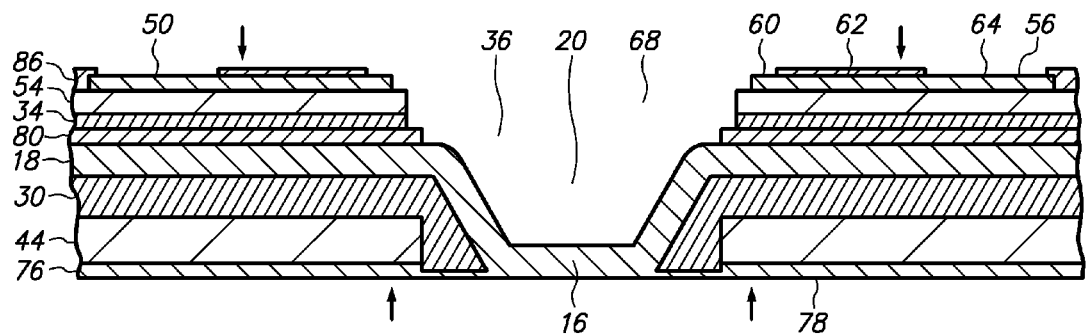
Figure 6N:
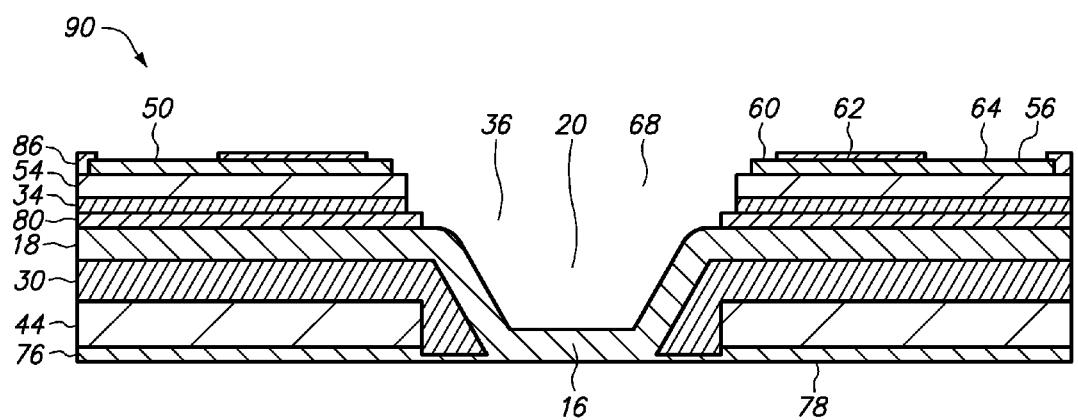
Figure 6O:
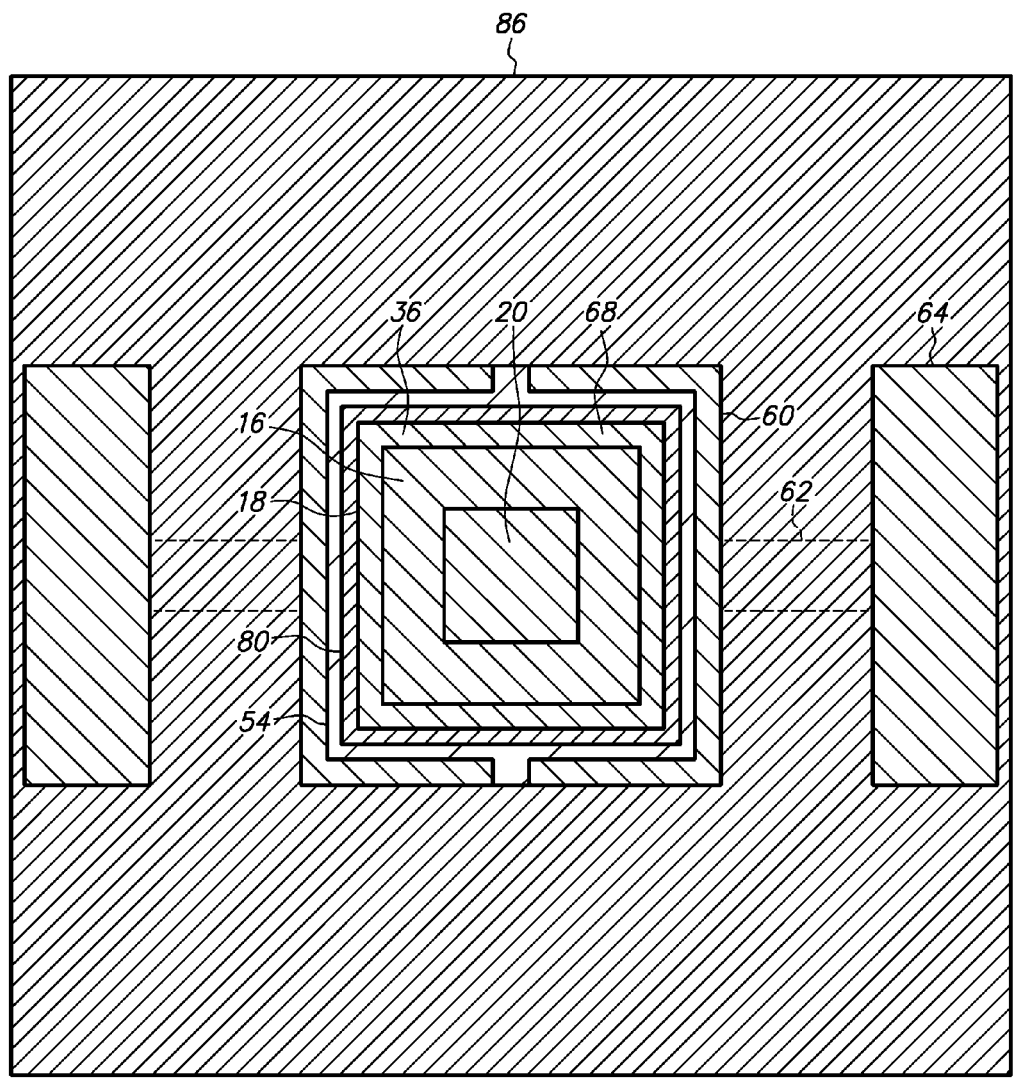
Figure 6P:
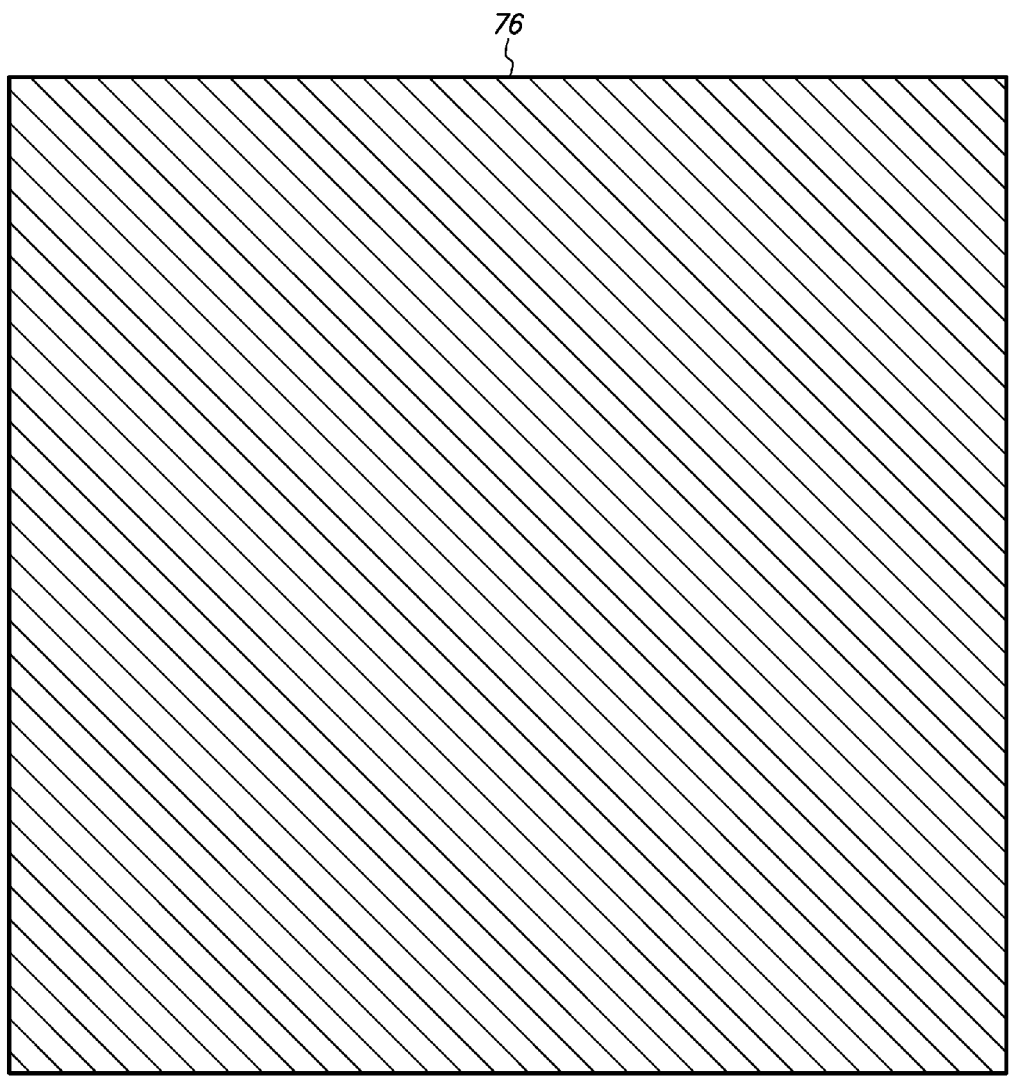

FIGS. 6A-6N are cross-sectional views showing a method of making a thermal board that includes bump 16, ledge 18, adhesives 30 and 34 and substrates 40 and 50 in accordance with an embodiment of the present invention, and FIGS. 6O and 6P are top and bottom views, respectively, corresponding to FIG. 6N.

In FIGS. 6A and 6B the structure is inverted to a cavity-down position so that gravity assists with mounting adhesive 30 and substrate 40 on ledge 18 and in FIGS. 6C-6E the structure remains in the cavity-down position. Thereafter, in FIGS. 6F-6N the structure is inverted again to the cavity-up position as in FIGS. 1A-1C. Thus, cavity 20 faces downward in FIGS. 6A-6E and upward in FIGS. 6F-6N. However, the relative orientation of the structure does not change. Cavity 20 faces in the first vertical direction and is covered by bump 16 in the second vertical direction regardless of whether the structure is inverted, rotated or slanted. Likewise, bump 16 extends beyond ledge 18 in the second vertical direction regardless of whether the structure is inverted, rotated or slanted. Hence, the first and second vertical directions are oriented relative to the structure and remain opposite to one another and orthogonal to the lateral directions.

FIG. 6A is a cross-sectional view of the structure with adhesive 30 mounted on ledge 18. Adhesive 30 is mounted by lowering it onto ledge 18 as bump 16 is inserted into and through and upwards in opening 32. Adhesive 30 eventually contacts and rests on ledge 18. Preferably, bump 16 is inserted into and extends through opening 32 without contacting adhesive 30 and is aligned with and centrally located within opening 32.

FIG. 6B is a cross-sectional view of the structure with substrate 40 mounted on adhesive 30. Substrate 40 is mounted by lowering it onto adhesive 30 as bump 16 is inserted into and upwards in aperture 46. Substrate 40 eventually contacts and rests on adhesive 30.

Bump 16 is inserted into but not through aperture 46 without contacting substrate 40 and is aligned with and centrally located within aperture 46. As a result, gap 70 is located in aperture 46 between bump 16 and substrate 40. Gap 70 laterally surrounds bump 16 and is laterally surrounded by substrate 40. In addition, opening 32 and aperture 46 are precisely aligned with one another and have the same diameter.

At this stage, substrate 40 is mounted on and contacts and extends above adhesive 30. Bump 16 extends through opening 32 into aperture 46 to dielectric layer 44, is 30 microns below the top surface of conductive layer 42 and is exposed through aperture 46 in the upward direction. Adhesive 30 contacts and is sandwiched between ledge 18 and substrate 40, contacts dielectric layer 44 but is spaced from conductive layer 42 and remains a non-solidified prepreg with B-stage uncured epoxy, and gap 70 is filled with air.

FIG. 6C is a cross-sectional view of the structure with adhesive 30 in gap 70. Adhesive 30 is flowed into gap 70 by applying heat and pressure. In this illustration, adhesive 30 is forced into gap 70 by applying downward pressure to substrate 40 and/or upward pressure to ledge 18, thereby moving ledge 18 and substrate 40 towards one another and applying pressure to adhesive 30 while simultaneously applying heat to adhesive 30. Adhesive 30 becomes compliant enough under the heat and pressure to conform to virtually any shape. As a result, adhesive 30 sandwiched between ledge 18 and substrate 40 is compressed, forced out of its original shape and flows into and upward in gap 70. Ledge 18 and substrate 40 continue to move towards one another and adhesive 30 eventually fills gap 70. Moreover, adhesive 30 remains sandwiched between and continues to fill the reduced space between ledge 18 and substrate 40.

For instance, ledge 18 and conductive layer 42 can be disposed between top and bottom platens (not shown) of a press. In addition, a top cull plate and top buffer paper (not shown) can be sandwiched between conductive layer 42 and the top platen, and a bottom cull plate and bottom buffer paper (not shown) can be sandwiched between ledge 18 and the bottom platen. The stack includes the top platen, top cull plate, top buffer paper, conductive layer 42, dielectric layer 44, adhesive 30, ledge 18, bottom buffer paper, bottom cull plate and bottom platen in descending order. Furthermore, the stack may be positioned on the bottom platen by tooling pins (not shown) that extend upward from the bottom platen through registration holes (not shown) in ledge 18.

The platens are heated and move towards one another, thereby applying heat and pressure to adhesive 30. The cull plates disperse the heat from the platens so that it is more uniformly applied to ledge 18 and substrate 40 and thus adhesive 30, and the buffer papers disperse the pressure from the platens so that it is more uniformly applied to ledge 18 and substrate 40 and thus adhesive 30. Initially, dielectric layer 44 contacts and presses down on adhesive 30. As the platen motion and heat continue, adhesive 30 between ledge 18 and substrate 40 is compressed, melted and flows into and upward in gap 70 and across conductive layer 42 and dielectric layer 44. For instance, the uncured epoxy is melted by the heat and the molten uncured epoxy is squeezed by the pressure into gap 70, however the reinforcement and the filler remain between ledge 18 and substrate 40. Adhesive 30 elevates more rapidly than bump 16 in aperture 46 and fills gap 70. Adhesive 30 also rises slightly above gap 70 and overflows onto the top surfaces of bump 16 and conductive layer 42 adjacent to gap 70 before the platen motion stops. This may occur due to the prepreg being slightly thicker than necessary. As a result, adhesive 30 creates a thin coating on the top surfaces of bump 16 and conductive layer 42. The platen motion is eventually blocked by bump 16 and the platens become stationary but continue to apply heat to adhesive 30.

The upward flow of adhesive 30 in gap 70 is shown by the thick upward arrows, the upward motion of bump 16 and ledge 18 relative to substrate 40 is shown by the thin upward arrows, and the downward motion of substrate 40 relative to bump 16 and ledge 18 is shown by the thin downward arrows.

FIG. 6D is a cross-sectional view of the structure with adhesive 30 solidified.

For instance, the platens continue to clamp bump 16 and ledge 18 and apply heat after the platen motion stops, thereby converting the B-stage molten uncured epoxy into C-stage cured or hardened epoxy. Thus, the epoxy is cured in a manner similar to conventional multi-layer lamination. After the epoxy is cured, the platens move away from one another and the structure is released from the press.

Adhesive 30 as solidified provides a secure robust mechanical bond between bump 16 and substrate 40 and between ledge 18 and substrate 40. Adhesive 30 can withstand normal operating pressure without distortion or damage and is only temporarily distorted under unusually high pressure. Furthermore, adhesive 30 can absorb thermal expansion mismatch between bump 16 and substrate 40 and between ledge 18 and substrate 40.

At this stage, bump 16 and conductive layer 42 are essentially coplanar with one another and bump 16, adhesive 30 and conductive layer 42 extend to a top surface that faces in the upward direction. For instance, adhesive 30 between ledge 18 and dielectric layer 44 has a thickness of 120 microns which is 30 microns less than its initial thickness of 150 microns, bump 16 ascends 30 microns in aperture 46 and substrate 40 descends 30 microns relative to bump 16. The 300 micron height of bump 16 is essentially the same as the combined height of conductive layer 42 (30 microns), dielectric layer 44 (150 microns) and the underlying adhesive 30 (120 microns). Furthermore, bump 16 continues to be centrally located in opening 32 and aperture 46 and spaced from substrate 40 and adhesive 30 fills the space between ledge 18 and substrate 40 and fills gap 70. For instance, gap 70 (as well as adhesive 30 between bump 16 and substrate 40) has a width of 200 microns ((1400-1000)/2) at floor 28. Adhesive 30 extends across dielectric layer 44 in gap 70. That is, adhesive 30 in gap 70 extends in the upward and downward directions across the thickness of dielectric layer 44 at the outer sidewall of gap 70. Adhesive 30 also includes a thin top portion above gap 70 that contacts the top surfaces of bump 16 and conductive layer 42 and extends above bump 16 by 10 microns.

FIG. 6E is a cross-sectional view of the structure after upper portions of bump 16, adhesive 30 and conductive layer 42 are removed.

Bump 16, adhesive 30 and conductive layer 42 have their upper portions removed by grinding. For instance, a rotating diamond sand wheel and distilled water are applied to the top of the structure. Initially, the diamond sand wheel grinds only adhesive 30. As the grinding continues, adhesive 30 becomes thinner as its grinded surface migrates downwardly. Eventually the diamond sand wheel contacts bump 16 and conductive layer 42 (not necessarily at the same time), and as a result, begins to grind bump 16 and conductive layer 42 as well. As the grinding continues, bump 16, adhesive 30 and conductive layer 42 become thinner as their grinded surfaces migrate downwardly. The grinding continues until the desired thickness has been removed. Thereafter, the structure is rinsed in distilled water to remove contaminants.

The grinding removes a 25 micron thick upper portion of adhesive 30, a 15 micron thick upper portion of bump 16 and a 15 micron thick upper portion of conductive layer 42. The decreased thickness does not appreciably affect bump 16 or adhesive 30. However, it substantially reduces the thickness of conductive layer 42 from 30 microns to 15 microns.

At this stage, bump 16, adhesive 30 and conductive layer 42 are coplanar with one another at a smoothed lapped lateral top surface that is above dielectric layer 44 and faces in the upward direction.

FIG. 6F is a cross-sectional view of the structure after it is inverted.

FIG. 6G is a cross-sectional view of the structure with plated layer 72 formed on bump 16 and ledge 18 and plated layer 74 formed on bump 16, adhesive 30 and conductive layer 42.

Plated layer 72 is deposited on bump 16 and ledge 18 at their top surfaces where they are exposed in the upward direction and covers them in the upward direction. Plated layer 72 is an unpatterned copper layer with a thickness of 20 microns.

Plated layer 74 is deposited on bump 16, adhesive 30 and conductive layer 42 at the lateral bottom surface where they are exposed in the downward direction and covers them in the downward direction. Plated layer 74 is an unpatterned copper layer with a thickness of 20 microns.

For instance, the structure is dipped in an activator solution to render adhesive 30 catalytic to electroless copper, then an upper electroless copper layer is electrolessly plated on bump 16 and ledge 18 and a lower electroless copper layer is electrolessly plated on bump 16, adhesive 30 and conductive layer 42, and then an upper electroplated copper layer is electroplated on the upper electroless copper layer to form plated layer 72 and a lower electroplated copper layer is electroplated on the lower electroless copper layer to form plated layer 74. The electroless copper layers have a thickness of 2 microns, the electroplated copper layers have a thickness of 18 microns, and plated layers 72 and 74 have a thickness of 20 microns. As a result, bump 16 and ledge 18 essentially grow in the upward direction and conductive layer 42 essentially grows in the downward direction.

Plated layer 72 serves as a build-up layer for bump 16 and ledge 18 and plated layer 74 serves as cover layer for bump 16, a build-up layer for conductive layer 42 and a bridge between bump 16 and conductive layer 42 on adhesive 30.

Bump 16 as enlarged by plated layer 72 includes a portion of plated layer 72 that is deposited into cavity 20. Likewise, ledge 18 as enlarged by plated layer 72 includes a portion of plated layer 72 that is deposited outside cavity 20. Furthermore, cavity 20 continues to be exposed in the upward direction, expose bump 16 in the upward direction and extend across most of bump 16 in the vertical and lateral directions.

Bump 16, ledge 18 and plated layer 72 are shown as a single layer for convenience of illustration. Likewise, bump 16, conductive layer 42 and plated layer 74 are shown as a single layer for convenience of illustration. The boundary (shown in phantom) between bump 16 and plated layer 72, between ledge 18 and plated layer 72, between bump 16 and plated layer 74 and between conductive layer 42 and plated layer 74 may be difficult or impossible to detect since copper is plated on copper. However, the boundary between adhesive 30 and plated layer 74 is clear.

FIG. 6H is a cross-sectional view of the structure after the plating operation.

Base 76 includes conductive layer 42 and plated layer 74. Thus, base 76 is adjacent to bump 16 at corner 24 and floor 28, extends below and laterally from bump 16 and covers bump 16 in the downward direction. Base 76 has a thickness of 20 microns where it is adjacent to bump 16, a thickness of 20 microns where it is adjacent to adhesive 30 between bump 16 and dielectric layer 44 and a thickness of 35 microns (15+20)

where it is adjacent to dielectric layer 44. Furthermore, base 76 contacts adhesive 30 and dielectric layer 44, is spaced from ledge 18 and has a flat bottom surface that faces in the downward direction.

Heat spreader 78 is provided by bump 16, ledge 18 and base 76. Thus, heat spreader 78 includes metal plate 10, conductive layer 42 and plated layers 72 and 74. Furthermore, bump 16 is thermally connected to base 76.

Heat spreader 78 is essentially a heat slug with an I-like shape that includes a pedestal (bump 16), upper wings (ledge 18) and lower wings (base 76).

FIG. 6I is a cross-sectional view of the structure with solder mask 80 formed on ledge 18.

Solder mask 80 is an electrically insulative layer that is selectively patterned to provide window 82 that selectively exposes bump 16 and cavity 20 in the upward direction. Solder mask 80 contacts ledge 18, is spaced from bump 16 and adhesive 30 and is positioned so that bump 16 is aligned with and located below window 82. Solder mask 80 has a thickness of 25 microns and window 82 has a length and width of 1500 microns.

Solder mask 80 is initially a photoimageable liquid resin that is dispensed on the structure. Thereafter, solder mask 80 is patterned by selectively applying light through a reticle (not shown) so that the solder mask portions exposed to the light are rendered insoluble, applying a developer solution to remove the solder mask portions that are unexposed to the light and remain soluble and then hard baking, as is conventional.

FIG. 6J is a cross-sectional view of the structure with reflective coating 84 formed on bump 16 using solder mask 80 as a plating mask.

Reflective coating 84 is a thin spot plated metal coating that contacts the copper surfaces exposed by window 82. Thus, reflective coating 84 contacts bump 16 and ledge 18 and covers their exposed portions in the upward direction. For instance, a nickel layer is electrolessly plated on the exposed copper surfaces, and then a silver layer is electrolessly plated on the nickel layer. The buried nickel layer has a thickness of 3 microns, the silver surface layer has a thickness of 0.5 microns, and reflective coating 84 has a thickness of 3.5 microns.

Bump 16 treated with reflective coating 84 as a surface finish has several advantages. The buried nickel layer provides the primary mechanical and electrical and/or thermal connection, and the silver surface layer provides a highly reflective surface finish. Reflective coating 84 also protects bump 16 from corrosion. Reflective coating 84 can include a wide variety of metals to provide a highly reflective surface and accommodate the external connection media. For instance, a gold or silver surface layer can be plated on a buried nickel layer or a shiny nickel surface layer alone can be employed.

Bump 16 and ledge 18 treated with reflective coating 84 are shown as a single layer for convenience of illustration. The boundary (not shown) in bump 16 and ledge 18 with reflective coating 84 occurs at the copper/nickel interface.

FIG. 6K is a cross-sectional view of the structure with adhesive 34 mounted on ledge 18 after release liners 34A and 34B are removed. Release liner 34B is manually peeled-off the bottom surface of adhesive 34, then adhesive 34 is mounted on ledge 18 by lowering it onto solder mask 80 and then release liner 34A is manually peeled-off the top surface of adhesive 34. Adhesive 34 contacts solder mask 80, is spaced from ledge 18 and is positioned so that bump 16 is aligned with and located below opening 36. Furthermore, solder mask 80 contacts and is sandwiched between ledge 18 and adhesive 34 and ledge 18 contacts and is sandwiched between adhesive 30 and solder mask 80.

FIG. 6L is a cross-sectional view of the structure with substrate 50 mounted on ledge 18. Substrate 50 is mounted by lowering it onto adhesive 34. Substrate 50 contacts adhesive 34, is spaced from ledge 18 and solder mask 80 and is positioned so that bump 16 is aligned with and located below aperture 68. Solder mask 86 remains mounted on substrate 50. Furthermore, adhesive 34 contacts and is sandwiched between dielectric layer 54 and solder mask 80, dielectric layer 54 contacts and is sandwiched between adhesive 34 and conductive trace 56 and conductive trace 56 is spaced from adhesive 34.

FIG. 6M is a cross-sectional view of the structure with substrate 50 attached to ledge 18 by adhesive 34.

In this illustration, adhesive 34 is compressed by applying downward pressure to solder mask 86 and/or upward pressure to base 76, thereby moving base 76 and solder mask 86 towards one another and applying pressure to adhesive 34 while simultaneously applying heat to adhesive 34. As a result, adhesive 34 sandwiched between base 76 and solder mask 86 is compressed. Adhesive 34, which is a pressure-sensitive adhesive tape, exhibits no appreciable flow and essentially retains its original shape although opening 36 narrows slightly and becomes coextensive with aperture 68. Moreover, adhesive 34 remains sandwiched between and continues to fill the slightly reduced space between dielectric layer 54 and solder mask 80, and cavity 20, opening 36 and aperture 68 remain aligned with bump 16 and filled with air.

For instance, base 76 and solder mask 86 can be disposed between top and bottom platens (not shown) of a press. In addition, a top cull plate and top buffer paper (not shown) can be sandwiched between solder mask 86 and the top platen, and a bottom cull plate and bottom buffer paper (not shown) can be sandwiched between base 76 and the bottom platen. The stack includes the top platen, top cull plate, top buffer paper, solder mask 86, conductive trace 56, dielectric layer 54, adhesive 34, solder mask 80, ledge 18, adhesive 30, dielectric layer 44, base 76, bottom buffer paper, bottom cull plate and bottom platen in descending order. Furthermore, the stack may be positioned on the bottom platen by tooling pins (not shown) that extend upward from the bottom platen through registration holes (not shown) in base 76.

The platens are heated and move towards one another, thereby applying heat and pressure to adhesive 34. The cull plates disperse the heat from the platens so that it is more uniformly applied to base 76 and solder mask 86 and thus adhesive 34, and the buffer papers disperse the pressure from the platens so that it is more uniformly applied to base 76 and solder mask 86 and thus adhesive 34. As the platen motion and heat continue, adhesive 34 between base 76 and solder mask 86 is compressed.

The upward motion of base 76 relative to solder mask 86 is shown by the thin upward arrows, and the downward motion of solder mask 86 relative to base 76 is shown by the thin downward arrows.

The platen motion is eventually blocked by adhesive 34 becoming non-compliant and the platens become stationary. Thereafter, the platens move away from one another and the structure is released from the press.

Adhesive 34 as compressed provides a secure robust mechanical bond between dielectric layer 54 and solder mask 80, and thus between ledge 18 and conductive trace 56. Furthermore, adhesive 34 is rendered pressure-insensitive and securely fastened to dielectric layer 54 and solder mask 80 by the pressure. Adhesive 34 can withstand normal operating pressure without distortion or damage and is only temporarily distorted under unusually high pressure. Furthermore, adhesive 34 can absorb thermal expansion mismatch between substrate 50 and heat spreader 78.

At this stage, the manufacture of thermal board 90 can be considered complete.

FIGS. 6N, 6O and 6P are cross-sectional, top and bottom views, respectively, of thermal board 90 after it is detached at peripheral edges along cut lines from a support frame and/or adjacent thermal boards in a batch.

Thermal board 90 includes adhesives 30 and 34, substrates 40 and 50, heat spreader 78 and solder masks 80 and 86. Substrate 40 includes dielectric layer 44. Substrate 50 includes dielectric layer 54 and conductive trace 56. Conductive trace 56 includes pad 60, routing line 62 and terminal 64. Heat spreader 78 includes bump 16, ledge 18 and base 76.

Bump 16 is adjacent to ledge 18 at bent corner 22, is adjacent to base 76 at bent corner 24 and at floor 28, extends from base 76 in the upward direction, extends from ledge 18 in the downward direction and is integral with ledge 18. Bump 16 extends into and remains centrally located within opening 32 and aperture 46, extends above and below dielectric layer 44 and aperture 46, is coplanar with adhesive 30 at ledge 18 and at base 76 and is aligned with and spaced from opening 36 and aperture 68. Bump 16 continues to define cavity 20 and cover cavity 20 in the downward direction and have an irregular thickness characteristic of stamping. Bump 16 also contacts adhesive 30, is spaced from dielectric layer 44 and retains its cut-off conical shape in which its diameter increases as it extends upwardly from base 76 to ledge 18. Furthermore, bent corner 22 continues to bend laterally outward adjacent to ledge 18, bent corner 24 continues to bend laterally inward adjacent to base 76 and bent corners 22 and 24 remain vertically spaced from one another by sidewall 26.

Bump 16 has a silver surface finish at cavity 20 and conductive trace 56 has a gold surface finish at pad 60 and terminal 64. Thus, bump 16 and conductive trace 56 have different surface finishes.

Ledge 18 extends laterally from bump 16, contacts adhesive 30 and solder mask 80, is spaced from adhesive 34, dielectric layers 44 and 54, conductive trace 56, base 76 and solder mask 86 and is sandwiched between adhesives 30 and 34 and between dielectric layers 44 and 54. Ledge 18 is also thicker than base 76 and spaced from base 76 by bump 16.

Ledge 18 covers conductive layer 42 and dielectric layer 44 in the upward direction and adhesive 34, dielectric layer 54, conductive trace 56 and solder masks 80 and 86 in the downward direction. Moreover, bump 16 and ledge 18 in combination cover adhesive 30 and base 76 in the upward direction. Thus, bump 16 and ledge 18 in combination extend laterally throughout thermal board 90.

Cavity 20 faces in the upward direction, extends into and remains centrally located within bump 16, opening 32 and aperture 46, extends above and below dielectric layer 44 and aperture 46, is covered by bump 16 in the downward direction and is aligned with and spaced from opening 36 and aperture 68. Cavity 20 conforms to the shape of bump 16, extends across most of bump 16 in the vertical and lateral directions and retains its cut-off conical shape in which its diameter increases as it extends upwardly from its floor to its entrance.

Base 76 extends laterally from bump 16, contacts adhesive 30 and dielectric layer 44 and is spaced from adhesive 34, dielectric layer 54, conductive trace 56 and solder masks 80 and 86. Base 76 also covers bump 16, ledge 18, adhesives 30 and 34, dielectric layers 44 and 54, conductive trace 56 and solder masks 80 and 86 in the downward direction. Thus, base 76 extends laterally throughout thermal board 90.

Base 76 has a first thickness where it is adjacent to bump 16, a second thickness where it is adjacent to aperture 68 that is larger than the first thickness and a flat surface that faces in the downward direction. Base 76 also has the first thickness where it is adjacent to adhesive 30 between bump 16 and dielectric layer 44 and the second thickness where it is adjacent to dielectric layer 44. Base 76 also has a flat surface that faces in the downward direction.

Adhesive 30 is mounted on base 76 and contacts and is sandwiched between and fills the space between between bump 16 and dielectric layer 44 and between ledge 18 and dielectric layer 44 and is spaced from adhesive 34, dielectric layer 54, conductive trace 56 and solder masks 80 and 86. Adhesive 30 extends across dielectric layer 44 in gap 70, extends through aperture 46 and extends above and below dielectric layer 44 and aperture 46. Adhesive 30 also extends laterally from bump 16 beyond conductive trace 56 to peripheral edges of the assembly and is solidified.

Adhesive 30 covers and surrounds sidewall 26 of bump 16 in the lateral directions, covers base 76 outside the periphery of bump 16 in the upward direction, covers dielectric layer 44 in the upward direction and covers ledge 18, adhesive 34, dielectric layer 54, conductive trace 56 and solder masks 80 and 86 in the downward direction. Adhesive 30 also conformally coats sidewall 26 of bump 16, a bottom surface of ledge 18 and a top surface of dielectric layer 44.

Adhesive 30 alone can intersect an imaginary horizontal line between bump 16 and dielectric layer 44, an imaginary horizontal line between bump 16 and base 76, an imaginary vertical line between bump 16 and base 76, an imaginary vertical line between ledge 18 and dielectric layer 44 and an imaginary vertical line between ledge 18 and base 76. However, adhesive 30 alone cannot intersect an imaginary line between bump 16 and conductive trace 56.

Adhesive 34 is mounted on ledge 18, contacts and is sandwiched between dielectric layer 54 and solder mask 80 and is spaced from bump 16, ledge 18, adhesive 30, dielectric layer 44, conductive trace 56, base 76 and solder mask 86. Likewise adhesive 34 extends above bump 16, ledge 18, adhesive 30, dielectric layer 44, base 76 and solder mask 80 and extends below dielectric layer 54, conductive trace 56 and solder mask 86.

Dielectric layer 44 contacts and is sandwiched between adhesive 30 and base 76 and is spaced from bump 16, ledge 18, adhesive 34, dielectric layer 54, conductive trace 56 and solder masks 80 and 86.

Dielectric layer 54 contacts and is sandwiched between adhesive 34 and conductive trace 56, contacts solder mask 86 and is spaced from bump 16, ledge 18, adhesive 30, dielectric layer 44, base 76 and solder mask 80.

Ledge 18, adhesives 30 and 34, dielectric layers 44 and 54, base 76 and solder masks 80 and 86 extend to straight vertical peripheral edges of thermal board 90 after it is detached or singulated from a batch of identical simultaneously manufactured thermal boards.

Pad 60 is customized as an electrical interface for a semiconductor device such as an LED chip that is subsequently mounted on bump 16, terminal 64 is customized as an electrical interface for the next level assembly such as a solderable wire from a printed circuit board, bump 16 is customized as a thermal interface for the semiconductor device and base 76 is customized as a thermal interface for the next level assembly such as the printed circuit board or a heat sink for an electronic device. Moreover, bump 16 can provide a recessed die paddle and a reflector for the semiconductor device, which is particularly useful if an LED chip is subsequently mounted on bump 16, and ledge 18 and base 76 in combination can provide a ground plane and an electromagnetic interference shield for the semiconductor device.

Conductive trace 56 is located outside holes 32 and 36, apertures 46 and 68 and window 82, outside the peripheries of holes 32 and 36, apertures 46 and 68 and window 82 and above bump 16, ledge 18, adhesives 30 and 34, dielectric layers 44 and 54, base 76 and solder mask 80. Furthermore, pad 60 and terminal 64 have the same thickness and are coplanar with one another at a surface that faces in the upward direction.

Conductive trace 56 provides horizontal (fan-out) routing from pad 60 to terminal 64. In particular, pad 60 and terminal 64 are horizontally offset from one another at the top surface of thermal board 90, thereby providing horizontal signal routing between the semiconductor device and the next level assembly.

Conductive trace 56 is not limited to this configuration. For instance, the electrically conductive path can include vias that extend through dielectric layer 54 and routing lines 62 (above and/or below dielectric layer 54) as well as passive components such as resistors and capacitors mounted on additional pads.

Conductive trace 56 is shown in cross-section as a continuous circuit trace for convenience of illustration. However, conductive trace 56 can provide horizontal signal routing in both the X and Y directions. That is, pad 60 and terminal 64 can be laterally offset from one another in the X and Y directions.

Conductive trace 56 and heat spreader 78 remain spaced from one another. As a result, conductive trace 56 and heat spreader 78 are mechanically attached and electrically isolated from one another.

Heat spreader 78 provides heat spreading and heat dissipation from a semiconductor device that is subsequently mounted on bump 16 to the next level assembly that thermal board 90 is subsequently mounted on. The semiconductor device generates heat that flows into bump 16 and through bump 16 into base 76 where it is spread out and dissipated in the downward direction, for instance to an underlying heat sink.

Conductive trace 56 includes a copper core shared by pad 60, routing line 62 and terminal 64 and heat spreader 78 includes a copper core shared by bump 16, ledge 18 and base 76. Furthermore, pad 60 and terminal 64 include a plated contact 66 on the copper core and bump 16 includes a reflective coating 84 on the copper core. As a result, conductive trace 56 and heat spreader 78 consist of a copper core and a thin plated surface finish and are primarily copper at the copper core.

Thermal board 90 can include multiple conductive traces 56 with a pad 60, routing line 62 and terminal 64. A single conductive trace 56 is described and labeled for convenience of illustration. In conductive traces 56, pads 60 and terminals 64 generally have similar shapes and sizes whereas routing lines 62 may (but need not) have different routing configurations. For instance, some conductive traces 56 may be spaced and separated and electrically isolated from one another whereas other conductive traces 56 can intersect or route to the same pad 60, routing line 62 or terminal 64 and be electrically connected to one another. Likewise, some pads 60 may receive independent signals whereas other pads 60 share a common signal, power or ground Thermal board 90 can be adapted for an LED package with blue, green and red LED chips, with each LED chip including an anode and a cathode and each LED package including a corresponding anode terminal and cathode terminal. In this instance, thermal board 90 can include six pads 60 and four terminals 64 so that each anode is routed from a separate pad 60 to a separate terminal 64 whereas each cathode is routed from a separate pad 60 to a common ground terminal 64.

A brief cleaning step can be applied to the structure at various manufacturing stages to remove oxides and debris that may be present on the exposed metal. For instance, a brief oxygen plasma cleaning step can be applied to the structure. Alternatively, a brief wet chemical cleaning step using a solution containing potassium permanganate can be applied to the structure. Likewise, the structure can be rinsed in distilled water to remove contaminants. The cleaning step cleans the desired surfaces without appreciably affecting or damaging the structure.

Advantageously, there is no plating bus or related circuitry that need be disconnected or severed from conductive traces 56 after they are formed. A plating bus can be disconnected during the wet chemical etch that forms pad 60, routing line 62 and terminal 64.

Thermal board 90 can include registration holes (not shown) that are drilled or sliced through the structure so that thermal board 90 can be positioned by inserting tooling pins through the registration holes when it is subsequently mounted on an underlying carrier.

Thermal board 90 can accommodate multiple semiconductor devices rather than one with a single bump or multiple bumps. Thus, multiple semiconductor devices can be mounted on a single bump or separate semiconductor devices can be mounted on separate bumps.

Thermal board 90 with a single bump for multiple semiconductor devices can be accomplished by adjusting substrate 50 to have additional conductive traces 56 which include a pad 60, routing line 62 and/or terminal 64. The pads 60 and terminals 64 can be laterally repositioned to provide a 2×2 array for four semiconductor devices. In addition, the topography (lateral shape) can be adjusted for conductive traces 56.

Thermal board 90 with multiple bumps for multiple semiconductor devices can be accomplished by stamping metal plate 10 to include additional bumps 16, adjusting adhesive 30 to include additional openings 32, adjusting adhesive 34 to include additional openings 36, adjusting substrate 40 to include additional apertures 46, adjusting substrate 50 to include additional conductive traces 56 and apertures 68 and adjusting solder masks 80 and 86 to include additional windows. The bumps 16 and conductive traces 56 can be laterally repositioned to provide a 2×2 array for four semiconductor devices. In addition, the topography (lateral shape) can be adjusted for bumps 16 and conductive traces 56. Furthermore, bumps 16 can have separate bases 76 or share a single base 76.

Figure 7A:
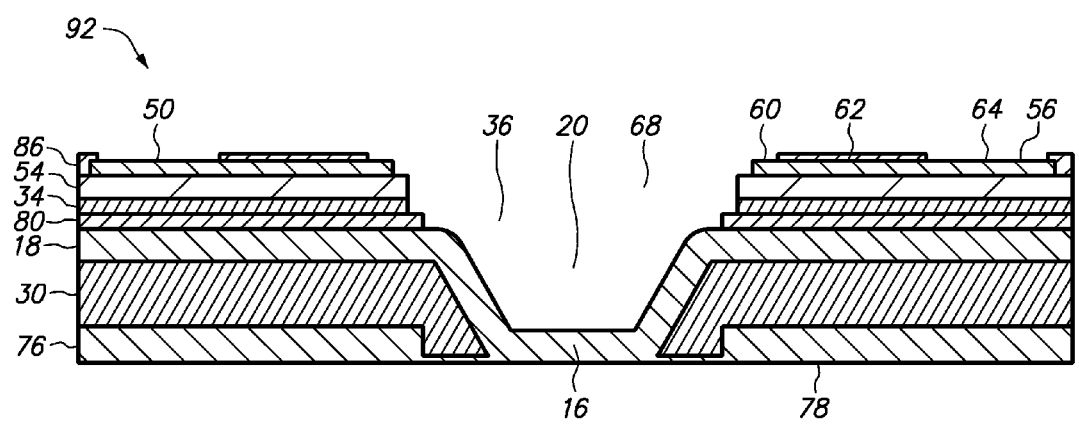
Figure 7B:
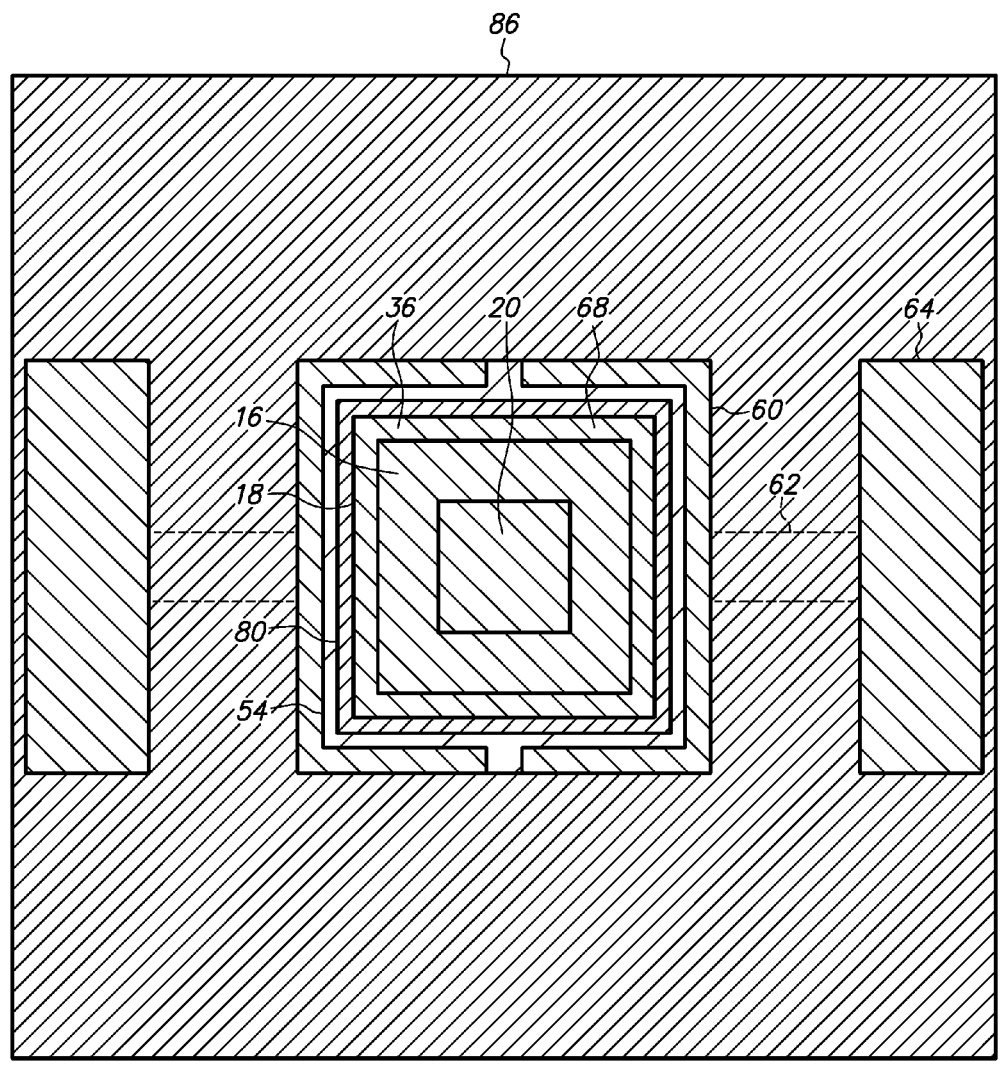
Figure 7C:
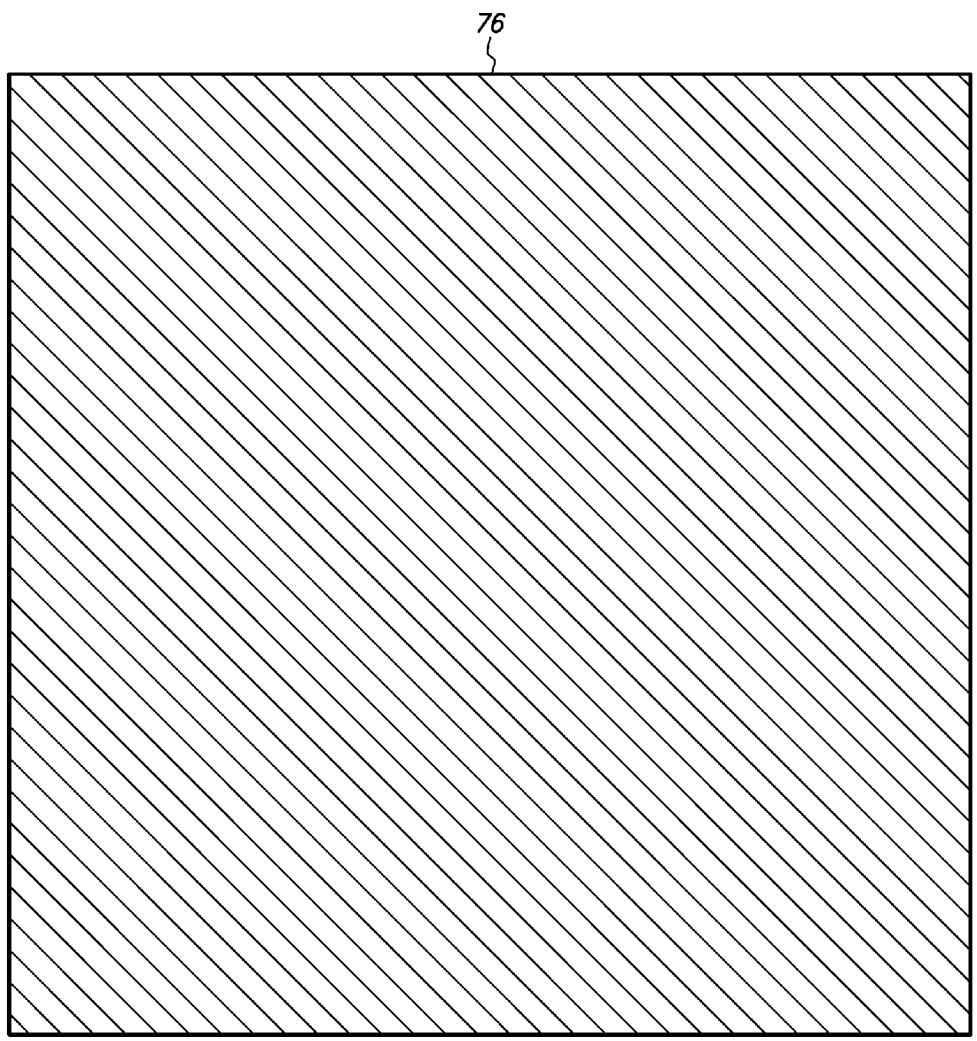

FIGS. 7A, 7B and 7C are cross-sectional, top and bottom views, respectively, of a thermal board with a thick base in accordance with an embodiment of the present invention.

In this embodiment, the first substrate is a provided by the first conductive layer alone and the first dielectric layer is omitted. For purposes of brevity, any description of thermal board 90 is incorporated herein insofar as the same is applicable, and the same description need not be repeated. Likewise, elements of the thermal board similar to those in thermal board 90 have corresponding reference numerals.

Thermal board 92 includes adhesives 30 and 34, substrate 50, heat spreader 78 and solder masks 80 and 86. Substrate 50 includes dielectric layer 54 and conductive trace 56. Conductive trace 56 includes pad 60, routing line 62 and terminal 64. Heat spreader 78 includes bump 16, ledge 18 and base 76.

Conductive layer 42 is thicker in this embodiment than the previous embodiment. For instance, conductive layer 42 has a thickness of 130 microns (rather than 30 microns) so that it can be handled without warping or wobbling. Base 76 is therefore thicker, and thermal board 92 is devoid of a dielectric layer corresponding to first dielectric layer 44.

Adhesive 30 contacts and is sandwiched between ledge 18 and base 76. Furthermore, adhesive 30 is thicker to accommodate the absence of dielectric layer 44.

Thermal board 92 can be manufactured in a manner similar to thermal board 90 with suitable adjustments for conductive layer 42. For instance, metal plate 10 is stamped to form bump 16, ledge 18 and cavity 20, adhesive 30 is mounted on ledge 18, conductive layer 42 alone is mounted on adhesive 30, heat and pressure are applied to flow and solidify adhesive 30, grinding is applied to planarize bump 16, adhesive 30 and conductive layer 42 and then plated layers 72 and 74 are deposited on the structure as previously described. Thereafter, solder mask 80 is formed on ledge 18, reflective coating 84 is deposited on bump 16, adhesive 34 is mounted on solder mask 80, substrate 50 and solder mask 86 are mounted on adhesive 34 and then pressure is applied to compress adhesive 34. Thereafter, ledge 18, adhesives 30 and 34, dielectric layer 54, base 76 and solder masks 80 and 86 are cut or cracked at the peripheral edges of thermal board 92 to detach it from the batch.

Figure 8A:
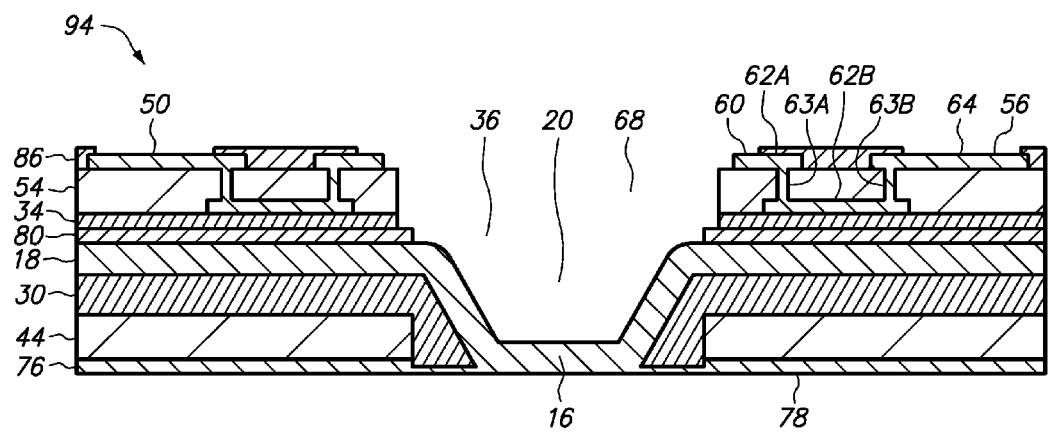
FIGS. 8A, 8B and 8C are cross-sectional, top and bottom views, respectively, of a thermal board with multi-level signal routing in accordance with an embodiment of the present invention.
Figure 8B:
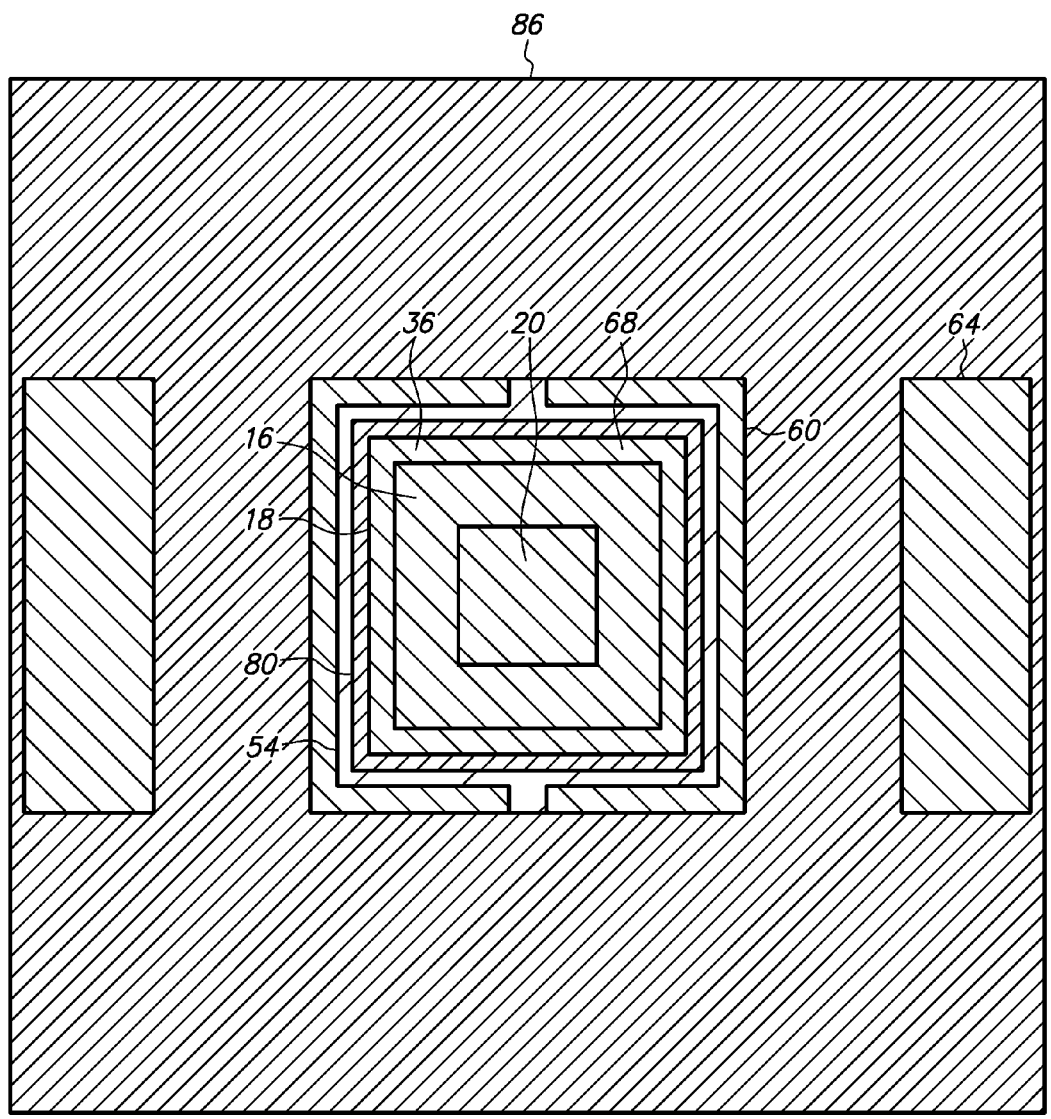
Figure 8C:
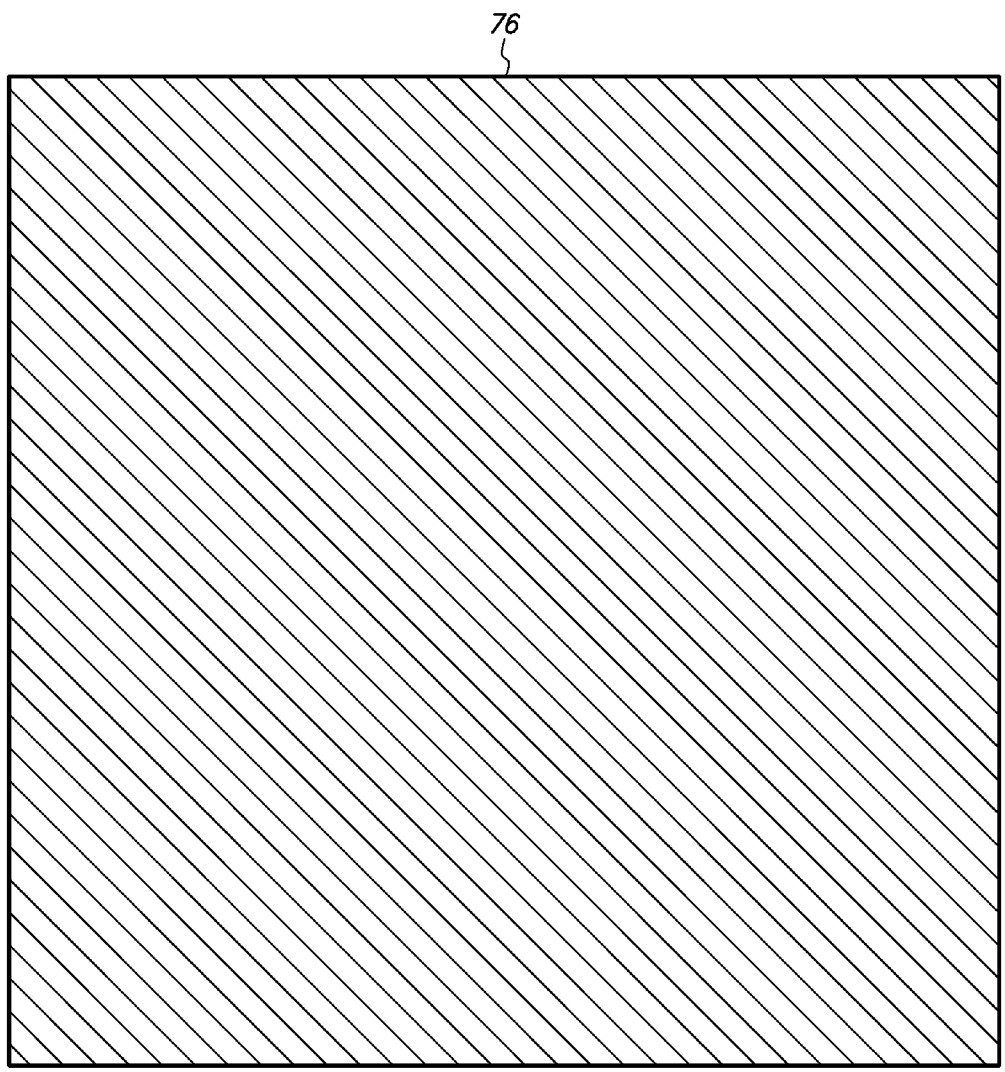

FIGS. 8A, 8B and 8C are cross-sectional, top and bottom views, respectively, of a thermal board with multi-level signal routing in accordance with an embodiment of the present invention.

In this embodiment, the conductive trace includes multi-level routing lines between the pad and the terminal. For purposes of brevity, any description of thermal board 90 is incorporated herein insofar as the same is applicable, and the same description need not be repeated. Likewise, elements of the thermal board similar to those in thermal board 90 have corresponding reference numerals.

Thermal board 94 includes adhesives 30 and 34, substrates 40 and 50, heat spreader 78 and solder masks 80 and 86. Substrate 40 includes dielectric layer 44. Substrate 50 includes dielectric layer 54 and conductive trace 56. Conductive trace 56 includes pad 60, routing lines 62A and 62B, vias 63A and 63B and terminal 64. Heat spreader 78 includes bump 16, ledge 18 and base 76.

Dielectric layer 54 is thicker in this embodiment than the previous embodiment. For instance, dielectric layer 54 has a thickness of 150 microns (rather than 50 microns) so that it can accommodate embedded routing lines.

Routing line 62A contacts and extends above dielectric layer 54, routing line 62B contacts and is embedded in dielectric layer 54 and vias 63A and 63B contact and extend into dielectric layer 54. Furthermore, routing lines 62A and 62B and vias 63A and 63B provide an electrically conductive path between pad 60 and terminal 64. The electrically conductive path in sequence is routing line 62A, via 63A, routing line 62B and via 63B.

Thermal board 94 can be manufactured in a manner similar to thermal board 90 with suitable adjustments for substrate 50. For instance, metal plate 10 is stamped to form bump 16, ledge 18 and cavity 20, adhesive 30 is mounted on ledge 18, substrate 40 is mounted on adhesive 30, heat and pressure are applied to flow and solidify adhesive 30, grinding is applied to planarize bump 16, adhesive 30 and conductive layer 42 and then plated layers 72 and 74 are deposited on the structure as previously described. Thereafter, solder mask 80 is formed on ledge 18, reflective coating 84 is deposited on bump 16, adhesive 34 is mounted on solder mask 80, substrate 50 (with pad 60, routing lines 62A and 62B, vias 63A and 63B and terminal 64) and solder mask 86 are mounted on adhesive 34 and then heat and pressure are applied to compress adhesive 34. Thereafter, ledge 18, adhesives 30 and 34, dielectric layers 44 and 54, base 76 and solder masks 80 and 86 are cut or cracked at the peripheral edges of thermal board 94 to detach it from the batch.

Figure 9A:
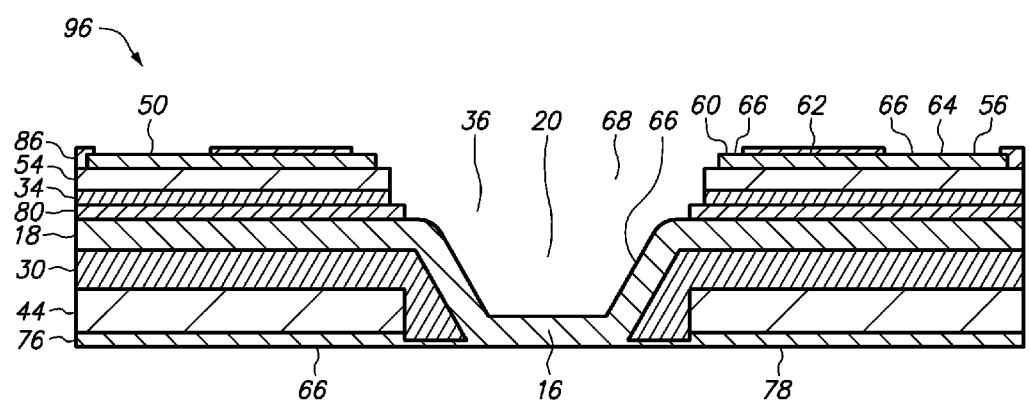
FIGS. 9A, 9B and 9C are cross-sectional, top and bottom views, respectively, of a thermal board with plated contacts at the bump, the base, the pad and the terminal in accordance with an embodiment of the present invention.
Figure 9B:
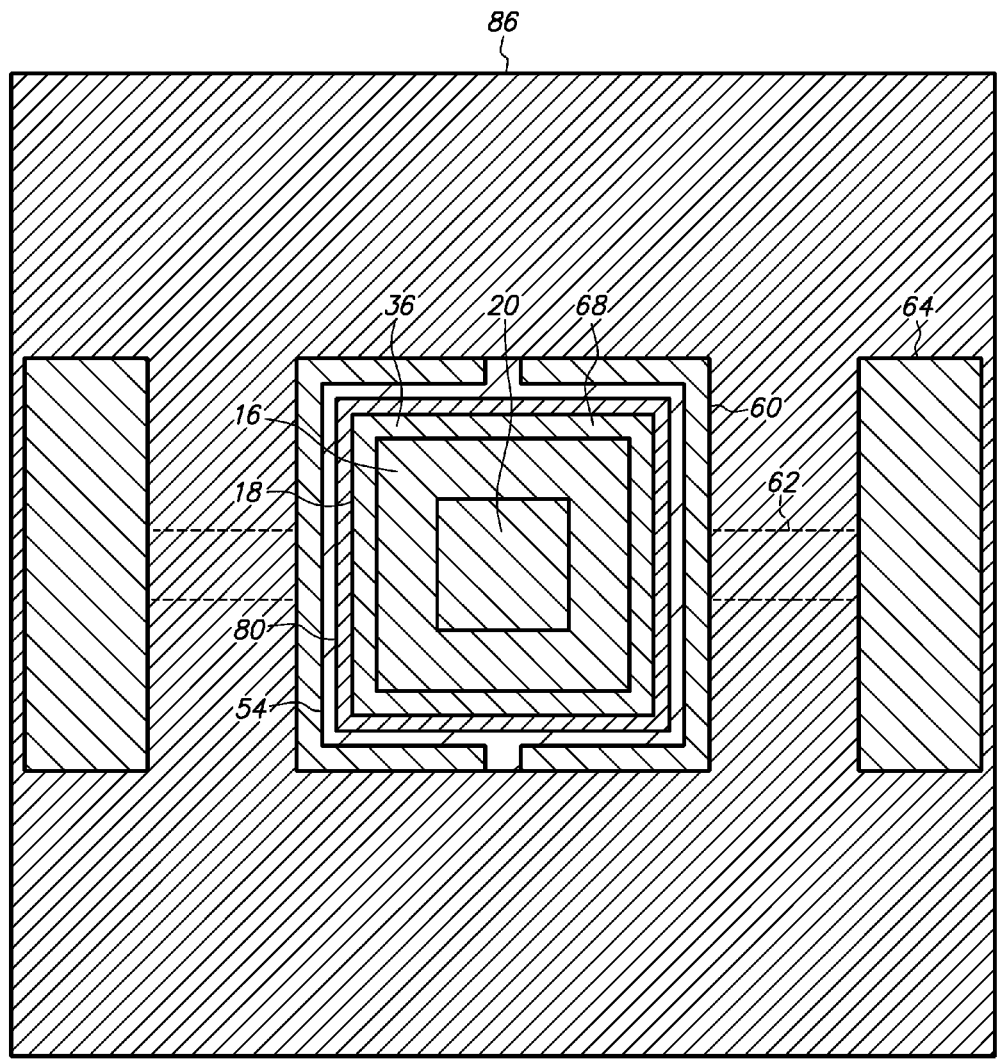
Figure 9C:
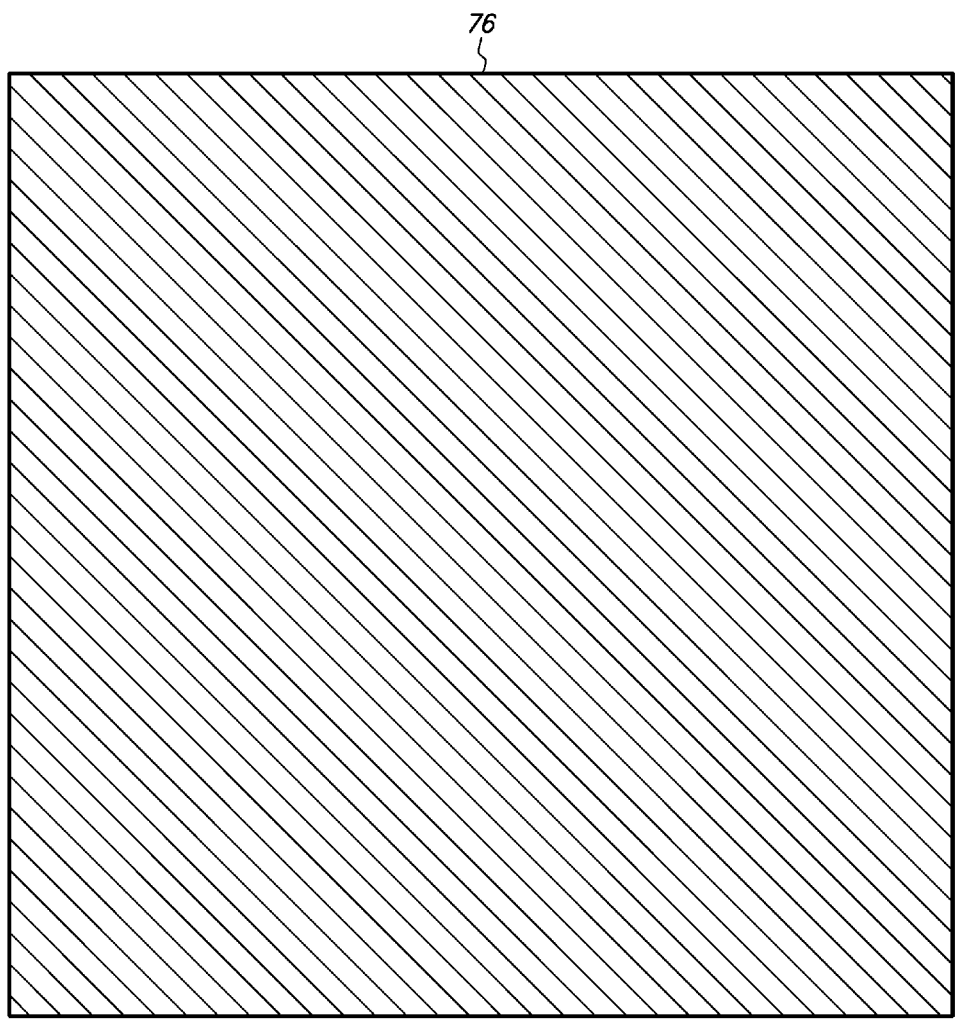

FIGS. 9A, 9B and 9C are cross-sectional, top and bottom views, respectively, of a thermal board with plated contacts at the pad, the terminal, the bump and the base in accordance with an embodiment of the present invention.

In this embodiment, the plated contacts are formed on the pad, the terminal, the bump and the base at the same time. For purposes of brevity, any description of thermal board 90 is incorporated herein insofar as the same is applicable, and the same description need not be repeated. Likewise, elements of the thermal board similar to those in thermal board 90 have corresponding reference numerals.

Thermal board 96 includes adhesives 30 and 34, substrates 40 and 50, heat spreader 78 and solder masks 80 and 86. Substrate 40 includes dielectric layer 44. Substrate 50 includes dielectric layer 54 and conductive trace 56. Conductive trace 56 includes pad 60, routing line 62 and terminal 64. Heat spreader 78 includes bump 16, ledge 18 and base 76.

Plated contacts 66 (not shown) are formed on bump 16, pad 60, terminal 64 and base 76 at the same time using solder masks 80 and 86 as plating masks. As a result, conductive trace 56 and heat spreader 78 have the same surface finish. Reflective coating 84 is omitted, however a plated contact 66 at bump 16 provides a reflective surface finish at bump 16.

Thermal board 96 can be manufactured in a manner similar to thermal board 90 with suitable adjustments for plated contacts 66 and reflective coating 84. For instance, metal plate 10 is stamped to form bump 16, ledge 18 and cavity 20, adhesive 30 is mounted on ledge 18, substrate 40 is mounted on adhesive 30, heat and pressure are applied to flow and solidify adhesive 30, grinding is applied to planarize bump 16, adhesive 30 and conductive layer 42 and then plated layers 72 and 74 are deposited on the structure as previously described. Thereafter, solder mask 80 is formed on ledge 18, adhesive 34 is mounted on solder mask 80, substrate 50 (without plated contacts 66) and solder mask 86 are mounted on adhesive 34 and then pressure is applied to compress adhesive 34.

Thereafter, plated contacts 66 are deposited on bump 16 using solder mask 80 as a plating mask, on pad 60 and terminal 64 using solder mask 86 as a plating mask and on base 76 without a plating mask. Plated contacts 66 are thin spot plated metal coatings that contact the exposed copper surfaces. Thus, plated contacts 66 contact bump 16, pad 60 and terminal 64 and cover their exposed portions in the upward direction and contact base 76 and cover it in the downward direction. For instance, a nickel layer is electrolessly plated on the exposed copper surfaces, and then a silver layer is electrolessly plated on the nickel layer. The buried nickel layer has a thickness of 3 microns, the silver surface layer has a thickness of 0.5 microns, and plated contacts 66 have a thickness of 3.5 microns.

Thereafter, ledge 18, adhesives 30 and 34, dielectric layers 44 and 54, base 76 and solder masks 80 and 86 are cut or cracked at the peripheral edges of thermal board 96 to detach it from the batch.

Figure 10A:
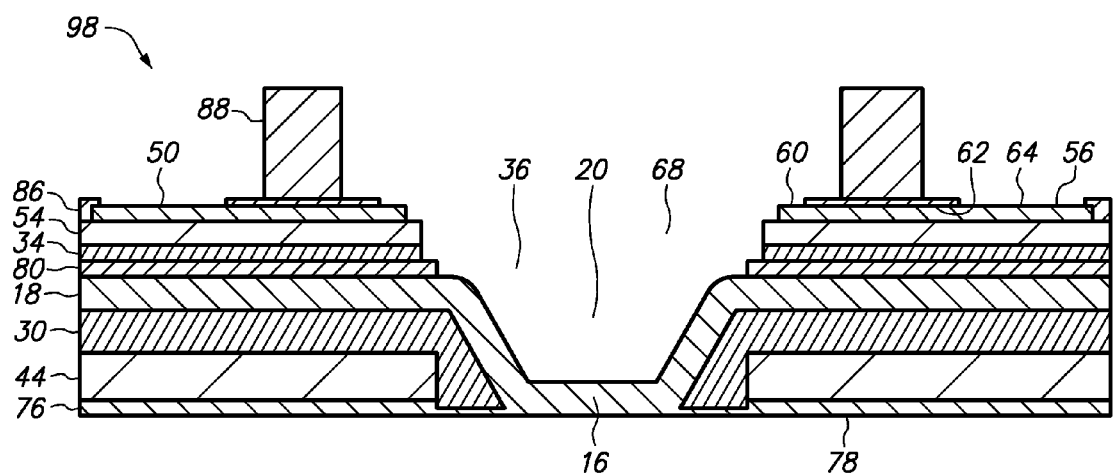
FIGS. 10A, 10B and 10C are cross-sectional, top and bottom views, respectively, of a thermal board with a rim in accordance with an embodiment of the present invention.
Figure 10B:
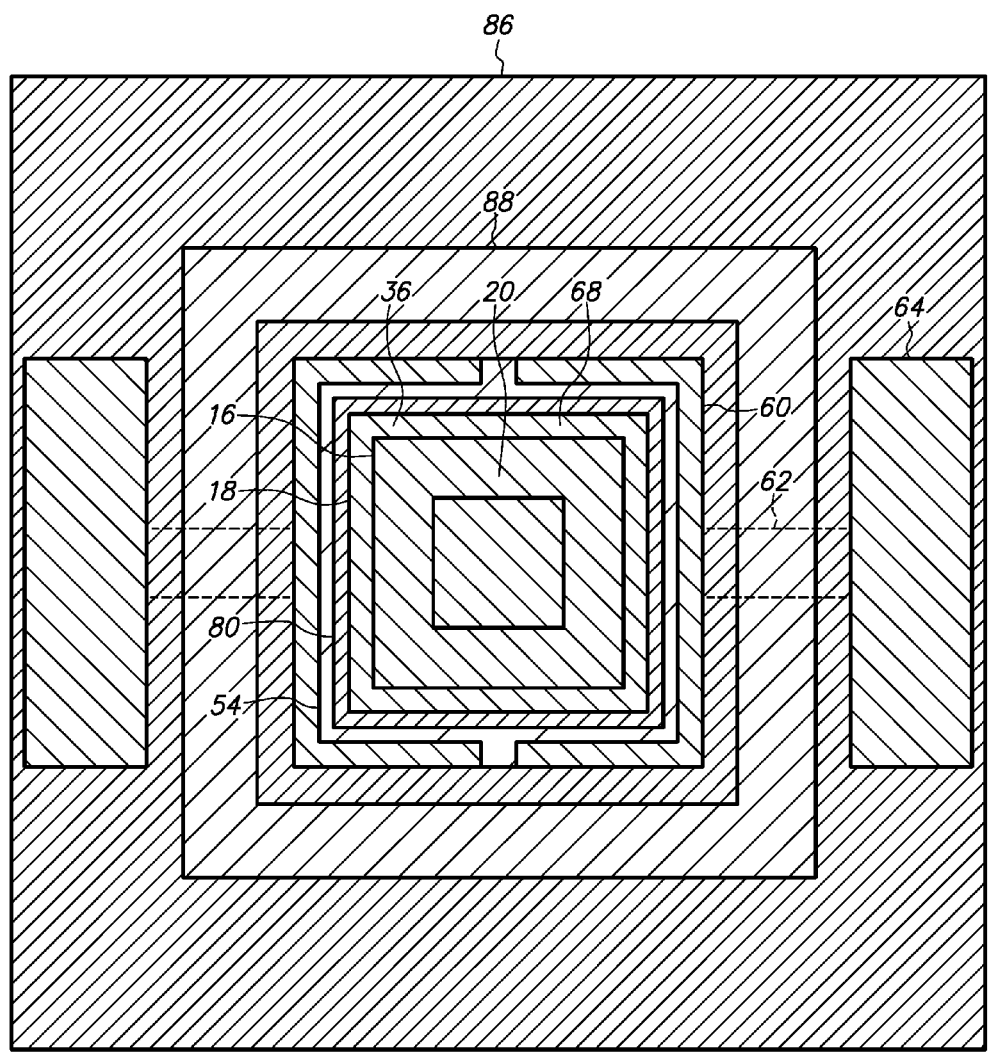
Figure 10C:
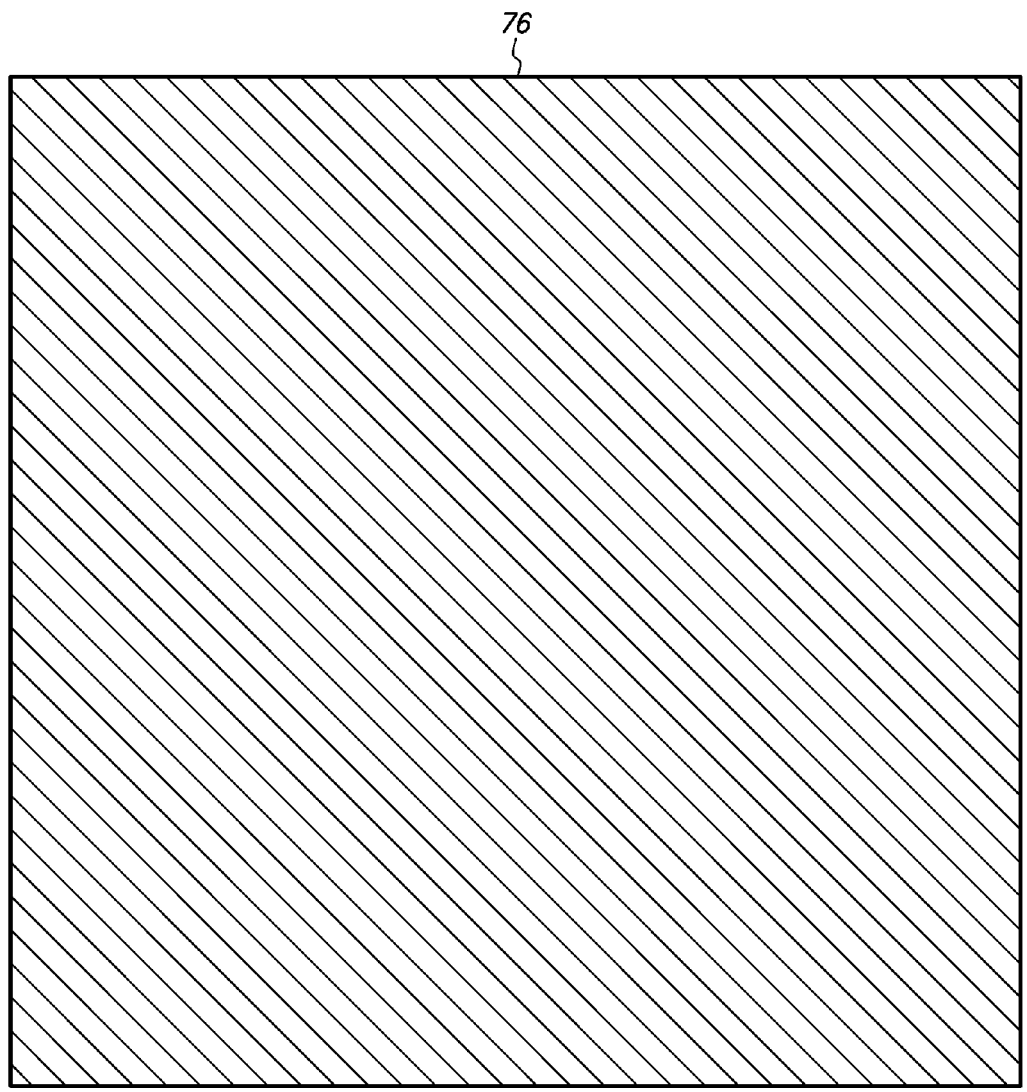

FIGS. 10A, 10B and 10C are cross-sectional, top and bottom views, respectively, of a thermal board with a rim in accordance with an embodiment of the present invention.

In this embodiment, a rim is mounted on the second substrate. For purposes of brevity, any description of thermal board 90 is incorporated herein insofar as the same is applicable, and the same description need not be repeated. Likewise, elements of the thermal board similar to those in thermal board 90 have corresponding reference numerals.

Thermal board 98 includes adhesives 30 and 34, substrates 40 and 50, heat spreader 78, solder masks 80 and 86 and rim 88. Substrate 40 includes dielectric layer 44. Substrate 50 includes dielectric layer 54 and conductive trace 56. Conductive trace 56 includes pad 60, routing line 62 and terminal 64. Heat spreader 78 includes bump 16, ledge 18 and base 76.

Rim 88 is a square shaped frame that contacts and extends above solder mask 86 and is spaced from and does not overlap pad 60 and terminal 64. Bump 16, opening 36 and aperture 68 are centrally located within the periphery of rim 88 and terminal 64 is located outside the periphery of rim 88. For instance, rim 88 has a height of 600 microns, a width (between its inner and outer sidewalls) of 500 microns and is laterally spaced from pad 60 by 200 microns.

Rim 88 includes a solder mask, a laminate and an adhesive film shown as a single layer for convenience of illustration. The solder mask contacts and extends above the laminate and provides the top surface, the adhesive film contacts and extends below the laminate and provides the bottom surface, and the laminate contacts and is sandwiched between and laminated to the solder mask and adhesive film. The solder mask, laminate and adhesive film are electrical insulators. For instance, the solder mask has a thickness of 50 microns, the laminate has a thickness of 500 microns, and the adhesive film has thickness of 50 microns. Thus, rim 88 has a height of 600 microns (50+500+50).

The laminate can be various dielectric films formed from numerous organic and inorganic electrical insulators. For instance, the laminate can be polyimide or FR-4 epoxy although other epoxies such as polyfunctional and bismaleimide triazine (BT) are suitable. Alternatively, rim 88 can include a metal ring on the adhesive film.

Thermal board 98 can be manufactured in a manner similar to thermal board 90 with suitable adjustments for rim 88. For instance, metal plate 10 is stamped to form bump 16, ledge 18 and cavity 20, adhesive 30 is mounted on ledge 18, substrate 40 is mounted on adhesive 30, heat and pressure are applied to flow and solidify adhesive 30, grinding is applied to planarize bump 16, adhesive 30 and conductive layer 42 and then plated layers 72 and 74 are deposited on the structure as previously described. Thereafter, solder mask 80 is formed on ledge 18, reflective coating 84 is deposited on bump 16, adhesive 34 is mounted on solder mask 80, substrate 50 and solder mask 86 are mounted on adhesive 34 and then pressure is applied to compress adhesive 34. Thereafter, rim 88 is mounted on solder mask 86 and then ledge 18, adhesives 30 and 34, dielectric layers 44 and 54, base 76 and solder masks 80 and 86 are cut or cracked at the peripheral edges of thermal board 98 to detach it from the batch.

Figure 11A:
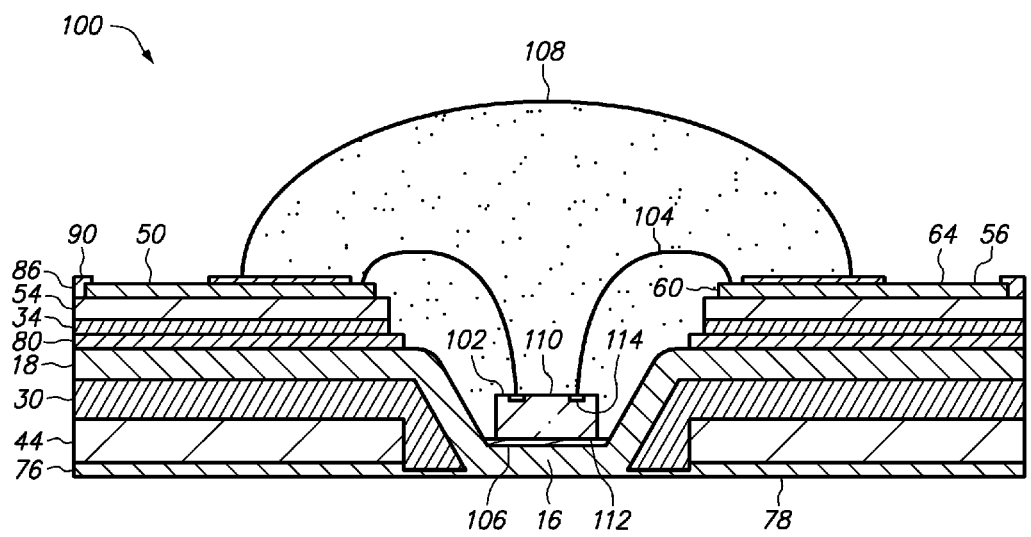
FIGS. 11A, 11B and 11C are cross-sectional, top and bottom views, respectively, of a semiconductor chip assembly that includes a thermal board, a semiconductor device and an encapsulant in accordance with an embodiment of the present invention.
Figure 11B:
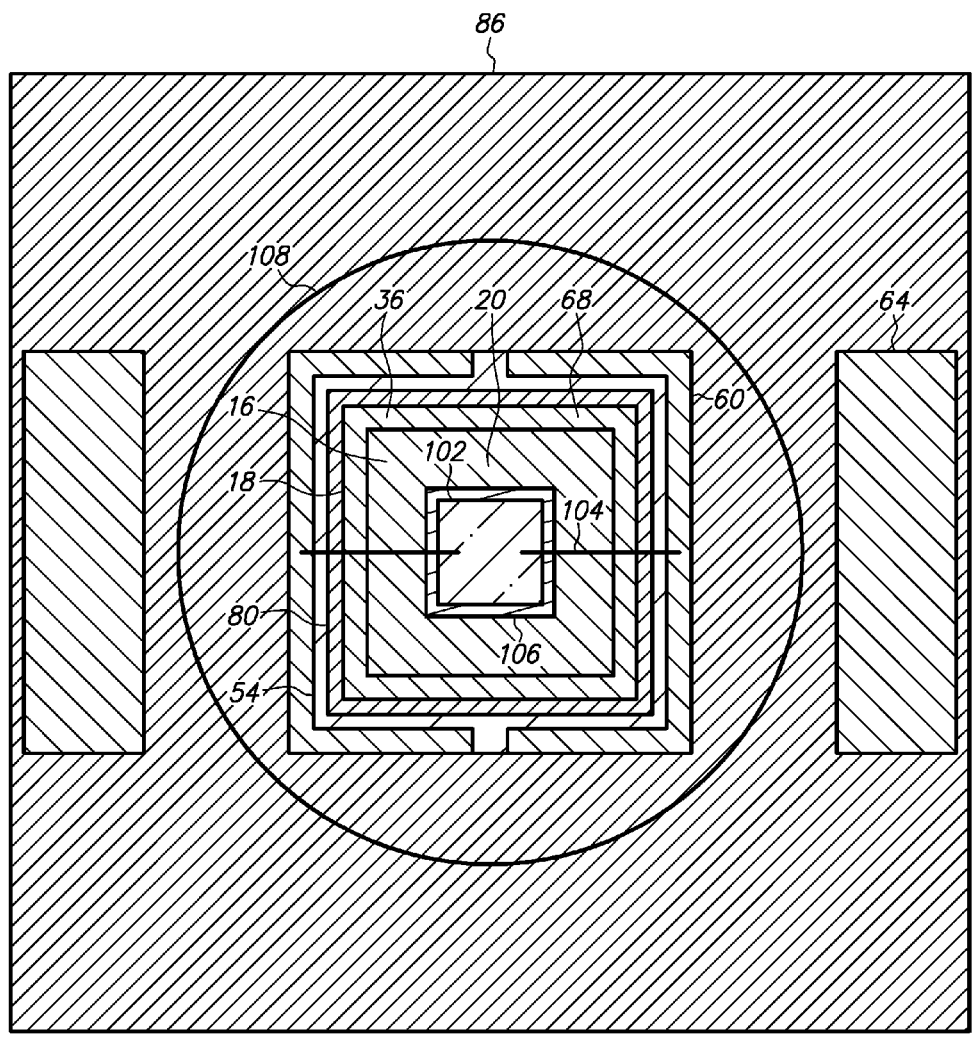
Figure 11C:
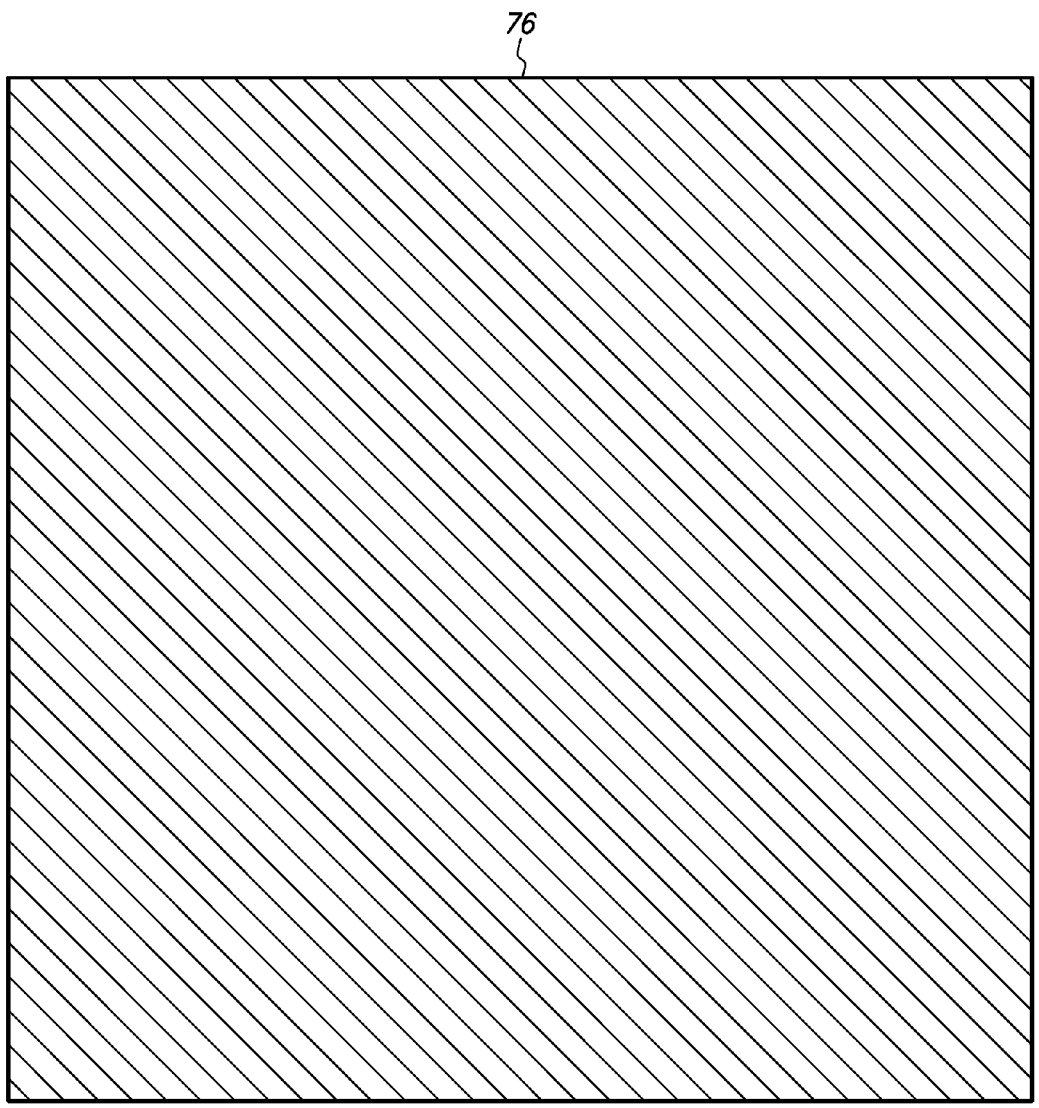

FIGS. 11A, 11B and 11C are cross-sectional, top and bottom views, respectively, of a semiconductor chip assembly that includes a thermal board, a semiconductor device and an encapsulant in accordance with an embodiment of the present invention.

In this embodiment, the semiconductor device is an LED chip that emits blue light, is mounted on the bump, is electrically connected to the pad using a wire bond and is thermally connected to the bump using a die attach. The LED chip is covered by a color-shifting encapsulant that converts the blue light to white light.

Semiconductor chip assembly 100 includes thermal board 90, LED chip 102, wire bond 104, die attach 106 and encapsulant 108. LED chip 102 includes top surface 110, bottom surface 112 and bond pad 114. Top surface 110 is the active surface and includes bond pad 114 and bottom surface 112 is the thermal contact surface.

LED chip 102 is mounted on heat spreader 78, electrically connected to conductive trace 56 and thermally connected to heat spreader 78. In particular, LED chip 102 is mounted on bump 16, overlaps bump 16 but not substrate 40, is laterally surrounded by bump 16 and adhesive 30, is electrically connected to pad 60 by wire bond 104 and is thermally connected to and mechanically attached to bump 16 by die attach 106. Furthermore, bump 16 covers LED chip 102 in the downward direction and provides a recessed die paddle as well as a reflector for LED chip 102.

LED chip 102 has a thickness of 150 microns and die attach 106 has a thickness of 25 microns. As a result, the combined height of LED chip 102 and the underlying die attach 106 is less than the depth of cavity 20. LED chip 102 has a length and width of 800 microns.

LED chip 102 and die attach 106 are located within cavity 20, wire bond 104 and encapsulant 108 extend within and outside cavity 20, and adhesives 30 and 40, substrates 40 and 50, conductive trace 56 and solder masks 80 and 86 are located outside cavity 20. Wire bond 104 is bonded to and electrically connects pads 60 and 114, thereby electrically connecting LED chip 102 to terminal 64. Die attach 106 contacts and is sandwiched between and thermally connects and mechanically attaches bump 16 and thermal contact surface 112, thereby thermally connecting LED chip 102 to base 76.

Encapsulant 108 is a solid adherent electrically insulative color-shifting protective enclosure that provides environmental protection such as moisture resistance and particle protection for LED chip 102 and wire bond 104. Encapsulant 108 contacts bump 16, LED chip 102, wire bond 104 and die attach 106 in cavity 20, contacts ledge 18, adhesive 34, dielectric layer 54, pad 60, solder masks 80 and 86 and wire bond 104 outside cavity 20, is spaced from adhesive 30, dielectric layer 44, routing line 62, terminal 64 and base 76, fills the remaining space in cavity 20, seals LED chip 102 within cavity 20 and covers bump 16, LED chip 102, wire bond 104 and die attach 106 in the upward direction.

Pad 60 is spot plated with nickel/gold to bond well with wire bond 104, thereby improving signal transfer from conductive trace 56 to LED chip 102, and bump 16 is spot plated with nickel/silver to bond well with die attach 106, thereby improving mechanical attachment and heat transfer from LED chip 102 to heat spreader 78, and to provide a highly reflective surface which reflects the light emitted towards the silver surface layer by LED chip 102, thereby increasing light output in the upward direction.

LED chip 102 includes a compound semiconductor that emits blue light, has high luminous efficiency and forms a p-n junction. Suitable compound semiconductors include gallium-nitride, gallium-arsenide, gallium-phosphide, gallium-arsenic-phosphide, gallium-aluminum-phosphide, gallium-aluminum-arsenide, indium-phosphide and indium-gallium-phosphide. LED chip 102 also has high light output and generates considerable heat.

Encapsulant 108 includes transparent silicone and yellow phosphor (shown as dots in FIG. 11A). For instance, the silicone can be polysiloxane resin and the yellow phosphor can be cerium-doped yttrium-aluminum-garnet (Ce:YAG) fluorescent powder. The yellow phosphor emits yellow light in response to blue light, and the blue and yellow light mix to produce white light. As a result, encapsulant 108 converts the blue light emitted by LED chip 102 into white light and assembly 100 is a white light source. In addition, encapsulant 108 has a hemisphere dome shape which provides a convex refractive surface that focuses the white light in the upward direction.

Semiconductor chip assembly 100 can be manufactured by mounting LED chip 102 on bump 16 using die attach 106, then wire bonding pads 60 and 114 and then forming encapsulant 108.

For instance, die attach 106 is initially a silver-filled epoxy paste with high thermal conductivity that is selectively screen printed into cavity 20 on bump 16 and then LED chip 102 placed on the epoxy paste using a pick-up head and an automated pattern recognition system in step-and-repeat fashion. Thereafter, the epoxy paste is heated and hardened at a relatively low temperature such as 190° C. to form die attach 106. Next, wire bond 104 is a gold wire that is thermosonically ball bonded to pads 60 and 114 and then encapsulant 108 is molded on the structure.

LED chip 102 can be electrically connected to pad 60 by a wide variety of connection media, thermally connected to and mechanically attached to heat spreader 78 by a wide variety of thermal adhesives and encapsulated by a wide variety of encapsulants.

Semiconductor chip assembly 100 is a first-level single-chip package.

Figure 12A:
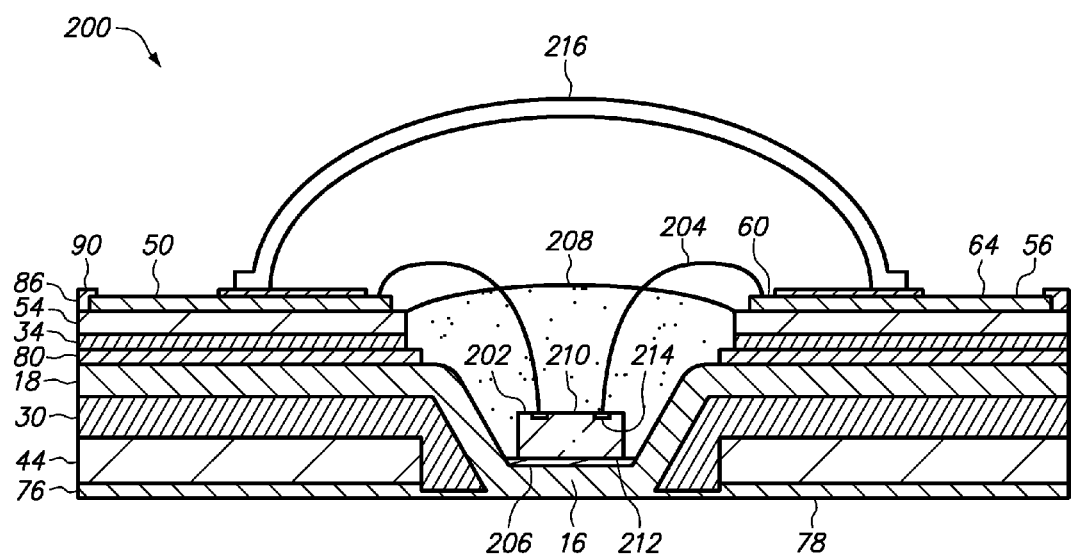
FIGS. 12A, 12B and 12C are cross-sectional, top and bottom views, respectively, of a semiconductor chip assembly that includes a thermal board, a semiconductor device, an encapsulant and a lens in accordance with an embodiment of the present invention.
Figure 12B:
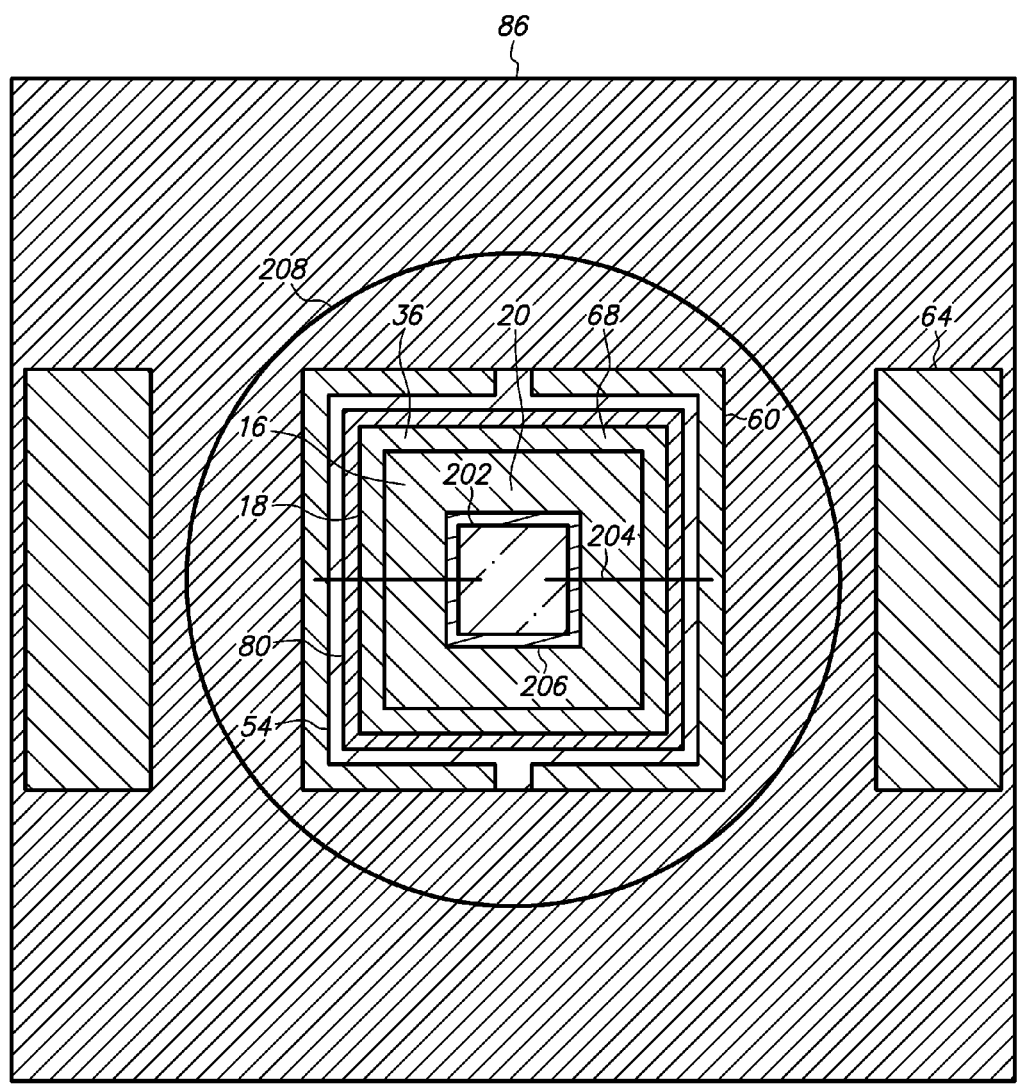
Figure 12C:
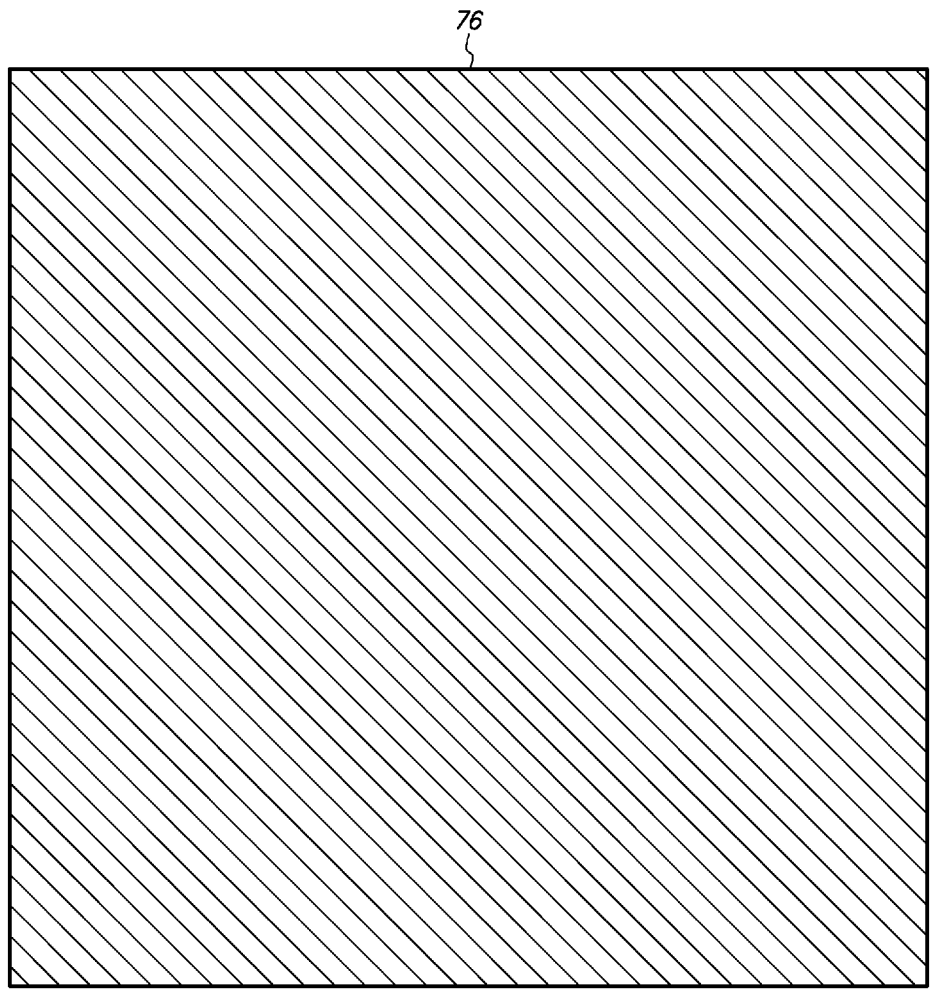

FIGS. 12A, 12B and 12C are cross-sectional, top and bottom views, respectively, of a semiconductor chip assembly that includes a thermal board, a semiconductor device, an encapsulant and a lens in accordance with an embodiment of the present invention.

In this embodiment, the semiconductor device is covered by a color-shifting encapsulant and a transparent lens. For purposes of brevity, any description of assembly 100 is incorporated herein insofar as the same is applicable, and the same description need not be repeated. Likewise, elements of the assembly similar to those in assembly 100 have corresponding reference numerals indexed at two-hundred rather than one-hundred. For instance, LED chip 202 corresponds to LED chip 102, wire bond 204 corresponds to wire bond 104, etc.

Semiconductor chip assembly 200 includes thermal board 90, LED chip 202, wire bond 204, die attach 206, encapsulant 208 and lens 216. LED chip 202 includes top surface 210, bottom surface 212 and bond pad 214. Top surface 210 is the active surface and includes bond pad 214 and bottom surface 212 is the thermal contact surface.

LED chip 202 is mounted on heat spreader 78, electrically connected to conductive trace 56 and thermally connected to heat spreader 78. In particular, LED chip 202 is mounted on bump 16, is electrically connected to pad 60 by wire bond 204 and is thermally connected to and mechanically attached to bump 16 by die attach 206.

Encapsulant 208 contacts bump 16, LED chip 202, wire bond 204 and die attach 206 in cavity 20, contacts ledge 18, adhesive 34, dielectric layer 54, solder mask 80 and wire bond 104 outside cavity 20, is spaced from adhesive 30, dielectric layer 44, conductive trace 56, base 76 and solder mask 86, fills the remaining space in cavity 20, seals LED chip 202 within cavity 20 and covers bump 16, LED chip 202 and die attach 206 in the upward direction. However, encapsulant 208 is laterally confined by dielectric layer 54 at aperture 68, is primarily located within cavity 20 and only partially protects wire bond 204. Furthermore, since cavity 20 has a precisely controlled and well-defined space due to the stamping operation, encapsulant 208 is dispensed in a small consistent amount.

Lens 216 is a transparent plastic lid with a curved hollow dome (resembling a hemisphere) mounted on solder mask 86 and provides environmental protection such as moisture resistance and particle protection for wire bond 204 and encapsulant 208. Lens 216 contacts solder mask 86, is spaced from adhesives 30 and 40, dielectrics layers 44 and 54, conductive trace 56, heat spreader 78, solder mask 80, LED chip 202, wire bond 204, die attach 206 and encapsulant 208 and covers bump 16, pad 60, LED chip 202, wire bond 204, die attach 206 and encapsulant 208 in the upward direction. Furthermore, lens 216 includes transparent plastic but is devoid of fluorescent powder and does not color-shift light.

LED chip 202 emits blue light, encapsulant 208 converts the blue light to white light which in turn radiates through lens 216 and assembly 200 is a white light source. In addition, lens 216 has a hemisphere dome shape with a convex refractive surface that focuses the white light emitted by encapsulant 208 in the upward direction. Moreover, since encapsulant 208 is considerably smaller than encapsulant 108 and lens 216 need not contain phosphor or fluorescent powder, this arrangement is especially cost effective.

Semiconductor chip assembly 200 can be manufactured by mounting LED chip 202 on bump 16 using die attach 206 and then wire bonding pads 60 and 214. Thereafter, encapsulant 208 is deposited as an A-stage uncured epoxy into cavity 20 on LED chip 202 and wire bond 204 by screen printing or dispensing by an injection nozzle in step-and-repeat fashion. The liquid epoxy fills the remaining space in and extends above cavity 20 and is laterally confined by dielectric layer 54 at aperture 68 which serves as a dam, and then the liquid epoxy is heated and hardened at a relatively low temperature such as 190° C., thereby converting the A-stage liquid uncured epoxy into C-stage cured or hardened epoxy. Thereafter, lens 216 is mounted on solder mask 86.

Semiconductor chip assembly 200 is a first-level single-chip package.

Figure 13A:
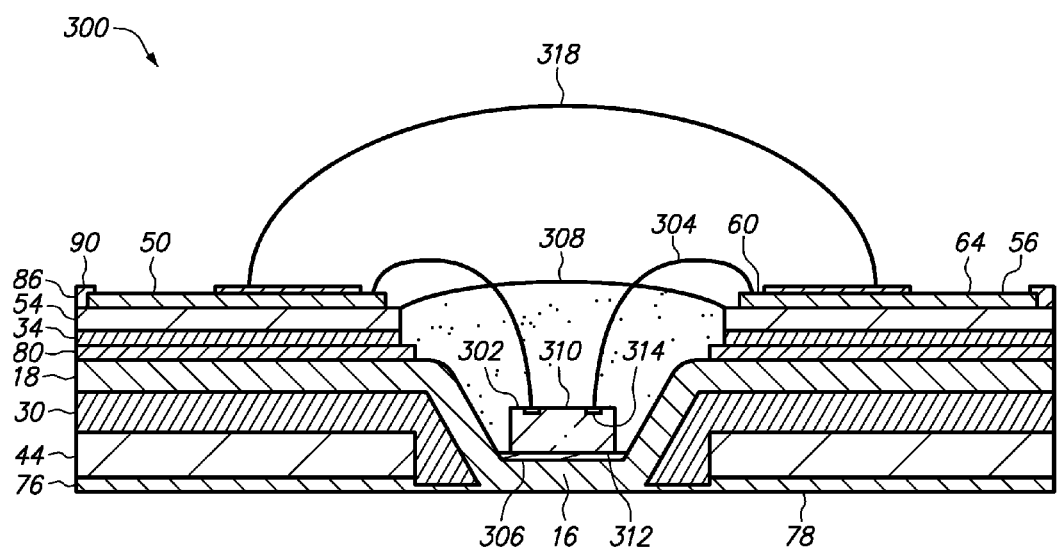
FIGS. 13A, 13B and 13C are cross-sectional, top and bottom views, respectively, of a semiconductor chip assembly that includes a thermal board, a semiconductor device and dual encapsulants in accordance with an embodiment of the present invention.
Figure 13B:
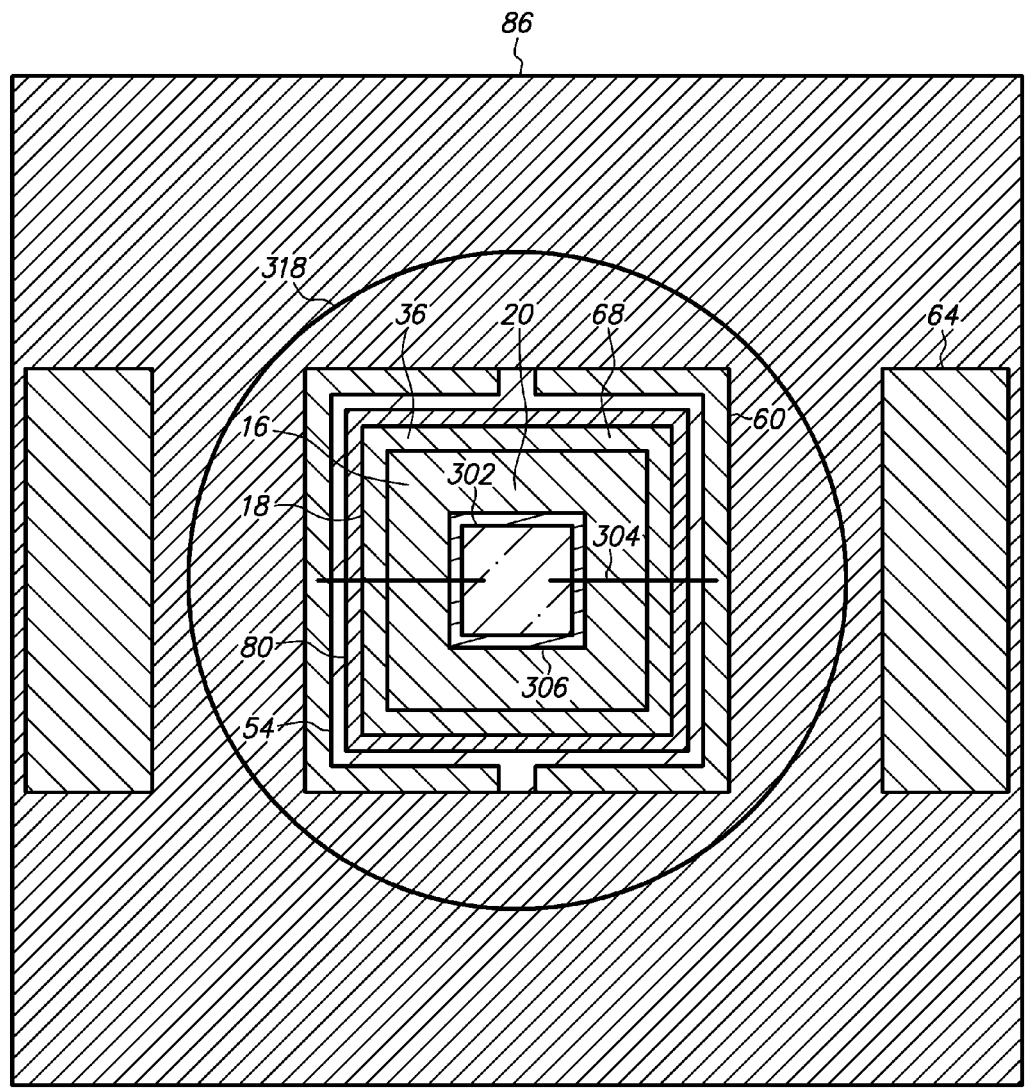
Figure 13C:
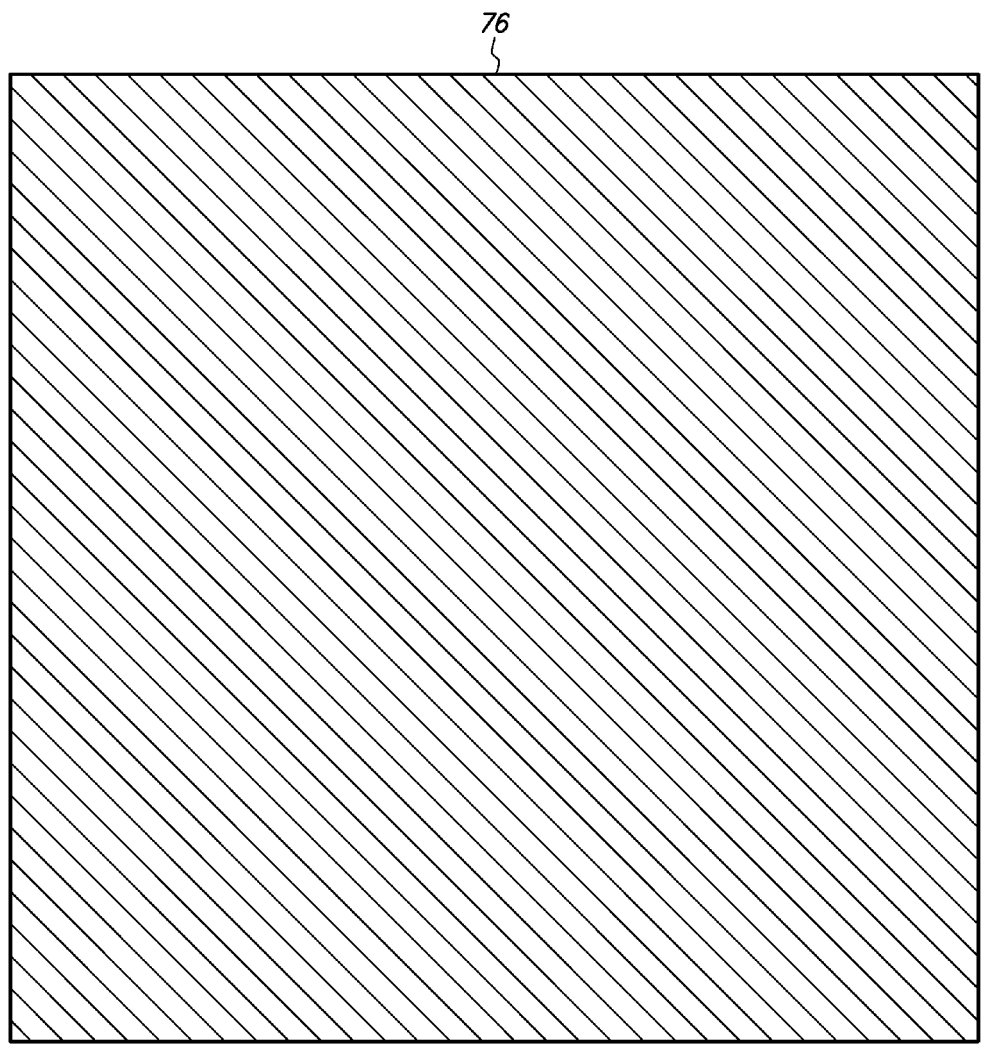

FIGS. 13A, 13B and 13C are cross-sectional, top and bottom views, respectively, of a semiconductor chip assembly that includes a thermal board, a semiconductor device and dual encapsulants in accordance with an embodiment of the present invention.

In this embodiment, the semiconductor device is covered by a color-shifting encapsulant and a transparent encapsulant. For purposes of brevity, any description of assembly 200 is incorporated herein insofar as the same is applicable, and the same description need not be repeated. Likewise, elements of the assembly similar to those in assembly 200 have corresponding reference numerals indexed at three-hundred rather than two-hundred. For instance, LED chip 302 corresponds to LED chip 202, wire bond 304 corresponds to wire bond 204, etc.

Semiconductor chip assembly 300 includes thermal board 90, LED chip 302, wire bond 304, die attach 306 and encapsulants 308 and 318. LED chip 302 includes top surface 310, bottom surface 312 and bond pad 314. Top surface 310 is the active surface and includes bond pad 314 and bottom surface 312 is the thermal contact surface.

LED chip 302 is mounted on heat spreader 78, electrically connected to conductive trace 56 and thermally connected to heat spreader 78. In particular, LED chip 302 is mounted on bump 16, is electrically connected to pad 60 by wire bond 304 and is thermally connected to and mechanically attached to bump 16 by die attach 306.

Encapsulant 308 covers LED chip 302 in the upward direction and is primarily located within cavity 20.

Encapsulant 318 is a solid adherent electrically insulative transparent protective enclosure that provides environmental protection such as moisture resistance and particle protection for wire bond 304 and encapsulant 308. Encapsulant 318 contacts dielectric layer 54, pad 60, solder mask 86, wire bond 304 and encapsulant 308, is spaced from adhesives 30 and 40, dielectric layer 44, routing line 62, terminal 64, heat spreader 78, solder mask 80, LED chip 302 and die attach 306 and covers bump 16, pad 60, LED chip 302, wire bond 304, die attach 306 and encapsulant 308 in the upward direction. Furthermore, encapsulant 318 includes transparent silicone but is devoid of fluorescent powder and does not color-shift light.

LED chip 302 emits blue light, encapsulant 308 converts the blue light to white light which in turn radiates through encapsulant 318 and assembly 300 is a white light source. In addition, encapsulant 318 has a hemisphere dome shape with a convex refractive surface that focuses the white light emitted by encapsulant 318 in the upward direction. Moreover, since encapsulant 308 is considerably smaller than encapsulant 108 and encapsulant 318 need not contain phosphor or fluorescent powder, this arrangement is especially cost effective.

Semiconductor chip assembly 300 can be manufactured by mounting LED chip 302 on bump 16 using die attach 306, then wire bonding pads 60 and 314, then forming encapsulant 308 by depositing and curing using dielectric layer 54 as a dam and then forming encapsulant 318 by molding.

Semiconductor chip assembly 300 is a first-level single-chip package.

Figure 14A:
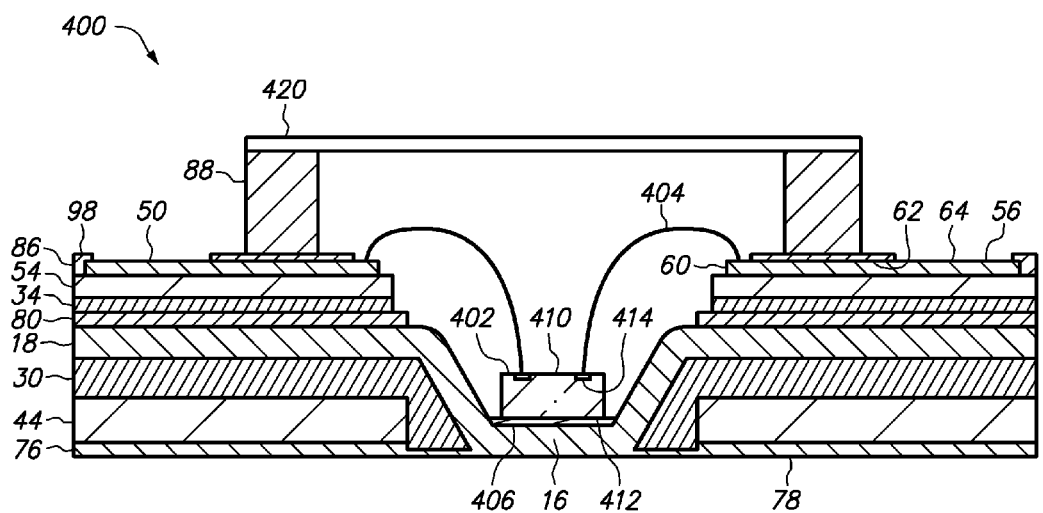
FIGS. 14A, 14B and 14C are cross-sectional, top and bottom views, respectively, of a semiconductor chip assembly that includes a thermal board with a rim, a semiconductor device and a lid in accordance with an embodiment of the present invention.
Figure 14B:
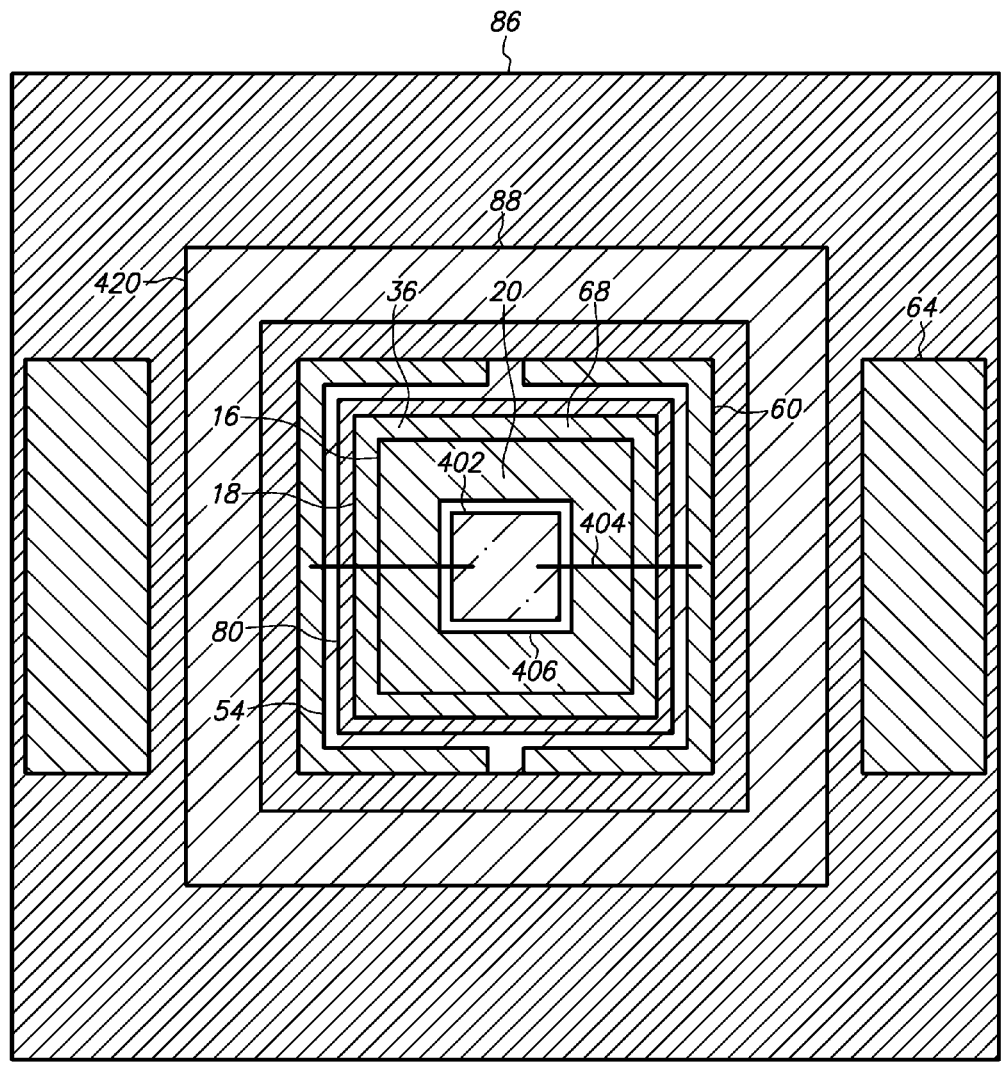
Figure 14C:
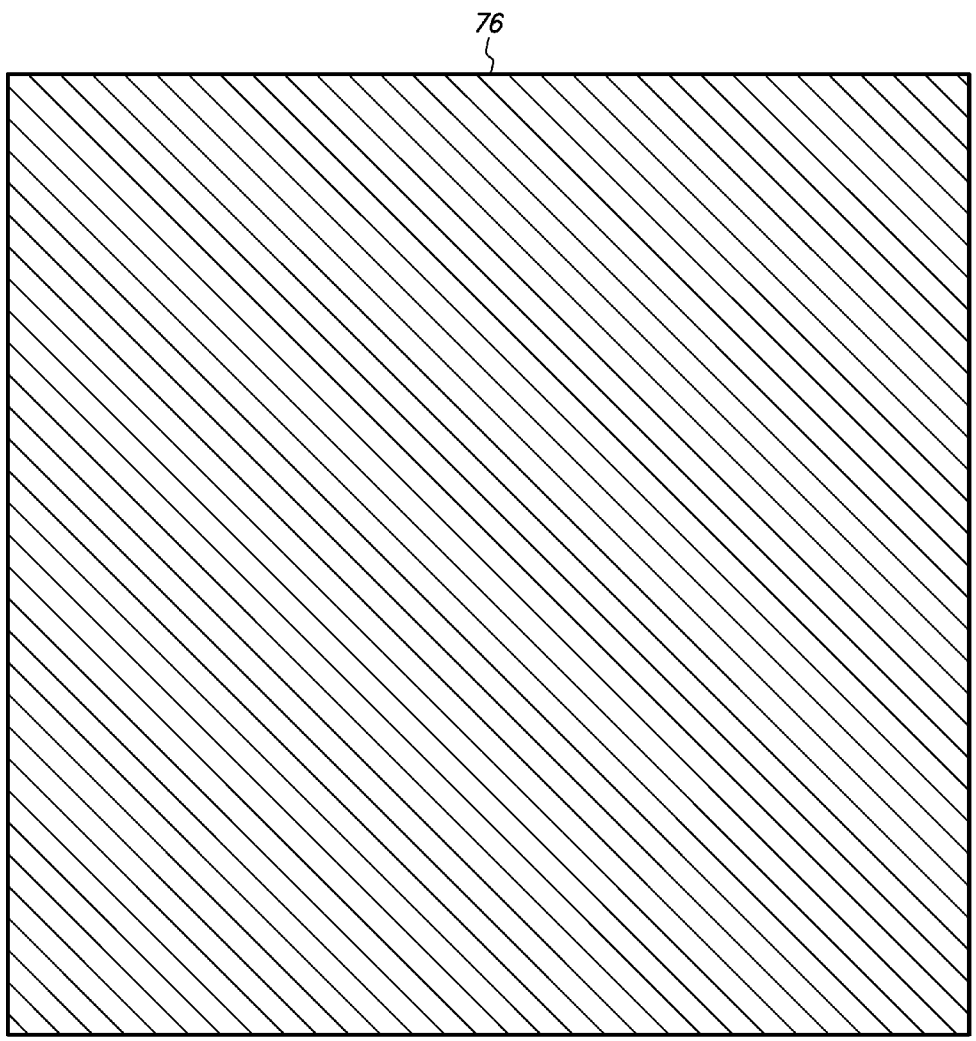

FIGS. 14A, 14B and 14C are cross-sectional, top and bottom views, respectively, of a semiconductor chip assembly that includes a thermal board with a rim, a semiconductor device and a lid in accordance with an embodiment of the present invention.

In this embodiment, the semiconductor device is covered by a transparent lid mounted on the rim and the encapsulant is omitted. For purposes of brevity, any description of assembly 100 is incorporated herein insofar as the same is applicable, and the same description need not be repeated. Likewise, elements of the assembly similar to those in assembly 100 have corresponding reference numerals indexed at four-hundred rather than one-hundred. For instance, LED chip 402 corresponds to LED chip 102, wire bond 404 corresponds to wire bond 104, etc.

Semiconductor chip assembly 400 includes thermal board 98, LED chip 402, wire bond 404, die attach 406 and lid 420. LED chip 402 includes top surface 410, bottom surface 412 and bond pad 414. Top surface 410 is the active surface and includes bond pad 414 and bottom surface 412 is the thermal contact surface.

LED chip 402 is mounted on heat spreader 78, electrically connected to conductive trace 56 and thermally connected to heat spreader 78. In particular, LED chip 402 is mounted on bump 16, is electrically connected to pad 60 by wire bond 404 and is thermally connected to and mechanically attached to bump 16 by die attach 406.

Lid 420 is a glass sheet mounted on rim 88, thereby forming a sealed enclosure for LED chip 402 and wire bond 404 that provides environmental protection such as moisture resistance and particle protection for LED chip 402 and wire bond 404. Lid 420 contacts rim 88, is spaced from adhesives 30 and 40, dielectric layers 44 and 54, conductive trace 56, heat spreader 78, solder masks 80 and 86, LED chip 402, wire bond 404 and die attach 406 and covers bump 16, pad 60, LED chip 402, wire bond 404 and die attach 406 in the upward direction. Furthermore, lid 420 includes transparent glass but is devoid of fluorescent powder and does not color-shift light.

LED chip 402 emits white light which radiates through lid 420 and assembly 400 is a white light source.

Semiconductor chip assembly 400 can be manufactured by mounting LED chip 402 on bump 16 using die attach 406, then wire bonding pads 60 and 414 and then mounting lid 420 on rim 88.

Semiconductor chip assembly 400 is a first-level single-chip package.

The semiconductor chip assemblies and thermal boards described above are merely exemplary. Numerous other embodiments are contemplated. In addition, the embodiments described above can be mixed-and-matched with one another and with other embodiments depending on design and reliability considerations. For instance, the second substrate can include single-level conductive traces and multi-level conductive traces. The conductive trace can provide horizontal and vertical signal routing. The bump can include straight vertical or tapered sidewalls. The ledge can extend to or be spaced from the peripheral edges of the assembly. The thermal board can include a thick base and multi-level signal routing. The thermal board can include a rim and plated contacts at the bump and the base. The thermal board can also include multiple bumps arranged in an array for multiple semiconductor devices and can include additional conductive traces to accommodate the additional semiconductor devices. The semiconductor device can be covered in the first vertical direction by a transparent, translucent or opaque encapsulant and/or a transparent, translucent or opaque lid. For instance, the semiconductor device can be an LED chip that emits blue light and is covered by a transparent encapsulant or lid so that the assembly is a blue light source or a color-shifting encapsulant or lid so that the assembly is a green, red or white light source. Likewise, the semiconductor device can be an LED package with multiple LED chips and the thermal board can include additional conductive traces to accommodate the additional LED chips.

The semiconductor device can share or not share the heat spreader with other semiconductor devices. For instance, a single semiconductor device can be mounted on the heat spreader. Alternatively, numerous semiconductor devices can mounted on the heat spreader. For instance, four small chips in a 2×2 array can be attached to the bump and the second substrate can include additional conductive traces to receive and route additional wire bonds to the chips. This may be more cost effective than providing a miniature bump for each chip.

The semiconductor chip can be optical or non-optical. For instance, the chip can be an LED, an IR detector, a solar cell, a microprocessor, a controller, a DRAM or an RF power amplifier. Likewise, the semiconductor package can be an LED package or an RF module. Thus, the semiconductor device can be a packaged or unpackaged optical or non-optical chip. Furthermore, the semiconductor device can be mechanically, electrically and thermally connected to the thermal board using a wide variety of connection media including solder and electrically and/or thermally conductive adhesive.

The heat spreader can provide rapid, efficient and essentially uniform heat spreading and dissipation for the semiconductor device to the next level assembly without heat flow through the adhesives, the dielectric layers, the solder masks or elsewhere in the thermal board. As a result, the adhesives, the dielectric layers and the solder masks can have low thermal conductivity which drastically reduces cost. The heat spreader can include a bump and a ledge that are integral with one another and a base that is metallurgically bonded and thermally connected to the bump, thereby enhancing reliability and reducing cost. Furthermore, the bump can be customized for the semiconductor device and the base can be customized for the next level assembly, thereby enhancing the thermal connection from the semiconductor device to the next level assembly. For instance, the bump can have a square or rectangular shape at its floor with the same or similar topography as the thermal contact of the semiconductor device. In any case, the heat spreader can be a wide variety of thermally conductive metallic structures.

The heat spreader can be electrically connected to or isolated from the semiconductor device and the conductive trace. For instance, the die attach can be electrically conductive and a plated through-hole can extend from the terminal through the second adhesive and the second dielectric layer to the ledge to electrically connect the terminal and the ledge. Thereafter, the heat spreader can be electrically connected to ground, thereby electrically connecting the semiconductor device to ground.

The bump can be integral with the ledge when they are a single-piece metal such as copper or aluminum. The bump can also be integral with the ledge when they include a single-piece metal such as copper at their interface as well as additional metal elsewhere such as a plated contact or a reflective coating. The bump can also be integral with the ledge when they share single-piece metals at their interface such as a copper coating on a nickel buffer layer on an aluminum core.

The base can be formed by numerous deposition techniques including electroplating, electroless plating, evaporating and sputtering as a single layer or multiple layers after the first adhesive is solidified. The base can be the same metal as or a different metal than the bump. Furthermore, the base can extend across the first aperture to the first substrate or reside within the periphery of the first aperture. Thus, the base may contact or be spaced from the first substrate. In any case, the base is adjacent to the bump and extends vertically from the bump opposite the cavity.

The base can include fins at its backside that protrude in the second vertical direction. For instance, the base can be cut at its exposed lateral surface by a routing machine to form lateral grooves that define the fins. In this instance, the base can have a thickness of 500 microns, the grooves can have a depth of 300 microns and the fins can have a height of 300 microns. The fins can increase the surface area of the base, thereby increasing the thermal conductivity of the base by thermal convection when it remains exposed to the air rather than mounted on a heat sink.

The ledge can provide mechanical support for the adhesives, the substrates and the solder masks. For instance, the ledge can prevent the substrates from warping during metal grinding, chip mounting, wire bonding and encapsulant molding.

The first adhesive can provide a robust mechanical bond between the heat spreader and the first substrate. For instance, the first adhesive can extend laterally from the bump beyond the conductive trace to the peripheral edges of the assembly, the first adhesive can fill the space between the heat spreader and the first substrate and the first adhesive can be void-free with consistent bond lines. The first adhesive can also absorb thermal expansion mismatch between the heat spreader and the first substrate. The first adhesive can also be the same material as or a different material than the first dielectric layer. Furthermore, the first adhesive can be a low cost dielectric that need not have high thermal conductivity. Moreover, the first adhesive is not prone to delamination.

The first adhesive thickness can be adjusted so that the first adhesive essentially fills the gap and essentially all the first adhesive is within structure once it is solidified and/or grinded. For instance, the optimal prepreg thickness can be established through trial and error. Likewise, the first dielectric layer thickness can be adjusted to achieve this result.

The second adhesive can provide a robust mechanical bond between the heat spreader and the second substrate. For instance, the second adhesive can extend laterally from the second opening beyond the conductive trace to the peripheral edges of the assembly, the second adhesive can fill the space between the ledge (or solder mask on the ledge) and the second substrate and the second adhesive can be void-free with consistent bond lines. The second adhesive can also absorb thermal expansion mismatch between the heat spreader and the second substrate. Furthermore, the second adhesive can be a low cost dielectric that need not have high thermal conductivity. Moreover, the second adhesive is not prone to delamination.

The second adhesive can be adjusted so that the second opening is essentially coextensive with the second aperture and essentially all the second adhesive is between the ledge and the second substrate once it is compressed. For instance, the optimal second opening diameter can be established through trial and error. Likewise, the second aperture diameter can be adjusted to achieve this result.

The first substrate can be a low cost laminated structure that need not have high thermal conductivity. Furthermore, the first substrate can include a single first conductive layer or multiple first conductive layers. Moreover, the first substrate can include or consist of the first conductive layer.

The second substrate can be a low cost laminated structure that need not have high thermal conductivity. Furthermore, the second substrate can include a single second conductive layer or multiple second conductive layers. Moreover, the second substrate can include or consist of the second conductive layer.

The first conductive layer alone can be mounted on the first adhesive. For instance, the first aperture can be formed in the first conductive layer and then the first conductive layer can be mounted on the first adhesive so that the first conductive layer contacts the first adhesive and is exposed in the first vertical direction and the bump extends into and is exposed in the first vertical direction by the first aperture. In this instance, the first conductive layer can have a thickness of 100 to 200 microns such as 125 microns which is thick enough to handle without warping and wobbling yet thin enough to pattern without excessive etching.

The first conductive layer and the first dielectric layer can be mounted on the first adhesive. For instance, the first conductive layer can be provided on the first dielectric layer, then the first aperture can be formed in the first conductive layer and the first dielectric layer, and then the first conductive layer and the first dielectric layer can be mounted on the first adhesive so that the first conductive layer is exposed in the first vertical direction, the first dielectric layer contacts and is sandwiched between and separates the first conductive layer and the first adhesive and the bump extends into and is exposed in the first vertical direction by the first aperture. In this instance, the first conductive layer can have a thickness of 10 to 50 microns such as 30 microns which is thick enough for reliable signal transfer yet thin enough to reduce weight and cost. Furthermore, the first dielectric layer is a permanent part of the thermal board.

The first conductive layer and a carrier can be mounted on the first adhesive. For instance, the first conductive layer can be attached to a carrier such biaxially-oriented polyethylene terephthalate polyester (Mylar) by a thin film, then the first aperture can be formed in the first conductive layer but not the carrier, then the first conductive layer and the carrier can be mounted on the first adhesive so that the carrier covers the first conductive layer and is exposed in the first vertical direction, the thin film contacts and is sandwiched between the carrier and the first conductive layer, the first conductive layer contacts and is sandwiched between the thin film and the first adhesive, and the bump is aligned with the first aperture and covered in the first vertical direction by the carrier. After the first adhesive is solidified, the thin film can be decomposed by UV light so that the carrier can be peeled off the first conductive layer, thereby exposing the first conductive layer in the first vertical direction, and then the first conductive layer can be grinded and built-up for the base. In this instance, the first conductive layer can have a thickness of 10 to 50 microns such as 30 microns which is thick enough for reliable signal transfer yet thin enough to reduce weight and cost, and the carrier can have a thickness of 300 to 500 microns which is thick enough to handle without warping and wobbling yet thin enough to reduce weight and cost. Furthermore, the carrier is a temporary fixture and not a permanent part of the thermal board.

The pad and the terminal can have a wide variety of packaging formats as required by the semiconductor device and the next level assembly.

The pad and the terminal can be formed by numerous deposition techniques including electroplating, electroless plating, evaporating and sputtering as a single layer or multiple layers, either before or after the second substrate is mounted on the second adhesive. For instance, the second conductive layer can be patterned to provide the pad and the terminal before the second substrate is mounted on the second adhesive or after second substrate is attached to the ledge by the second adhesive.

The plated contact surface finish can be formed before or after the pad and the terminal are formed. For instance, the plated contacts can be deposited on the second conductive layer before or after it is etched to form the pad and the terminal. Likewise, the plated contacts can be deposited on the pad and the terminal before the second substrate is mounted on the second adhesive or after second substrate is attached to the ledge by the second adhesive. In any case, the pad and the terminal include the plated contacts as a surface finish.

The rim can be reflective or non-reflective and transparent or non-transparent. For instance, the rim can include a highly reflective metal such as silver or aluminum with a slanted inner surface which reflects the light directed at it in the first vertical direction, thereby increasing light output in the first vertical direction. Likewise, the rim can include a transparent material such as glass or a non-reflective, non-transparent low cost material such as epoxy. Furthermore, a reflective rim can be used regardless of whether it contacts or confines the encapsulant.

The encapsulant (or dual encapsulants) can be numerous transparent, translucent or opaque materials and have various shapes and sizes. For instance, the encapsulant can be transparent silicone, epoxy or combinations thereof. Silicone has higher thermal and color-shifting stability than epoxy but also higher cost and lower rigidity and adhesion than epoxy.

The lid can overlap or replace the encapsulant. The lid can provide environmental protection such as moisture resistance and particle protection for the chip and the wire bond in a sealed enclosure. The lid can be numerous transparent, translucent or opaque materials and have various shapes and sizes. For instance, the lid can be transparent glass or silica.

The lens can cover or replace the encapsulant. The lens can provide environmental protection such as moisture resistance and particle protection for the chip and the wire bond in a sealed enclosure. The lens can also provide a convex refractive surface that focuses the light in the first vertical direction. The lens can be numerous transparent, translucent or opaque materials and have various shapes and sizes. For instance, a glass lens with a hollow hemisphere dome can be mounted on the thermal board and spaced from the encapsulant, or a plastic lens with a solid hemisphere dome can be mounted on the encapsulant and spaced from the thermal board.

The conductive trace can include additional pads, terminals, routing lines and vias as well as passive components and have different configurations. The conductive trace can function as a signal, power or ground layer depending on the purpose of the corresponding semiconductor device pad. The conductive trace can also include various conductive metals such as copper, gold, nickel, silver, palladium, tin, combinations thereof, and alloys thereof. The preferred composition will depend on the nature of the external connection media as well as design and reliability considerations. Furthermore, those skilled in the art will understand that in the context of a semiconductor chip assembly, the copper material can be pure elemental copper but is typically a copper alloy that is mostly copper such as copper-zirconium (99.9% copper), copper-silver-phosphorus-magnesium (99.7% copper) and copper-tin-iron-phosphorus (99.7% copper) to improve mechanical properties such as tensile strength and elongation.

The dielectric layers, plated layers, plated contacts, solder masks, routing line, reflective coating and encapsulant are generally desirable but may be omitted in some embodiments. For instance, if a thick base is desired then the first dielectric layer can be omitted. If single-level signal routing is used then the routing line can omitted. If the LED chip emits light with the desired color then the color-shifting encapsulant can be omitted. Likewise, if the transparent encapsulant is molded on the thermal board, laterally confined by the bump or the second substrate or omitted and a reflector is unnecessary then the rim can be omitted.

The thermal board can include a thermal via that is spaced from the bump, extends through the first adhesive and the first dielectric layer outside the first opening and the first aperture and is adjacent to and thermally connects the base and the ledge to improve heat dissipation from the ledge to the base and heat spreading in the base.

The assembly can provide horizontal or vertical single-level or multi-level signal routing.

Horizontal single-level signal routing with the pad, the terminal and the routing line above the dielectric layer is disclosed in U.S. application Ser. No. 12/616,773 filed Nov. 11, 2009 by Charles W. C. Lin et al. entitled "Semiconductor Chip Assembly with Post/Base Heat Spreader and Substrate" which is incorporated by reference.

Horizontal single-level signal routing with the pad, the terminal and the routing line above the adhesive and no dielectric layer is disclosed in U.S. application Ser. No. 12/616,775 filed Nov. 11, 2009 by Charles W. C. Lin et al. entitled "Semiconductor Chip Assembly with Post/Base Heat Spreader and Conductive Trace" which is incorporated by reference.

Horizontal multi-level signal routing with the pad and the terminal above the dielectric layer electrically connected by first and second vias through the dielectric layer and a routing line beneath the dielectric layer is disclosed in U.S. application Ser. No. 12/557,540 filed Sep. 11, 2009 by Chia-Chung Wang et al. entitled "Semiconductor Chip Assembly with Post/Base Heat Spreader and Horizontal Signal Routing" which is incorporated by reference.

Vertical multi-level signal routing with the pad above the dielectric layer and the terminal beneath the adhesive electrically connected by a first via through the dielectric layer, a routing line beneath the dielectric layer and a second via through the adhesive is disclosed in U.S. application Ser. No. 12/557,541 filed Sep. 11, 2009 by Chia-Chung Wang et al. entitled "Semiconductor Chip Assembly with Post/Base Heat Spreader and Vertical Signal Routing" which is incorporated by reference.

The working format for the thermal board can be a single thermal board or multiple thermal boards based on the manufacturing design. For instance, a single thermal board can be manufactured individually. Alternatively, numerous thermal boards can be simultaneously batch manufactured using a single metal plate, a single first and second adhesive, a single first and second substrate, a single first and second solder mask and a single plated layer (for the base) and then separated from one another.

For example, multiple bumps can be stamped in the metal plate, then the non-solidified first adhesive with first openings corresponding to the bumps can be mounted on the ledge such that each bump extends through a first opening, then the first substrate (with a single first conductive layer, a single first dielectric layer and first apertures corresponding to the bumps) can be mounted on the first adhesive such that each bump extends through a first opening into a first aperture, then the ledge and the first conductive layer can be moved towards one another by platens to force the first adhesive into the gaps in the first apertures between the bumps and the first substrate, then the first adhesive can be cured and solidified to secure the first substrate to the bump and the ledge, then the bumps, the first adhesive and the first conductive layer can be grinded to form a lateral surface, then the plated layer can be plated on the bumps, the first adhesive and the first conductive layer at the lateral surface to provide the base, then the first solder mask with first windows corresponding to the bumps can be mounted on the ledge such that each bump is aligned with a first window, then the reflective coating can be plated on the bumps, then the second adhesive with second openings corresponding to the bumps can be mounted on the first solder mask such that each bump is aligned with a second opening, then the second substrate (with conductive traces corresponding to the bumps, a single second dielectric layer and second apertures corresponding to the bumps) with the second solder mask thereon can be mounted on the second adhesive such that each bump is aligned with a second aperture, then the second adhesive can be compressed to secure the second substrate to the ledge and then the base, the ledge, the adhesives, the dielectric layers and the solder masks can be cut or cracked at the desired locations of the peripheral edges of the thermal boards, thereby separating the individual thermal boards from one another.

The working format for the semiconductor chip assembly can be a single assembly or multiple assemblies based on the manufacturing design. For instance, a single assembly can be manufactured individually. Alternatively, numerous assemblies can be simultaneously batch manufactured before the thermal boards are separated from one another. Likewise, multiple semiconductor devices can be electrically, thermally and mechanically connected to each thermal board in the batch.

For example, die attach paste portions can be deposited in the cavities on the bumps, then the chips can be placed in the cavities on the die attach paste portions, then the die attach paste portions can be simultaneously heated and hardened to provide the die attaches, then the chips can be wire bonded to the corresponding pads outside the cavities, then color-shifting encapsulant portions can be deposited into the cavities on the chips and the wire bonds, then the color-shifting encapsulant portions can be simultaneously heated and hardened to provide the color-shifting encapsulants, then transparent encapsulants can be simultaneously molded over the color-shifting encapsulants and then the thermal boards can be separated from one another.

The thermal boards can be detached from one another in a single step or multiple steps. For instance, the thermal boards can be batch manufactured as a panel, then the semiconductor devices can be mounted on the panel and then the semiconductor chip assemblies of the panel can be detached from one another. Alternatively, the thermal boards can be batch manufactured as a panel, then the thermal boards of the panel can be singulated into strips of multiple thermal boards, then the semiconductor devices can be mounted on the thermal boards of a strip and then the semiconductor chip assemblies of the strip can be detached from one another. Furthermore, the thermal boards can be detached by mechanical sawing, laser sawing, cleaving or other suitable techniques.

The term "adjacent" refers to elements that are integral (single-piece) or in contact (not spaced or separated from) with one another. For instance, the bump is adjacent to the base and the ledge but not the dielectric layers.

The term "overlap" refers to above and extending within a periphery of an underlying element. Overlap includes extending inside and outside the periphery or residing within the periphery. For instance, in the cavity-up position, the semiconductor device overlaps the bump since an imaginary vertical line intersects the semiconductor device and the bump, regardless of whether another element such as the die attach is between the semiconductor device and the bump and is intersected by the line, and regardless of whether another imaginary vertical line intersects the bump but not the semiconductor device (outside the periphery of the semiconductor device). Likewise, the bump overlaps the base, the pad overlaps the first adhesive and the base is overlapped by the bump. Moreover, overlap is synonymous with over and overlapped by is synonymous with under or beneath.

The term "contact" refers to direct contact. For instance, the first dielectric layer contacts the first adhesive but does not contact the bump.

The term "cover" refers to complete coverage in a vertical and/or lateral direction. For instance, in the cavity-up position, the base covers the bump in the downward direction but the bump does not cover the base in the upward direction when the base extends laterally beyond the first aperture and contacts the first dielectric layer.

The term "layer" refers to patterned and unpatterned layers. For instance, the second conductive layer can be an unpatterned blanket sheet on the second dielectric layer before the second substrate is mounted on the second adhesive, and the second conductive layer can be a patterned circuit with spaced traces on the second dielectric layer when the semiconductor device is mounted on the heat spreader. Furthermore, a layer can include stacked layers.

The term "pad" in conjunction with the conductive trace refers to a connection region that is adapted to contact and/or bond to external connection media (such as solder or a wire bond) that electrically connects the conductive trace to the semiconductor device.

The term "terminal" in conjunction with the conductive trace refers to a connection region that is adapted to contact and/or bond to external connection media (such as solder or a wire bond) that electrically connects the conductive trace to an external device (such as a PCB or a wire thereto) associated with the next level assembly.

The terms "opening" and "aperture" and "hole" refer to a through-hole and are synonymous. For instance, in the cavity-down position, the bump is exposed by the first adhesive in the upward direction when it is inserted into the first opening in the first adhesive. Likewise, the bump is exposed by the first substrate in the upward direction when it is inserted into the first aperture in the first substrate.

The term "inserted" refers to relative motion between elements. For instance, the bump is inserted into the first aperture regardless of whether the ledge is stationary and the first substrate moves towards the ledge, the first substrate is stationary and the ledge moves towards the first substrate or the ledge and the first substrate both approach the other. Furthermore, the bump is inserted (or extends) into the first aperture regardless of whether it goes through (enters and exits) or does not go through (enters without exiting) the first aperture.

The phrase "move towards one another" also refers to relative motion between elements. For instance, the ledge and the first substrate move towards one another regardless of whether the ledge is stationary and the first substrate moves towards the ledge, the first substrate is stationary and the ledge moves towards the first substrate or the ledge and the first substrate both approach the other.

The phrase "aligned with" refers to relative position between elements. For instance, in the cavity-up position, the bump is aligned with the first aperture when the first adhesive is mounted on the ledge, the first substrate is mounted on the first adhesive, the bump is inserted into and aligned with the first opening and the first aperture is aligned with the first opening regardless of whether the bump is inserted into the first aperture or is below and spaced from the first aperture.

The phrase "mounted on" includes contact and non-contact with a single or multiple support element(s). For instance, the semiconductor device is mounted on the bump regardless of whether it contacts the bump or is separated from the bump by a die attach.

The phrase "adhesive ... in the gap" refers to the adhesive in the gap. For instance, first adhesive that extends across the first dielectric layer in the gap refers to the first adhesive in the gap that extends across the first dielectric layer. Likewise, first adhesive that contacts and is sandwiched between the bump and the first dielectric layer in the gap refers to the first adhesive in the gap that contacts and is sandwiched between the bump at the inner sidewall of the gap and the first dielectric layer at the outer sidewall of the gap.

The phrase "the base extends laterally from the bump" refers to lateral extension where the base is adjacent to the bump. For instance, in the cavity-up position, the base extends laterally from the bump when it contacts the first adhesive regardless of whether it extends laterally beyond the bump, extends laterally to the ledge or covers the bump in the downward direction.

The term "above" refers to upward extension and includes adjacent and non-adjacent elements as well as overlapping and non-overlapping elements. For instance, in the cavity-up position, the bump extends above, is adjacent to, overlaps and protrudes from the base. Likewise, the bump extends above the first dielectric layer even though it is not adjacent to or overlap the first dielectric layer.

The term "below" refers to downward extension and includes adjacent and non-adjacent elements as well as overlapping and non-overlapping elements. For instance, in the cavity-up position, the base extends below, is adjacent to and is overlapped by the bump and protrudes from the bump in the downward direction. Likewise, the bump extends below the pad even though it is not adjacent to or overlapped by the pad.

The "first vertical direction" and "second vertical direction" do not depend on the orientation of the semiconductor chip assembly (or the thermal board), as will be readily apparent to those skilled in the art. For instance, the bump extends vertically beyond the base in the first vertical direction and vertically beyond the ledge in the second vertical direction regardless of whether the assembly is inverted and/or mounted on a heat sink. Likewise, the ledge extends "laterally" from the bump in a lateral plane regardless of whether the assembly is inverted, rotated or slanted. Thus, the first and second vertical directions are opposite one another and orthogonal to the lateral directions, and laterally aligned elements are coplanar with one another at a lateral plane orthogonal to the first and second vertical directions. Furthermore, the first vertical direction is the upward direction and the second vertical direction is the downward direction in the cavity-up position, and the first vertical direction is the downward direction and the second vertical direction is the upward direction in the cavity-down position.

The semiconductor chip assembly of the present invention has numerous advantages. The assembly is reliable, inexpensive and well-suited for high volume manufacture. The assembly is especially well-suited for high power semiconductor devices such as LED chips and large semiconductor chips as well as multiple semiconductor devices such as small semiconductor chips in arrays which generate considerable heat and require excellent heat dissipation in order to operate effectively and reliably.

The manufacturing process is highly versatile and permits a wide variety of mature electrical, thermal and mechanical connection technologies to be used in a unique and improved manner. The manufacturing process can also be performed without expensive tooling. As a result, the manufacturing process significantly enhances throughput, yield, performance and cost effectiveness compared to conventional packaging techniques. Moreover, the assembly is well-suited for copper chip and lead-free environmental requirements.

The embodiments described herein are exemplary and may simplify or omit elements or steps well-known to those skilled in the art to prevent obscuring the present invention. Likewise, the drawings may omit duplicative or unnecessary elements and reference labels to improve clarity.

Various changes and modifications to the embodiments described herein will be apparent to those skilled in the art. For instance, the materials, dimensions, shapes, sizes, steps and arrangement of steps described above are merely exemplary. Such changes, modifications and equivalents may be made without departing from the spirit and scope of the present invention as defined in the appended claims.

We claim:

1. A semiconductor chip assembly, comprising:
a semiconductor device;
a first adhesive that includes a first opening;
a second adhesive that includes a second opening;
a conductive trace that includes a pad and a terminal; and
a heat spreader that includes a bump, a base and a ledge, wherein (i) the bump is adjacent to the base and the ledge, is integral with the ledge, extends from the base in a first vertical direction and extends from the ledge in a second vertical direction opposite the first vertical direction, (ii) the base covers the bump in the second vertical direction and extends laterally from the bump in lateral directions orthogonal to the vertical directions, (iii) the ledge extends laterally from the bump and is spaced from the base, and (iv) a cavity in the bump faces in the first vertical direction, is covered by the bump in the second vertical direction and is spaced from the base by the bump;
wherein the semiconductor device is mounted on the bump, extends into the cavity, is electrically connected to the pad and thereby electrically connected to the terminal, and is thermally connected to the bump and thereby thermally connected to the base;

wherein the first adhesive contacts the bump, the base and the ledge, is sandwiched between the base and the ledge and extends laterally from the bump to or beyond the terminal;

wherein the second adhesive is spaced from the bump, is sandwiched between the conductive trace and the ledge, extends beyond the ledge and the first adhesive in the first vertical direction and extends beyond the conductive trace in the second vertical direction;

wherein the conductive trace is located outside the cavity and beyond the ledge in the first vertical direction;

wherein the bump extends into the first opening, is aligned with and spaced from the second opening and covers the semiconductor device in the second vertical direction;

wherein the ledge is sandwiched between the adhesives and covers the conductive trace in the second vertical direction; and wherein the cavity extends into the first opening and is aligned with and spaced from the second opening.

2. The assembly of claim 1, wherein the semiconductor device is an LED chip.

3. The assembly of claim 1, wherein the semiconductor device is located within the cavity, is electrically connected to the pad using a wire bond that extends from the cavity through the second opening to the pad and is thermally connected to the bump using a die attach that is located within the cavity.

4. The assembly of claim 1, wherein the first adhesive laterally covers and surrounds and conformally coats a sidewall of the bump.

5. The assembly of claim 1, wherein the first adhesive extends to peripheral edges of the assembly.

6. The assembly of claim 1, wherein the first adhesive extends laterally from the bump beyond the conductive trace.

7. The assembly of claim 1, wherein the second adhesive is adhesive tape.

8. The assembly of claim 1, wherein the second adhesive extends to peripheral edges of the assembly.

9. The assembly of claim 1, wherein the bump is coplanar with the first adhesive at the base and at the ledge.

10. The assembly of claim 1, wherein the bump is adjacent to the base at a first bent corner and is adjacent to the ledge at a second bent corner.

11. The assembly of claim 1, wherein the bump has an irregular thickness characteristic of stamping.

12. The assembly of claim 1, wherein the cavity extends across most of the bump in the vertical and lateral directions.

13. The assembly of claim 1, wherein the base has a first thickness where it is adjacent to the bump, a second thickness where it is spaced from the bump by the first adhesive that is larger than the first thickness and a flat surface that faces in the second vertical direction.

14. The assembly of claim 1, wherein the base covers the bump, the ledge, the conductive trace and the adhesives in the second vertical direction and extends to peripheral edges of the assembly.

15. The assembly of claim 1, wherein the ledge covers the second adhesive in the second vertical direction and extends to peripheral edges of the assembly.

16. The assembly of claim 1, wherein the pad and the terminal have the same thickness and are coplanar with one another at a surface that faces in the first vertical direction.

17. The assembly of claim 1, wherein a first dielectric layer contacts and is sandwiched between the base and the first adhesive and is spaced from the bump, the ledge and the second adhesive, and the bump and the first adhesive extend through a first aperture in the first dielectric layer.

18. The assembly of claim 1, wherein a second dielectric layer contacts and is sandwiched between the conductive trace and the second adhesive and is spaced from the bump, the base, the ledge and the first adhesive, and the bump is aligned with and spaced from a second aperture in the second dielectric layer.

19. The assembly of claim 1, wherein the bump, the base, the ledge, the pad and the terminal are primarily copper.

20. The assembly of claim 1, wherein the heat spreader includes a copper core shared by the bump, the base and the ledge and the conductive trace includes a copper core shared by the pad and the terminal.

21. A semiconductor chip assembly, comprising:
a semiconductor device;
a first adhesive that includes a first opening;
a second adhesive that includes a second opening;
a first substrate that includes a first dielectric layer, wherein a first aperture extends through the first substrate;
a second substrate that includes a second dielectric layer, wherein a second aperture extends through the second substrate;
a conductive trace that includes a pad and a terminal; and
a heat spreader that includes a bump, a base and a ledge, wherein (i) the bump is adjacent to the base and the ledge, is integral with the ledge, extends from the base in a first vertical direction and extends from the ledge in a second vertical direction opposite the first vertical direction, (ii) the base covers the bump in the second vertical direction and extends laterally from the bump in lateral directions orthogonal to the vertical directions, (iii) the ledge extends laterally from the bump and is spaced from the base, and (iv) a cavity in the bump faces in the first vertical direction, is covered by the bump in the second vertical direction and is spaced from the base by the bump;

wherein the semiconductor device is mounted on the bump, extends into the cavity, is electrically connected to the pad and thereby electrically connected to the terminal, and is thermally connected to the bump and thereby thermally connected to the base;

wherein the first adhesive contacts the bump, the base, the ledge and the first dielectric layer, is spaced from the second adhesive and the second dielectric layer, is sandwiched between the bump and the first dielectric layer, between the ledge and the first dielectric layer and between the base and the ledge, extends through the first aperture and extends laterally from the bump to or beyond the terminal;

wherein the second adhesive is spaced from the bump and the conductive trace, is sandwiched between the ledge and the second dielectric layer, extends beyond the ledge, the first adhesive and the first dielectric layer in the first vertical direction and extends beyond the conductive trace and the second dielectric layer in the second vertical direction;

wherein the first dielectric layer contacts and is sandwiched between the base and the first adhesive and is spaced from the bump, the ledge and the second dielectric layer;

wherein the second dielectric layer contacts and is sandwiched between the conductive trace and the second adhesive and is spaced from the bump, the base and the ledge;

wherein the conductive trace is located outside the cavity and beyond the ledge and the adhesives in the first vertical direction;

wherein the bump extends into the first opening, extends through the first aperture, is aligned with and spaced from the second opening and the second aperture and covers the semiconductor device in the second vertical direction;

wherein the base extends beyond the adhesives and the dielectric layers in the second vertical direction;

wherein the ledge is sandwiched between the adhesives and covers the conductive trace, the second adhesive and the second dielectric layer in the second vertical direction;

wherein the cavity extends into the first opening and is aligned with and spaced from the second opening and the second aperture; and wherein the base, the ledge, the adhesives and the dielectric layers extend to peripheral edges of the assembly.

22. The assembly of claim 21, wherein the semiconductor device is an LED chip.

23. The assembly of claim 21, wherein the semiconductor device is located within the cavity, is electrically connected to the pad using a wire bond that extends from the cavity through the second opening and the second aperture to the pad and is thermally connected to the bump using a die attach that is located within the cavity.

24. The assembly of claim 21, wherein the first adhesive laterally covers and surrounds and conformally coats a sidewall of the bump and the second adhesive is adhesive tape.

25. The assembly of claim 21, wherein the bump is coplanar with the first adhesive at the base and at the ledge.

26. The assembly of claim 21, wherein the bump is adjacent to the base at a first bent corner and is adjacent to the ledge at a second bent corner.

27. The assembly of claim 21, wherein the bump has an irregular thickness characteristic of stamping.

28. The assembly of claim 21, wherein the bump provides a recessed die paddle and a reflector for the semiconductor device.

29. The assembly of claim 21, wherein the cavity extends across most of the bump in the vertical and lateral directions.

30. The assembly of claim 21, wherein the base has a first thickness where it is adjacent to the bump, a second thickness where it is adjacent to the first dielectric layer that is larger than the first thickness and a flat surface that faces in the second vertical direction.

31. The assembly of claim 21, wherein the base covers the bump, the ledge, the conductive trace, the adhesives and the dielectric layers in the second vertical direction.

32. The assembly of claim 21, wherein the ledge covers the first dielectric layer in the first vertical direction.

33. The assembly of claim 21, wherein the bump and the ledge in combination cover the base in the first vertical direction and the base covers the bump and the ledge in the second vertical direction.

34. The assembly of claim 21, wherein the bump and the ledge in combination cover the base, the first adhesive and the first dielectric layer in the first vertical direction and the base covers the bump, the ledge, the conductive trace, the adhesives and the dielectric layers in the second vertical direction.

35. The assembly of claim 21, wherein the first substrate is a single-sided copper clad laminate that includes the first dielectric layer and the base where it is adjacent to the first dielectric layer and the second substrate is single-sided copper clad laminate that includes the conductive trace and the second dielectric layer.

36. The assembly of claim 21, wherein the pad and the terminal have the same thickness and are coplanar with one another at a surface that faces in the first vertical direction.

37. The assembly of claim 21, wherein a solder mask contacts and is sandwiched between the ledge and the second adhesive, is spaced from the bump, the base, the conductive trace, the first adhesive and the dielectric layers and includes a window that defines a reflective surface finish for the bump at the cavity, the bump is aligned with the window and the conductive trace has a different surface finish than the reflective surface finish.

38. The assembly of claim 21, wherein an encapsulant contacts the semiconductor device and the bump in the cavity and covers the semiconductor device in the first vertical direction.

39. The assembly of claim 21, wherein the bump, the base, the ledge, the pad and the terminal are primarily copper.

40. The assembly of claim 21, wherein the heat spreader includes a copper core shared by the bump, the base and the ledge and the conductive trace includes a copper core shared by the pad and the terminal.

41. A semiconductor chip assembly, comprising:
a semiconductor device;
a first adhesive that includes a first opening;
a second adhesive that includes a second opening;
a first substrate that includes a first dielectric layer, wherein a first aperture extends through the first substrate;
a second substrate that includes a second dielectric layer, wherein a second aperture extends through the second substrate;
a conductive trace that includes a pad and a terminal; and
a heat spreader that includes a bump, a base and a ledge, wherein (i) the bump is adjacent to the base at a first bent corner, is adjacent to the ledge at a second bent corner, is integral with the ledge, extends from the base in a first vertical direction and extends from the ledge in a second vertical direction opposite the first vertical direction, (ii) the base covers the bump in the second vertical direction and extends laterally from the bump in lateral directions orthogonal to the vertical directions, (iii) the ledge extends laterally from the bump opposite the base and is spaced from the base by the bump, and (iv) a cavity in the bump faces in the first vertical direction, is covered by the bump in the second vertical direction, is spaced from the base by the bump and has an entrance at the ledge;

wherein the semiconductor device is mounted on the bump, extends into the cavity, is electrically connected to the pad and thereby electrically connected to the terminal, and is thermally connected to the bump and thereby thermally connected to the base;

wherein the first adhesive contacts the bump, the base, the ledge and the first dielectric layer, is spaced from the second adhesive and the second dielectric layer, is sandwiched between the bump and the first dielectric layer, between the ledge and the first dielectric layer and between the base and the ledge, extends through the first aperture and extends laterally from the bump to or beyond the terminal;

wherein the second adhesive contacts the second dielectric layer, is spaced from the bump, the base, the conductive trace and the first adhesive, is sandwiched between the ledge and the second dielectric layer, extends beyond the ledge, the first adhesive and the first dielectric layer in the first vertical direction and extends beyond the conductive trace and the second dielectric layer in the second vertical direction;

wherein the first dielectric layer contacts and is sandwiched between the base and the first adhesive and is spaced from the bump, the ledge and the second dielectric layer;

wherein the second dielectric layer contacts and is sandwiched between the conductive trace and the second adhesive and is spaced from the bump, the base and the ledge;

wherein the conductive trace is located outside the cavity and beyond the bump, the ledge, the adhesives and the dielectric layers in the first vertical direction;

wherein the bump extends into the first opening, extends through the first aperture, is aligned with and spaced from the second opening and the second aperture, covers the semiconductor device in the second vertical direction and provides a recessed die paddle and a reflector for the semiconductor device;

wherein the base covers the bump, the ledge, the conductive trace, the adhesives and the dielectric layers in the second vertical direction;

wherein the ledge is sandwiched between the adhesives and covers the conductive trace, the second adhesive and the second dielectric layer in the second vertical direction;

wherein the cavity extends into the first opening and the first aperture and is aligned with and spaced from the second opening and the second aperture;

wherein the bump and the ledge in combination cover the base, the first adhesive and the first dielectric layer in the first vertical direction; and wherein the base, the ledge, the adhesives and the dielectric layers extend to peripheral edges of the assembly.

42. The assembly of claim 41, wherein the semiconductor device is an LED chip, is located within the cavity, is electrically connected to the pad using a wire bond that extends from the cavity through the second opening and the second aperture to the pad and is thermally connected to the bump using a die attach that is located within the cavity.

43. The assembly of claim 41, wherein the first adhesive laterally covers and surrounds and conformally coats a sidewall of the bump and the second adhesive is adhesive tape.

44. The assembly of claim 41, wherein the bump is coplanar with the first adhesive at the base and at the ledge and the base has a first thickness where it is adjacent to the bump, a second thickness where it is adjacent to the first dielectric layer that is larger than the first thickness and a flat surface that faces in the second vertical direction.

45. The assembly of claim 41, wherein the cavity extends across most of the bump in the vertical and lateral directions.

46. The assembly of claim 41, wherein the first substrate is a single-sided copper clad laminate that includes the first dielectric layer and the base where it is adjacent to the first dielectric layer and the second substrate is single-sided copper clad laminate that includes the conductive trace and the second dielectric layer.

47. The assembly of claim 41, wherein a solder mask contacts and is sandwiched between the ledge and the second adhesive, is spaced from the bump, the base, the conductive trace, the first adhesive and the dielectric layers and includes a window that defines a reflective surface finish for the bump, the reflective surface finish extends from the bump within the cavity to the ledge outside the cavity, the bump is aligned with the window and the conductive trace has a different surface finish than the reflective surface finish.

48. The assembly of claim 41, wherein an encapsulant contacts the semiconductor device and the bump in the cavity and covers the semiconductor device in the first vertical direction.

49. The assembly of claim 48, wherein the encapsulant is a color-shifting encapsulant that includes silicone and phosphor.

50. The assembly of claim 41, wherein the bump, the base, the ledge, the pad and the terminal are primarily copper, the heat spreader includes a copper core shared by the bump, the base and the ledge and the conductive trace includes a copper core shared by the pad and the terminal.

* * * * *